US008530598B2

(12) United States Patent
Takeshita et al.

(10) Patent No.: US 8,530,598 B2
(45) Date of Patent: *Sep. 10, 2013

(54) RESIST COMPOSITION FOR IMMERSION EXPOSURE, METHOD OF FORMING RESIST PATTERN, AND FLUORINE-CONTAINING RESIN

(75) Inventors: Masaru Takeshita, Kawasaki (JP); Yasuhiro Yoshii, Kawasaki (JP)

(73) Assignee: Tokyo Ohka Kogyo Co., Ltd., Kanagawa-ken (JP)

(*) Notice: Subject to any disclaimer, the term of this patent is extended or adjusted under 35 U.S.C. 154(b) by 4 days.

This patent is subject to a terminal disclaimer.

(21) Appl. No.: 13/348,989

(22) Filed: Jan. 12, 2012

(65) Prior Publication Data

US 2012/0116038 A1    May 10, 2012

Related U.S. Application Data

(63) Continuation of application No. 12/588,117, filed on Oct. 5, 2009, now Pat. No. 8,247,161.

(30) Foreign Application Priority Data

Oct. 7, 2008  (JP) .............................. P2008-260864
Dec. 2, 2008  (JP) .............................. P2008-308037

(51) Int. Cl.
    *C08F 214/18*    (2006.01)
    *C08F 220/68*    (2006.01)

(52) U.S. Cl.
    USPC ........ 526/329.4; 526/242; 526/245; 526/246; 526/247

(58) Field of Classification Search
    None
    See application file for complete search history.

(56) References Cited

U.S. PATENT DOCUMENTS

| | | | |
|---|---|---|---|
| 5,679,496 | A | 10/1997 | Ohsawa et al. |
| 5,945,517 | A | 8/1999 | Nitta et al. |
| 6,153,733 | A | 11/2000 | Yukawa et al. |
| 7,074,543 | B2 | 7/2006 | Iwai et al. |
| 7,323,287 | B2 | 1/2008 | Iwai et al. |
| 7,687,221 | B2 | 3/2010 | Hirosaki et al. |
| 7,776,511 | B2 * | 8/2010 | Takeshita et al. ......... 430/270.1 |
| 7,867,697 | B2 | 1/2011 | Kodama |
| 8,105,747 | B2 | 1/2012 | Utsumi et al. |
| 8,247,161 | B2 * | 8/2012 | Takeshita et al. ......... 430/270.1 |
| 2002/0006576 | A1 | 1/2002 | Sato et al. |
| 2003/0036618 | A1 | 2/2003 | Maeda et al. |
| 2005/0019690 | A1 | 1/2005 | Kodama |
| 2008/0187860 | A1 | 8/2008 | Tsubaki et al. |
| 2008/0305433 | A1 | 12/2008 | Kanda et al. |
| 2009/0047600 | A1 | 2/2009 | Hirosaki et al. |
| 2009/0075204 | A1 | 3/2009 | Takeshita et al. |
| 2009/0197204 | A1 | 8/2009 | Shiono et al. |
| 2009/0208873 | A1 | 8/2009 | Harada et al. |
| 2009/0263741 | A1 | 10/2009 | Hayashi |
| 2010/0075249 | A1 | 3/2010 | Utsumi et al. |
| 2010/0143844 | A1 | 6/2010 | Takeshita et al. |
| 2010/0196821 | A1 | 8/2010 | Dazai et al. |

FOREIGN PATENT DOCUMENTS

| | | |
|---|---|---|
| JP | 6-194847 | 7/1994 |
| JP | 9-208554 | 8/1997 |
| JP | 11-35551 | 2/1999 |
| JP | 11-35552 | 2/1999 |
| JP | 11-35573 | 2/1999 |
| JP | 11-322707 | 11/1999 |
| JP | 2002-090991 | 3/2002 |
| JP | 2003-241385 | 8/2003 |
| JP | 2005-55890 | 3/2005 |
| JP | 2005-255742 | 9/2005 |
| JP | 2006-106265 | 4/2006 |
| JP | 2006-106497 | 4/2006 |
| JP | 2006-251761 | 9/2006 |
| JP | 2007-77261 | 3/2007 |
| JP | 2007-322660 | 12/2007 |
| JP | 2008-134607 | 6/2008 |
| JP | 2008-292975 | 12/2008 |
| JP | 2010-032994 | 2/2010 |
| JP | 2010-113319 | 5/2010 |
| WO | 2004/074242 | 9/2004 |
| WO | 2004/076495 | 9/2004 |
| WO | WO 2007/138893 A1 * | 12/2007 |

OTHER PUBLICATIONS

Complete English translation (computer-generated) of JP 9-208554 published Aug. 12, 1997.
Makiko Irie et al., "Surface Property Control for 193nm Immersion Resist", Journal of Photopolymer Science and Technology, vol. 19, No. 4, pp. 565-568, 2006.
Shun-ichi Kodama et al., "Synthesis of Novel Fluoropolymer for 157 nm Photoresists by Cyclo-polymerization", Proceedings of SPIE, vol. 4690, pp. 76-83, 2002.
D. Gil et al., "First Microprocessors with Immersion Lithography", Proceedings of SPIE, vol. 5754, pp. 119-128, 2005.
Machine-assisted English translation of JP 2005-255742 provided by JPO (2005).
International Search Report mailed Jun. 19, 2007 in related International Application No. PCT/JP2007/060249, which corresponds to U.S. Appl. No. 12/299,523.
Office Action mailed Jun. 24, 2010 in related Korean Application No. 10-2008-7029148.
Office Action mailed Oct. 25, 2012 in related U.S. Appl. No. 13/028,689.
Office Action issued Mar. 12, 2013 in corresponding Japanese Application No. 2008-308037.
Ebihara et al., "Beyond $K_1$=0.25 lithography : 70nm L/S patterning using KrF scanners", Proceedings of SPIE, vol. 5256, $23^{rd}$ Annual BACUS Symposium on Photomask Technology, 2003, pp. 985-994.
Borodovsky, Yan, "Marching to the beat of Moore's Law", Proceedings of SPIE, vol. 6153, 2006, pp. 615301-1 to 615301-19.

\* cited by examiner

*Primary Examiner* — Sin J. Lee
(74) *Attorney, Agent, or Firm* — Wenderoth, Lind & Ponack, L.L.P.

(57) ABSTRACT

A resist composition for immersion exposure including: a base component (A) which exhibits changed solubility in an alkali developing solution under the action of acid; an acid-generator component (B) which generates acid upon exposure; and a fluorine-containing resin component (F); dissolved in an organic solvent (S), the fluorine-containing resin component (F) including a structural unit (f1) containing a fluorine atom, a structural unit (f2) containing a hydrophilic group-containing aliphatic hydrocarbon group, and a structural unit (f3) derived from an acrylate ester containing a tertiary alkyl group-containing group or an alkoxyalkyl group.

6 Claims, No Drawings

RESIST COMPOSITION FOR IMMERSION EXPOSURE, METHOD OF FORMING RESIST PATTERN, AND FLUORINE-CONTAINING RESIN

This application is a continuation application of U.S. application Ser. No. 12/588,117, filed Oct. 5, 2009, which is now U.S. Pat. No. 8,247,161, patented Aug. 21, 2012.

TECHNICAL FIELD

The present invention relates to a resist composition for immersion exposure (liquid immersion lithography), a method of forming a resist pattern that uses the resist composition for immersion exposure, and a fluorine-containing compound useful as an additive for a resist composition for immersion exposure.

Priority is claimed on Japanese Patent Application No. 2008-260864, filed Oct. 7, 2008, and Japanese Patent Application No. 2008-308037, filed Dec. 2, 2008, the contents of which are incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

For miniaturization of semiconductor devices, shortening of the wavelength of the exposure light source, and increasing of the numerical aperture (NA) of the projector lens have progressed. Currently, exposure apparatuses in which an ArF excimer laser having a wavelength of 193 nm is used as an exposure light source and NA=0.84 have been developed.

As shortening the wavelength of the exposure light source progresses, it is required to improve various lithography properties of the resist material, such as the sensitivity to the exposure light source and a resolution capable of reproducing patterns of minute dimensions. As a resist material which satisfies these conditions, a chemically amplified resist is used, which includes a base resin that exhibits a changed solubility in an alkali developing solution under action of acid and an acid generator that generates acid upon exposure.

Currently, resins that contain structural units derived from (meth)acrylate esters within the main chain (acrylic resins) are now widely used as base resins for resists that use ArF excimer laser lithography, as they exhibit excellent transparency in the vicinity of 193 nm.

Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

As a technique for further improving the resolution, a lithography method called liquid immersion lithography (hereafter, frequently referred to as "immersion exposure") is known in which exposure (immersion exposure) is conducted in a state where the region between the lens and the resist layer formed on a wafer is filled with a solvent (a immersion medium) that has a larger refractive index than the refractive index of air (see for example, Non-Patent Document 1).

According to this type of immersion exposure, it is considered that higher resolutions equivalent to those obtained using a shorter wavelength light source or a larger NA lens can be obtained using the same exposure light source wavelength, with no lowering of the depth of focus. Furthermore, immersion exposure can be conducted using a conventional exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution.

Immersion lithography is effective in forming patterns having various shapes. Further, immersion exposure is expected to be capable of being used in combination with currently studied super-resolution techniques, such as phase shift method and modified illumination method. Currently, as the immersion exposure technique, technique using an ArF excimer laser as an exposure source is being actively studied. Further, water is mainly used as the immersion medium.

In recent years, fluorine-containing compounds have been attracting attention for their properties such as water repellency and transparency, and active research and development of fluorine-containing compounds have been conducted in various fields.

For example, in the fields of resist materials, currently, an acid-labile group such as a methoxyethyl group, tert-butyl group or tert-butoxycarbonyl group is being introduced into a fluorine-containing polymeric compound, and the fluorine-containing polymeric compound is used as a base resin for a chemically amplified positive resist.

However, when such a fluorine-containing polymeric compound is used as a base resin for a chemically amplified positive resist, disadvantages are caused in that a large amount of an out gas is generated, and resistance to a dry-etching gas (etching resistance) is unsatisfactory.

Recently, as a fluorine-containing polymeric compound exhibiting excellent etching resistance, a fluorine-containing polymeric compound having an acid-labile group containing a cyclic hydrocarbon group has been reported (see, for example, Non-Patent Document 2).

In addition, a fluorine-containing polymeric compound has been reported in order to provide a resist film with water repellency in a resist composition for immersion exposure (see, for example, Non-Patent Document 3).

[Non-Patent Document 1] Proceedings of SPIE (U.S.), vol. 5754, pp. 119-128 (2005)

[Non-Patent Document 2] Proceedings of SPIE (U.S.), vol. 4690, pp. 76-83 (2002)

[Non-Patent Document 3] Journal of Photopolymer. Sci. Technol., vol. 19, No. 4, pp. 565-568 (2006)

SUMMARY OF THE INVENTION

In immersion exposure, a resist material is required which exhibits not only general lithography properties (e.g., sensitivity, resolution, etching resistance and the like), but also properties suited for immersion lithography.

For example, in immersion exposure, when the resist film comes in contact with the immersion medium, elution of a substance contained in the resist film into the immersion medium occurs. This elution of a substance causes phenomenon such as degeneration of the resist film and change in the refractive index of the immersion medium, thereby adversely affecting the lithography properties. The amount of the eluted substance is affected by the properties of the resist film surface (e.g., hydrophilicity, hydrophobicity, and the like). For example, by enhancing the hydrophobicity of the resist film surface, the elution of a substance can be reduced.

Further, when the immersion medium is water, and immersion exposure is performed using a scanning-type immersion exposure apparatus as disclosed in Non-Patent Document 1, a water tracking ability in which the immersion medium is capable of tracking the movement of the lens is required. When the water tracking ability is low, the exposure speed becomes low, and as a result, there is a possibility that the productivity is adversely affected. It is presumed that the water tracking ability can be improved by enhancing the hydrophobicity of the resist film (rendering the resist film hydrophobic).

Accordingly, it is presumed that the above-described characteristic problems of immersion lithography, which require a reduction in substance elution and an improvement in the water tracking ability, can be addressed by enhancing the hydrophobicity of the resist film surface using a fluorine-containing compound for example.

However, a conventional positive resist composition using an alcohol-based organic solvent as an organic solvent has a problem in that resist materials such as fluorine-containing compounds exhibit poor solubility in the organic solvent. Such poor solubility of the resist materials in an organic solvent causes unnecessary work and time in the preparation of a resist solution and deterioration in the stability of the prepared resist solution.

Especially, conventional fluorine-containing compounds had problems in that the effect of enhancing the hydrophobicity of the resist film (which is the object of adding a fluorine-containing compound) cannot be satisfactorily achieved.

The present invention takes the above circumstances into consideration, with an object of providing a resist composition for immersion exposure in which the resist materials exhibit excellent solubility, a method of forming a resist pattern that uses the resist composition for immersion exposure, and a fluorine-containing compound that is useful as an additive for the resist composition.

For solving the above-mentioned problems, the present invention employs the following aspects.

Specifically, a first aspect of the present invention is a resist composition for immersion exposure including: a base component (A) which exhibits changed solubility in an alkali developing solution under the action of acid; an acid-generator component (B) which generates acid upon exposure; a fluorine-containing resin component (F); and an organic solvent (S), the base component (A), the acid-generator component (B) and the fluorine-containing resin component (F) being dissolved in the organic solvent (S), the fluorine-containing resin component (F) including a structural unit (f1) containing a fluorine atom, a structural unit (f2) containing a hydrophilic group-containing aliphatic hydrocarbon group, and a structural unit (f3) represented by general formula (f3-1) shown below.

[Chemical Formula 1]

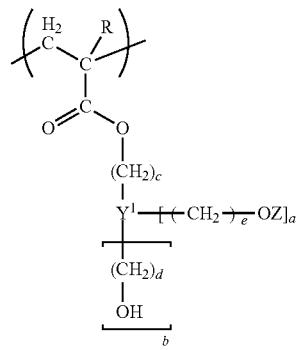

(f3-1)

In general formula (f3-1), R represents a hydrogen atom, a lower alkyl group of 1 to 5 carbon atoms or a halogenated lower alkyl group of 1 to 5 carbon atoms; $Y^1$ represents an aliphatic cyclic group; Z represents a tertiary alkyl group-containing group or an alkoxyalkyl group; a represents an integer of 1 to 3, and b represents an integer of 0 to 2, with the provision that a+b=1 to 3; and each of c, d and e independently represents an integer of 0 to 3.

A second aspect of the present invention is a method of forming a resist pattern including applying a resist composition for immersion exposure according to the first aspect to a substrate to form a resist film, subjecting the resist film to immersion exposure, and subjecting the resist film to alkali developing to form a resist pattern.

A third aspect of the present invention is a fluorine-containing resin including a structural unit (f1) containing a fluorine atom, a structural unit (f2) containing a hydrophilic group-containing aliphatic hydrocarbon group, and a structural unit (f3) represented by general formula (f3-1) shown below.

[Chemical Formula 2]

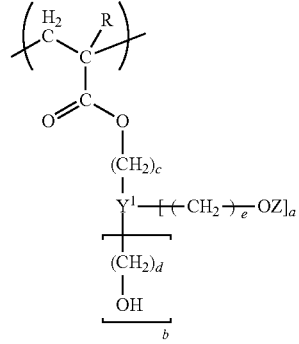

(f3-1)

In general formula (f3-1), R represents a hydrogen atom, a lower alkyl group of 1 to 5 carbon atoms or a halogenated lower alkyl group of 1 to 5 carbon atoms; $Y^1$ represents an aliphatic cyclic group; Z represents a tertiary alkyl group-containing group or an alkoxyalkyl group; a represents an integer of 1 to 3, and b represents an integer of 0 to 2, with the provision that a+b=1 to 3; and each of c, d and e independently represents an integer of 0 to 3.

In the present description and claims, an "alkyl group" includes linear, branched or cyclic, monovalent saturated hydrocarbon, unless otherwise specified.

The term "alkylene group" includes linear, branched or cyclic divalent saturated hydrocarbon, unless otherwise specified.

A "lower alkyl group" is an alkyl group of 1 to 5 carbon atoms.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

The term "aliphatic" is a relative concept used in relation to the term "aromatic", and defines a group or compound that has no aromaticity.

The term "structural unit" refers to a monomer unit that contributes to the formation of a polymeric compound (polymer, copolymer).

The term "exposure" is used as a general concept that includes irradiation with any form of radiation.

According to the present invention, there are provided a resist composition for immersion exposure in which the resist materials exhibit excellent solubility, a method of forming a resist pattern that uses the resist composition for immersion exposure, and a fluorine-containing compound that is useful as an additive for the resist composition.

PREFERRED EMBODIMENTS OF THE INVENTION

FIG. 1 is an explanatory diagram of an advancing angle ($\theta_1$), a receding angle ($\theta_2$) and a sliding angle ($\theta_3$).

FIG. 2 is a schematic plan view showing an example of a crossline pattern formed by a double patterning process. The schematic diagram shows a line and space (L/S) pattern 20 in the vertical direction formed with the second positive resist composition by assuming that the first L/S pattern 10 does not exist.

FIG. 3 is a photograph showing an image of a pattern formed by a crossline patterning process.

FIG. 4 is a schematic diagram showing the dimensions of a pattern formed by a cross patterning process in the X-axis direction and the Y-axis direction. The schematic diagram shows a line and space (L/S) pattern 20 in the vertical direction formed with the second positive resist composition by assuming that the first L/S pattern 10 does not exist.

<<Resist Composition for Immersion Exposure>>

The positive resist composition of the present invention includes a base component (A) (hereafter, referred to as "component (A)") which exhibits changed solubility in an alkali developing solution under the action of acid, an acid-generator component (B) (hereafter, referred to as "component (B)") which generates acid upon exposure, and a fluorine-containing resin component (F) (hereafter, referred to as "component (F)"), dissolved in an organic solvent (S) (hereafter, referred to as "component (S)").

In the resist composition for immersion exposure, when acid is generated from the component (B) upon exposure, the action of that acid causes a change in the solubility of the component (A) in an alkali developing solution. As a result, in the formation of a resist pattern, when a resist film obtained using the resist composition is subjected to selective exposure, the solubility in the alkali developing solution of the exposed portions of the resist film changes, whereas the solubility in the alkali developing solution of the unexposed portions remains unchanged. Therefore, a resist pattern can be formed by alkali-developing.

<Component (F)>

In the resist composition for immersion exposure according to the present invention, the component (F) includes a structural unit (f1) containing a fluorine atom, a structural unit (f2) containing a hydrophilic group-containing aliphatic hydrocarbon group, and a structural unit (f3) represented by general formula (f3-1).

Structural Unit (f1)

The structural unit (f1) is a structural unit containing a fluorine atom. By including the structural unit (f1), the effect of enhancing the hydrophobicity of the resist film surface can be achieved.

The structural unit (f1) is not particularly limited as long as it is a structural unit containing a fluorine atom. For example, in the structural unit, a fluorine atom may be included within the side chain or may be directly bonded to the main chain, or a fluorine atom may be included in a substituent which is directly bonded to the main chain.

Of these various possibilities, as the structural unit (f1), a structural unit containing a fluorine atom within the side chain thereof is preferable. Specifically, a structural unit having a group represented by general formula (f1-1-0);

a structural unit that includes an acid dissociable, dissolution inhibiting group-containing group having a fluorine atom; and a structural unit containing a non-acid dissociable fluorinated alkyl group of 1 to 20 carbon atoms can be mentioned.

[Chemical Formula 3]

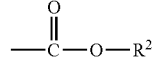

(f1-1-0)

In formula (f1-1-0), $R^2$ represents an organic group having a fluorine atom, with the provision that the carbon atom within the —C(=O)— moiety is not directly bonded to the main chain.

(Structural Unit Having a Group Represented by General Formula (f1-1-0))

In the formula (f1-1-0) above, $R^2$ represents an organic group having a fluorine atom.

An "organic group" is a group containing at least one carbon atom.

In the organic group having a fluorine atom for $R^2$, the structure of $R^2$ may be linear, branched or cyclic, and is preferably linear or branched.

In $R^2$, the organic group preferably has 1 to 20 carbon atoms, more preferably 1 to 15 carbon atoms, still more preferably 1 to 10 carbon atoms, and most preferably 1 to 5 carbon atoms.

In $R^2$, the fluorination ratio of the organic group is preferably 25% or more, more preferably 50% or more, and most preferably 60% or more, as the hydrophobicity of the resist film is enhanced.

The term "fluorination ratio" refers to the percentage (%) of the number of fluorine atoms relative to the total number of hydrogen atoms and fluorine atoms contained within the organic group.

More specifically, preferable examples of $R^2$ include a fluorinated hydrocarbon group which may have a substituent.

In the fluorinated hydrocarbon group, the hydrocarbon group (a hydrocarbon group which is not fluorinated) may be either an aliphatic hydrocarbon group or an aromatic hydrocarbon group, and an aliphatic hydrocarbon group is preferable.

An aliphatic hydrocarbon group refers to a hydrocarbon group having no aromaticity. The aliphatic hydrocarbon group may be either saturated or unsaturated, but in general, the aliphatic hydrocarbon group is preferably saturated.

As $R^2$, a fluorinated, saturated hydrocarbon group or a fluorinated, unsaturated hydrocarbon group is preferable, more preferably a fluorinated, saturated hydrocarbon group, and most preferably a fluorinated alkyl group.

Examples of fluorinated alkyl groups include groups in which part or all of the hydrogen atoms within the below described unsubstituted alkyl groups (below-described groups which do not have a substituent) have been substituted with a fluorine atom.

The fluorinated alkyl group may be either a group in which part of the hydrogen atoms within an unsubstituted alkyl group described below has been substituted with a fluorine atom, or a group in which all of the hydrogen atoms within an unsubstituted alkyl group described below has been substituted with a fluorine atom (i.e., a perfluoroalkyl group).

The unsubstituted alkyl group may be any of linear, branched or cyclic. Alternatively, the unsubstituted alkyl group may be a combination of a linear or branched alkyl group with a cyclic alkyl group.

The unsubstituted linear alkyl group preferably has 1 to 10 carbon atoms, and more preferably 1 to 8. Specific examples include a methyl group, an ethyl group, an n-propyl group, an n-butyl group, an n-pentyl group, an n-hexyl group, an n-heptyl group, an n-octyl group, an n-nonyl group and an n-decyl group.

The unsubstituted branched alkyl group preferably has 3 to 10 carbon atoms, and more preferably 3 to 8. As the branched alkyl group, a tertiary alkyl group is preferable.

As an example of an unsubstituted cyclic alkyl group, a group in which one hydrogen atom has been removed from a monocycloalkane or a polycycloalkane such as a bicycloalkane, tricycloalkane or tetracycloalkane can be given. Specific examples include monocycloalkyl groups such as a cyclopentyl group and a cyclohexyl group; and polycycloalkyl groups such as an adamantyl group, a norbornyl group, an isobornyl group, a tricyclodecyl group and a tetracyclododecyl group.

Examples of the combination of a linear or branched alkyl group with a cyclic alkyl group include groups in which a cyclic alkyl group as a substituent is bonded to a linear or branched alkyl group, and groups in which a linear or branched alkyl group as a substituent is bonded to a cyclic alkyl group.

Examples of the substituent for the fluorinated hydrocarbon group include an alkyl group of 1 to 5 carbon atoms.

As the fluorinated alkyl group for $R^2$, a linear or branched fluorinated alkyl group is preferable. In particular, a group represented by general formula (VII-1) or (VII-2) shown below is desirable, and a group represented by general formula (VII-1) is most preferable.

[Chemical Formula 4]

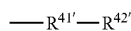

(VII-1)

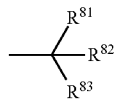

(VII-2)

In general formula (VII-1), $R^{41'}$ represents an unsubstituted alkylene group of 1 to 9 carbon atoms, and $R^{42'}$ represents a fluorinated alkyl group of 1 to 9 carbon atoms, with the provision that the total number of carbon atoms of $R^{41'}$ and $R^{42'}$ is no more than 10. In general formula (VII-2), each of $R^{81}$ to $R^{83}$ independently represents a linear alkyl group of 1 to 5 carbon atoms, with the provision that at least one of $R^{81}$ to $R^{83}$ represents an alkyl group having a fluorine atom.

In general formula (VII-1), the alkylene group for $R^{41'}$ may be linear, branched or cyclic, and is preferably linear or branched. Further, the number of carbon atoms within the alkylene group is preferably within a range of from 1 to 5.

As $R^{41'}$, a methylene group, an ethylene group or a propylene group is particularly desirable.

As $R^{42'}$, a linear or branched fluorinated alkyl group of 1 to 5 carbon atoms is preferable, and a perfluoroalkyl group is particularly desirable. Among perfluoroalkyl groups, a trifluoromethyl group and a pentafluoroethyl group are preferable.

In general formula (VII-2), as the alkyl group for $R^{81}$ to $R^{83}$, an ethyl group or a methyl group is preferable, and a methyl group is particularly desirable. At least one of the alkyl groups for $R^{81}$ to $R^{83}$ is a fluorinated alkyl group, and all of the alkyl groups for $R^{81}$ to $R^{83}$ may be fluorinated alkyl groups.

In general formula (f1-1-0), the carbon atom within the —C(═O)— moiety is not directly bonded to the main chain. As a result, the "—O—$R^2$" group may be dissociated satisfactorily by the action of an alkali developing solution which is weakly basic.

In other words, the "—O—$R^2$" group is dissociated from a group represented by general formula (f1-1-0) due to hydrolysis caused by the action of an alkali developing solution. Therefore, in the group represented by general formula (f1-1-0), a hydrophilic group [—C(═O)—OH] is formed when the "—O—$R^2$" group dissociates. Accordingly, the hydrophilicity of the component (F) is enhanced, and hence, the compatibility of the component (F) with the alkali developing solution is improved. As a result, the hydrophilicity of the resist film surface is enhanced during developing.

(Acid Dissociable, Dissolution Inhibiting Group-Containing Group Having a Fluorine Atom)

With respect to the acid dissociable, dissolution inhibiting group-containing group, an "acid dissociable, dissolution inhibiting group" refers to a group that is dissociated from the component (B) by the action of acid generated from the component (B) upon exposure, and is eliminated after exposure.

The acid dissociable, dissolution inhibiting group has an alkali dissolution inhibiting effect that renders the entire component (F) insoluble in an alkali developing solution prior to dissociation, and then following dissociation under action of acid, increases the solubility of the entire component (F) in the alkali developing solution. As a result, in the formation of a resist pattern, generation of development residue can be suppressed, and lithography properties such as resolution and the like can be improved.

In the present description and claims, the term "acid dissociable, dissolution inhibiting group-containing group" is used as a general concept that includes acid dissociable, dissolution inhibiting groups and organic groups having an acid dissociable, dissolution inhibiting group.

An "organic group having an acid dissociable, dissolution inhibiting group" refers to a group constituted of an acid dissociable, dissolution inhibiting group and a group or atom that is not dissociated by acid (i.e., a group or atom that is not dissociated by acid, and remains bonded to the component (F) after the acid dissociable, dissolution inhibiting group has been dissociated).

In the acid dissociable, dissolution inhibiting group-containing group, part or all of the hydrogen atoms are substituted with a fluorine atom or a fluorinated alkyl group. The fluorine atom or the fluorinated alkyl group may be contained within the acid dissociable, dissolution inhibiting group, or contained in a group other than the acid dissociable, dissolution inhibiting group. It is preferable that the fluorine atom or the fluorinated alkyl group is contained in the acid dissociable, dissolution inhibiting group.

The acid dissociable, dissolution inhibiting group is not particularly limited, and can be selected appropriately from the multitude of groups that have been proposed for the resins of resist compositions designed for use with KrF excimer lasers, ArF excimer lasers, and the like.

Specific examples include acid dissociable, dissolution inhibiting groups (I) and (II) shown below, and acid dissociable, dissolution inhibiting group-containing groups (IV) exemplified by chain-like tertiary alkoxycarbonyl groups and chain-like tertiary alkoxycarbonylalkyl groups.

The organic group having an acid dissociable, dissolution inhibiting group is not particularly limited, and can be selected appropriately from the multitude of groups that have been proposed for the resins of resist compositions designed for use with KrF excimer lasers, ArF excimer lasers, and the like. Specific examples include those described above for the aforementioned "organic group having an acid dissociable group", such as an organic group having an acid dissociable, dissolution inhibiting group (II), i.e., (III) an organic group having an acid dissociable, dissolution inhibiting group described later.

The aforementioned groups (I) to (IV) will be described below. In the groups (II) to (IV), the fluorine atom or the fluorinated alkyl group may be contained in the acid dissociable dissolution inhibiting group, or contained in a group other than the acid dissociable, dissolution inhibiting group.

Acid Dissociable, Dissolution Inhibiting Group (I)

The acid dissociable, dissolution inhibiting group (I) is a chain-like or cyclic tertiary alkyl group.

In terms of the effects of the present invention, it is particularly desirable that the tertiary alkyl group be a group represented by general formula (f1-2-1) shown below.

[Chemical Formula 5]

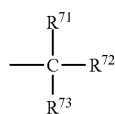

(f1-2-1)

In formula (f1-2-1), each of $R^{71}$ to $R^{73}$ independently represents an alkyl group or a fluorinated alkyl group, provided that no fluorine atom within the fluorinated alkyl group is bonded to a carbon atom adjacent to the tertiary carbon atom having $R^{71}$ to $R^{73}$ bonded thereto, and at least one of $R^{71}$ to $R^{73}$ represents a fluorinated alkyl group. $R^{72}$ and $R^{73}$ may be mutually bonded to form a ring constituted of $R^{72}$, $R^{73}$ and the tertiary carbon atom.

In general formula (f1-2-1), each of $R^{71}$ to $R^{73}$ independently represents an "alkyl group" or a fluorinated alkyl group.

The "alkyl group" may be any of linear, branched or cyclic.

When the alkyl group is linear or branched, it is preferably an alkyl group of 1 to 5 carbon atoms, more preferably an ethyl group or a methyl group, and most preferably an ethyl group.

When the alkyl group is cyclic, it preferably has 4 to 15 carbon atoms, more preferably 4 to 12 carbon atoms, and most preferably 5 to 10 carbon atoms. Examples thereof include groups in which one or more hydrogen atoms have been removed from a monocycloalkane or a polycycloalkane such as a bicycloalkane, tricycloalkane or a tetracycloalkane. Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

Of these, as the "alkyl group", a linear alkyl group is particularly desirable.

The fluorinated alkyl group represented by $R^{71}$ to $R^{73}$ is an alkyl group (excluding a methyl group) in which part or all of the hydrogen atoms have been substituted with a fluorine atom. However, the fluorinated alkyl group is a group in which no fluorine atom is bonded to a carbon atom adjacent to the tertiary carbon atom having $R^{71}$ to $R^{73}$ bonded thereto. The alkyl group prior to being fluorinated may be linear, branched or cyclic.

When the alkyl group prior to being substituted is linear or branched, it preferably has 2 to 7 carbon atoms, more preferably 2 to 5 carbon atoms, and an n-butyl group is particularly desirable.

When the alkyl group prior to being substituted is cyclic, examples of the alkyl group prior to being substituted include the same groups as those described above for the aforementioned "alkyl group".

In the fluorinated alkyl group, it is preferable that a carbon atom having the fluorine atom bonded thereto is positioned remote from the tertiary carbon atom having $R^{71}$ to $R^{73}$ bonded thereto. That is, the position to be substituted with the fluorine atom is preferably on the terminal side of the alkyl group rather than the middle portion of the alkyl group, and it is particularly desirable that the alkyl group be substituted on the terminal thereof.

A preferable example of such a fluorinated alkyl group includes 4,4,4-trifluoro-n-butyl group.

In general formula (f1-2-1), at least one of $R^{71}$ to $R^{73}$ represents the aforementioned fluorinated alkyl group. It is preferable that one of $R^{71}$ to $R^{73}$ represents the aforementioned fluorinated alkyl group, and each of the remaining two represents an alkyl group, and it is more preferable that each of $R^{71}$ to $R^{73}$ represents a chain-like fluorinated alkyl group or a chain-like alkyl group.

In general formula (f1-2-1), $R^{72}$ and $R^{73}$ may be mutually bonded to form a ring constituted of $R^{72}$, $R^{73}$ and the tertiary carbon atom. In such a case, it is preferable that $R^{72}$ and $R^{73}$ not be fluorinated, and $R^{71}$ represent the aforementioned fluorinated alkyl group. As the cyclic alkyl group formed by $R^{72}$, $R^{73}$ and the tertiary alkyl group, the same groups as those described above for the aforementioned "alkyl group" can be mentioned.

Acid Dissociable, Dissolution Inhibiting Group (II)

The acid dissociable, dissolution inhibiting group (II) is a group represented by general formula (f1-2-2) shown below.

[Chemical Formula 6]

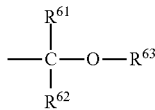

(f1-2-2)

In formula (f1-2-2), each of $R^{61}$ and $R^{62}$ independently represents a hydrogen atom or a lower alkyl group; and $R^{63}$ represents an aliphatic cyclic group, an aromatic cyclic group or a lower alkyl group. Alternatively, each of $R^{61}$ and $R^{63}$ may independently represent an alkylene group of 1 to 5 carbon atoms, and the terminal of $R^{61}$ may be bonded to the terminal of $R^{63}$ to form a ring.

In general formula (f1-2-2), each of $R^{61}$ and $R^{62}$ independently represents a hydrogen atom or a lower alkyl group.

Examples of the lower alkyl group for $R^{61}$ and $R^{62}$ include linear or branched alkyl groups such as a methyl group, an ethyl group, a propyl group, an isopropyl group, an n-butyl group, an isobutyl group, a tert-butyl group, a pentyl group, an isopentyl group and a neopentyl group. In terms of industry, a methyl group or an ethyl group is preferable, and a methyl group is particularly desirable.

In the present invention, it is preferable that at least one of $R^{61}$ and $R^{62}$ be a hydrogen atom.

$R^{63}$ represents an aliphatic cyclic group, an aromatic cyclic hydrocarbon group or a lower alkyl group.

With respect to $R^{63}$, an "aliphatic cyclic group" refers to a monocyclic group or polycyclic group that has no aromaticity, and may be either saturated or unsaturated, but is preferably saturated.

The aliphatic cyclic group for $R^{63}$ is a monovalent aliphatic cyclic group. The aliphatic cyclic group can be selected appropriately, for example, from the multitude of groups that have been proposed for conventional ArF resists. Specific examples of the aliphatic cyclic group include an aliphatic monocyclic group of 5 to 7 carbon atoms and an aliphatic polycyclic group of 10 to 16 carbon atoms.

As the aliphatic monocyclic group of 5 to 7 carbon atoms, a group in which one hydrogen atom has been removed from a monocycloalkane can be mentioned, and specific examples include a group in which one hydrogen atom has been removed from cyclopentane or cyclohexane.

Examples of the aliphatic polycyclic group of 10 to 16 carbon atoms include groups in which one hydrogen atom has been removed from a bicycloalkane, tricycloalkane, tetracycloalkane or the like. Specific examples include groups in which one hydrogen atom has been removed from a polycycloalkane such as adamantane, norbornane, isobornane, tricyclodecane or tetracyclododecane.

Of these, an adamantyl group, a norbornyl group and a tetracyclododecyl group is preferred industrially, and an adamantyl group is particularly desirable.

As the aromatic cyclic hydrocarbon group for $R^{63}$, aromatic polycyclic groups of 10 to 16 carbon atoms can be mentioned. Examples of such aromatic polycyclic groups include groups in which one hydrogen atom has been removed from naphthalene, anthracene, phenanthrene or pyrene. Specific examples include a 1-naphthyl group, a 2-naphthyl group, a 1-anthryl group, a 2-anthryl group, a 1-phenanthryl group, a 2-phenanthryl group, a 3-phenanthryl group and a 1-pyrenyl group, and a 2-naphthyl group is preferred industrially.

As the lower alkyl group for $R^{63}$, the same lower alkyl groups as those described above for $R^{61}$ and $R^{62}$ can be mentioned, although a methyl group or an ethyl group is preferable, and an ethyl group is particularly desirable.

Alternatively, each of $R^{61}$ and $R^{63}$ may independently represent an alkylene group of 1 to 5 carbon atoms, and the terminal of $R^{61}$ may be bonded to the terminal of $R^{63}$ to form a ring.

In such a case, in general formula (f1-2-2), a cyclic group is formed by $R^{61}$, $R^{63}$, the oxygen atom having $R^{63}$ bonded thereto, and the carbon atom having the oxygen atom and $R^{61}$ bonded thereto. Such a cyclic group is preferably a 4- to 7-membered ring, and more preferably a 4- to 6-membered ring. Specific examples of the cyclic group include tetrahydropyranyl group and tetrahydrofuranyl group.

In terms of the effects of the present invention, as the acid dissociable, dissolution inhibiting group, it is preferable that $R^{62}$ be a hydrogen atom, and $R^{61}$ be a hydrogen atom or a lower alkyl group.

Specific examples of groups in which $R^{63}$ represents a lower alkyl group, i.e., 1-alkoxyalkyl groups include a 1-methoxyethyl group, a 1-ethoxyethyl group, a 1-isopropoxyethyl group, a 1-n-butoxyethyl group, a 1-tert-butoxyethyl group, a methoxymethyl group, an ethoxymethyl group, an isopropoxymethyl group, an n-butoxymethyl group and a tert-butoxymethyl group.

Further, examples of groups in which $R^{63}$ represents an aliphatic cyclic group include a 1-cyclohexyloxyethyl group, a 1-(2-adamantyl)oxymethyl group, and a 1-(1-adamantyl)oxyethyl group which is represented by formula (II-a) shown below.

As an example of a group in which $R^{63}$ represents an aromatic cyclic hydrocarbon group, a 1-(2-naphthyl)oxyethyl group which is represented by formula (II-b) shown below can be mentioned.

[Chemical Formula 7]

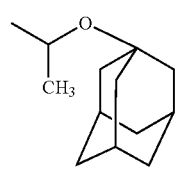
(II-a)

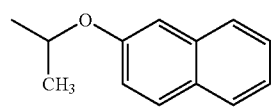
(II-b)

In terms of the effects of the present invention, a group represented by general formula (f1-2-3) shown below is also preferable.

[Chemical Formula 8]

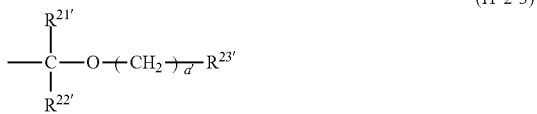

(f1-2-3)

In formula (f1-2-3), each of $R^{21'}$ and $R^{22'}$ independently represents a hydrogen atom or a lower alkyl group of 1 to 5 carbon atoms; a' represents an integer of 0 to 3; and $R^{23'}$ represents an aliphatic cyclic group including a structure (II-0) represented by general formula (II-1) shown below.

[Chemical Formula 9]

(II-1)

In formula (II-1), each of $R^{24'}$ and $R^{25'}$ independently represents a fluorine atom or a fluorinated alkyl group; and each of $X^{21}$ and $X^{22}$ represents a carbon atom constituting the ring skeleton of the aliphatic cyclic group having the structure (II-0).

In formula (f1-2-3), specific examples of the lower alkyl group for $R^{21'}$ and $R^{22'}$ include linear or branched lower alkyl groups such as a methyl group, an ethyl group, a propyl group, an isopropyl group, an n-butyl group, an isobutyl group, a tert-butyl group, a pentyl group, an isopentyl group and a neopentyl group. Of these, a methyl group or an ethyl group is preferable, and a methyl group is most preferable.

In the present invention, it is preferable that at least one of $R^{21'}$ and $R^{22'}$ represent a hydrogen atom, and it is particularly desirable that both of $R^{21'}$ and $R^{22'}$ represent a hydrogen atom.

a' is preferably an integer of 0 to 2, more preferably 0 or 1, and most preferably 0.

$R^{23'}$ represents an aliphatic cyclic group including a structure (II-0) represented by general formula (II-1)

In formula (II-1), the fluorinated alkyl group for $R^{24'}$ and $R^{25'}$ preferably has 1 to 5 carbon atoms, more preferably 1 to 3 carbon atoms, and most preferably 1 carbon atom.

The fluorinated alkyl group preferably has a fluorination ratio (percentage (%) of the number of carbon atoms based on the total number of fluorine atoms and hydrogen atoms) of 50 to 100%, more preferably 70 to 100%, and most preferably 100%.

As $R^{24'}$ and $R^{25'}$, a fluorinated alkyl group is preferable, and a trifluoromethyl group is particularly desirable.

Each of $X^{21}$ and $X^{22}$ represents a carbon atom constituting the ring skeleton of the aliphatic cyclic group having the structure (II-0).

Namely, part or all of the ring skeleton of the aliphatic cyclic group represented by $R^{23'}$ is constituted of $X^{21}$—O—C—$X^{22}$.

The aliphatic cyclic group for $R^{23'}$ may be either a monocyclic group or a polycyclic group, but is preferably a polycyclic group.

Here, a monocyclic group as the aliphatic cyclic group for $R^{23'}$ is a group in which one or more hydrogen atoms have been removed from a single aliphatic ring (hereafter, frequently referred to as "specific ring") that has part or all of the ring skeleton constituted of $X^{21}$—O—C—$X^{22}$ within the structure (II-0). The polycyclic group is a group in which one hydrogen or more hydrogen atoms have been removed from a condensed ring consisting of an aliphatic ring that shares two or more carbon atoms with the aforementioned specific ring.

The specific ring may be a ring having a ring skeleton constituted solely of the $X^{21}$—O—C—$X^{22}$ group in the structure (II-0) (i.e., a 4-membered ring), or a ring in which a part of the ring skeleton is constituted of the $X^{21}$—O—C—$X^{22}$ group (i.e., 5 or more-membered ring).

Examples of the 5 or more-membered ring include monocycloalkanes of 5 or more carbon atoms (such as cyclopentane and cyclohexane) in which four consecutive carbon atoms (C—C—C—C) have been replaced with the $X^{21}$—O—C—$X^{22}$ group within the structure (II-0).

The specific ring is preferably a 4- to 6-membered ring.

When the aliphatic cyclic group for $R^{23'}$ is a polycyclic group, the aliphatic ring which constitutes a condensed ring together with the specific ring may be either a monocyclic group or a polycyclic group. Further, the aliphatic ring may be either saturated or unsaturated, preferably saturated. Specific examples of saturated aliphatic rings include monocycloalkanes such as cyclopentane and cyclohexane; and polycycloalkanes such as norbornane, isobornane, adamantane, tricyclodecane and tetracyclododecane. Among these, cyclohexane and/or norbornane is preferable, and norbornane is particularly desirable.

The aliphatic cyclic group for $R^{23'}$ may have a substituent.

The aliphatic cyclic group "has a substituent" means that the hydrogen atom(s) bonded to the ring skeleton thereof has been substituted with a substituent. As an example of such a substituent, a lower alkyl group can be given.

When the aliphatic cyclic group for $R^{23'}$ is a polycyclic group, it is preferable that the atom adjacent to $R^{23'}$ (i.e., oxygen atom in the case where a' is 0, and a carbon atom in the case where a' is an integer of 1 to 3) is not bonded to the specific ring, but bonded to a carbon atom constituting the aliphatic ring which forms a condensed ring together with the specific ring.

In the present invention, it is preferable that $R^{23'}$ be a group represented by general formula (II-2) shown below.

[Chemical Formula 10]

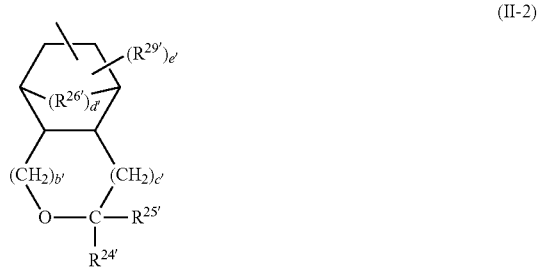

(II-2)

In formula (II-2), each of $R^{24'}$ and $R^{25'}$ independently represents a fluorine atom or a fluorinated alkyl group; $R^{26'}$ represents an alkylene group of 1 to 5 carbon atoms; $R^{29'}$ represents a lower alkyl group of 1 to 5 carbon atoms; b' represents an integer of 0 to 2, and c' represents an integer of 0 to 2, with the provision that b'+c' is an integer of 0 to 2; d' represents 0 or 1; and e' represents an integer of 0 to 2.

In general formula (II-2), $R^{24'}$ and $R^{25'}$ are the same as defined for $R^{24'}$ and $R^{25'}$ in general formula (II-1).

$R^{26\prime}$ represents an alkylene group of 1 to 5 carbon atoms, and is preferably an alkylene group of 1 to 3 carbon atoms. Examples thereof include linear or branched alkylene groups such as a methylene group, an ethylene group, an n-propylene group and an isopropylene group (—C(CH$_3$)$_2$—). Among these, a methylene group is particularly desirable.

$R^{29\prime}$ represents a lower alkyl group of 1 to 5 carbon atoms, and the same lower alkyl groups as those described above for $R^{21\prime}$ and $R^{22\prime}$ in general formula (f1-2-3) can be mentioned. When a plurality of $R^{29\prime}$ groups are present, the plurality of the $R^{29\prime}$ groups may be the same or different from each other.

Each of b' and c' independently represents an integer of 0 to 2, provided that b'+c' is an integer of 0 to 2. It is particularly desirable that b'=0 and c'=0, that is, b'+c'=0.

d' represents 0 or 1, and is preferably 1.

e' represents an integer of 0 to 2, preferably 0 or 1, and most preferably 0.

The group represented by general formula (II-2) may have a substituent on the ring skeleton thereof. Examples of substituents include the same substituents as those which the aliphatic cyclic group for $R^{23\prime}$ may have.

(III) Organic Group Having an Acid Dissociable, Dissolution Inhibiting Group

As an example of the organic group (III) having an acid dissociable, dissolution inhibiting group, a group represented by general formula (f1-2-4) shown below may be given.

In an organic group (III) having such a structure, when acid is generated from the component (B) upon exposure, the bond between the oxygen atom having $R^{64\prime}$ bonded thereto and the carbon atom having $R^{61\prime}$ and $R^{62\prime}$ bonded thereto is cleaved by the generated acid, and the —C($R^{61\prime}$)($R^{62\prime}$)—O$R^{63\prime}$ group is dissociated.

[Chemical Formula 11]

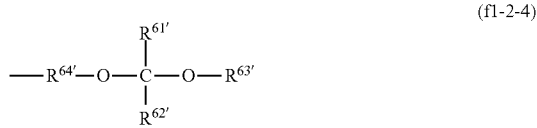

(f1-2-4)

In formula (f1-2-4), each of $R^{61\prime}$ and $R^{62\prime}$ independently represents a hydrogen atom or a lower alkyl group; and $R^{63\prime}$ represents an aliphatic cyclic group, an aromatic cyclic group or a lower alkyl group. Alternatively, each of $R^{61\prime}$ and $R^{63\prime}$ may independently represent an alkylene group of 1 to 5 carbon atoms, and the terminal of $R^{61\prime}$ may be bonded to the terminal of $R^{63\prime}$ to form a ring. $R^{64\prime}$ represents an alkylene group or a divalent aliphatic cyclic group.

In general formula (f1-2-4), as $R^{61\prime}$, $R^{62\prime}$ and $R^{63\prime}$, the same groups as those described above for $R^{61}$, $R^{62}$ and $R^{63}$ may be mentioned, respectively.

$R^{64\prime}$ represents an alkylene group or a divalent aliphatic cyclic group.

When $R^{64\prime}$ represents an alkylene group, it preferably has 1 to 10 carbon atoms, more preferably 1 to 6 carbon atoms, still more preferably 1 to 4 carbon atoms, and most preferably 1 to 3 carbon atoms. The alkylene group may be linear or branched.

When $R^{64\prime}$ is a divalent aliphatic cyclic group, the same aliphatic cyclic groups as those described above for $R^{63}$ can be used, except that two or more hydrogen atoms have been removed therefrom, and a group in which two or more hydrogen atoms have been removed from cyclopentane, cyclohexane, norbornane, isobornane, adamantane, tricyclodecane or tetracyclododecane is particularly desirable.

Acid Dissociable, Dissolution Inhibiting Group-Containing Group (IV)

The acid dissociable, dissolution inhibiting group-containing group (IV) is a group which does not fall under the category of the aforementioned acid dissociable, dissolution inhibiting groups (I) and (II) and organic group (III) having an acid dissociable, dissolution inhibiting group (hereafter, these groups are frequently referred to generically as "acid dissociable, dissolution inhibiting groups and the like (I)-(III)").

As the acid dissociable, dissolution inhibiting group-containing group (IV), any conventional acid dissociable, dissolution inhibiting group-containing group which does not fall under the category of acid dissociable, dissolution inhibiting groups and the like (I)-(III) may be used.

Specific examples thereof include a chain-like, tertiary alkoxycarbonyl group and a chain-like, tertiary alkoxycarbonylalkyl group.

The chain-like, tertiary alkoxycarbonyl group preferably has 4 to 10 carbon atoms, and more preferably 4 to 8 carbon atoms. Specific examples of the chain-like, tertiary alkoxycarbonyl group include a tert-butoxycarbonyl group and a tert-pentyloxycarbonyl group.

The chain-like, tertiary alkoxycarbonylalkyl group preferably has 4 to 10 carbon atoms, and more preferably 4 to 8 carbon atoms. Specific examples of the chain-like, tertiary alkoxycarbonylalkyl group include a tert-butoxycarbonylmethyl group and a tert-pentyloxycarbonylmethyl group.

Among the above-mentioned examples, in terms of the effects of the present invention, it is preferable that the acid dissociable, dissolution inhibiting group-containing group having a fluorine atom be at least one member selected from the group consisting of acid dissociable, dissolution inhibiting groups and the like (I)-(III) and an acid dissociable, dissolution inhibiting group-containing group (IV). Of these, an acid dissociable, dissolution inhibiting group (I) or an acid dissociable, dissolution inhibiting group (II) is more preferable in that generation of development residue can be suppressed in the formation of a resist pattern, and lithography properties such as resolution and the like can be improved.

(Non-acid Dissociable Fluorinated Alkyl Group of 1 to 20 Carbon Atoms)

The non-acid dissociable fluorinated alkyl group is not particularly limited, and can be selected appropriately from the multitude of fluorinated alkyl groups that have been proposed for the resins of resist compositions designed for use with KrF excimer lasers, ArF excimer lasers, and the like.

The fluorinated alkyl group on the side chain preferably has 1 to 20 carbon atoms, and may be linear, branched or cyclic.

When the fluorinated alkyl group linear or branched, it preferably has 1 to 8 carbon atoms, and more preferably 1 to 5 carbon atoms.

When the fluorinated alkyl group is cyclic, it preferably has 4 to 15 carbon atoms, more preferably 4 to 12 carbon atoms, and most preferably 5 to 10 carbon atoms. Examples include groups in which one or more hydrogen atoms have been removed from a monocycloalkane or a polycycloalkane such as a bicycloalkane, a tricycloalkane or a tetracycloalkane. Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane or norbornane is preferable.

Of these, as the non-acid dissociable fluorinated alkyl group, a cyclic fluorinated alkyl group is preferable, and a polycyclic fluorinated alkyl group is more preferable.

Further, part of the hydrogen atoms within the fluorinated alkyl group may be substituted, or all of the hydrogen atoms may be substituted.

As the fluorinated alkyl group on the side chain, a group represented by general formula (f1-3-0) is particularly desirable in terms of the effects of the present invention.

[Chemical Formula 12]

(f1-3-0)

In formula (f1-3-0), $X^{20}$ represents a fluorinated aliphatic polycyclic group; and m' represents 0 or 1.

In general formula (f1-3-0), as the fluorinated aliphatic polycyclic group for $X^{20}$, the aforementioned groups in which one or more hydrogen atoms have been removed from a polycycloalkane can be mentioned. A group in which one or more hydrogen atoms have been removed from adamantane or norbornane is particularly desirable. The fluorination ratio of the aliphatic polycyclic group is preferably 50% or more, more preferably 70% or more, still more preferably 90% or more, and may be even 100%.

In general formula (f1-3-0), m' represents 0 or 1.

The "main chain" of the structural unit (f1) is not particularly limited, and preferable examples thereof include a structural unit having a cyclic main chain (hereafter, referred to as "cyclic-main chain structural unit") and a structural unit derived from an acrylate ester. Of these, a structural unit derived from an acrylate ester is preferable.

A "cyclic-main chain structural unit" refers to a structural unit having a monocyclic or polycyclic ring structure, and at least one carbon atom within the ring structure, preferably two or more carbon atoms within the ring structure constitutes the main chain.

A "structural unit derived from an acrylate ester" refers to a structural unit that is formed by the cleavage of the ethylenic double bond of an acrylate ester.

In general formula (f1-1-0), "directly bonded to the main chain" means that the carbon atom within the —C(=O)— group in formula (f1-1-0) is directly bonded to, for example, a carbon atom on the ring structure and constituting the main chain, or a carbon atom which was forming an ethylenic double bond of an acrylate ester prior to cleavage thereof.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. As the substituent, a lower alkyl group or a halogenated lower alkyl group can be used.

With respect to the "structural unit derived from an acrylate ester", the "α-position (the carbon atom on the α-position)" refers to the carbon atom having the carbonyl group bonded thereto, unless specified otherwise.

With respect to the acrylate ester, specific examples of the lower alkyl group for the substituent at the α-position include linear or branched alkyl groups such as a methyl group, an ethyl group, a propyl group, an isopropyl group, an n-butyl group, an isobutyl group, a tert-butyl group, a pentyl group, an isopentyl group, and a neopentyl group.

Further, specific examples of the halogenated lower alkyl group include groups in which part or all of the hydrogen atoms of the aforementioned "lower alkyl group for the substituent at the α-position" have been substituted with halogen atoms. Examples of halogen atoms include fluorine atoms, chlorine atoms, bromine atoms and iodine atoms, and fluorine atoms are particularly desirable.

In the present invention, it is preferable that a hydrogen atom, a lower alkyl group or a halogenated lower alkyl group is bonded to the α-position of the acrylate ester, a hydrogen atom, a lower alkyl group or a fluorinated lower alkyl group is more preferable, and in terms of industrial availability, a hydrogen atom or a methyl group is the most desirable.

In the resist composition for immersion exposure according to the present invention, as the structural unit (f1), in terms of excellent solubility in an organic solvent and high hydrophobicity of the resist film surface, a structural unit (f1-1) represented by general formula (f1-1-1), a structural unit (f1-2) derived from an acrylate ester having a fluorine-containing, acid dissociable, dissolution inhibiting group on the side chain, and a structural unit (f1-3) derived from an acrylate ester having a non-acid dissociable, fluorinated alkyl group of 1 to 20 carbon atoms on the side chain can be given as preferable examples.

[Chemical Formula 13]

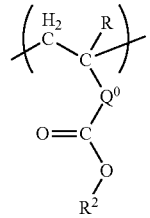

(f1-1-1)

In formula (f1-1-1), R represents a hydrogen atom, a lower alkyl group of 1 to 5 carbon atoms or a halogenated lower alkyl group of 1 to 5 carbon atoms; $Q^0$ represents a single bond or a divalent linking group; and $R^2$ represents an organic group having a fluorine atom.

Structural Unit (f1-1)

The structural unit (f1-1) is a structural unit represented by the aforementioned general formula (f1-1-1).

In general formula (f1-1-1), R represents a hydrogen atom, a lower alkyl group of 1 to 5 carbon atoms or a halogenated lower alkyl group of 1 to 5 carbon atoms.

The lower alkyl group and halogenated lower alkyl group for R are the same as defined for the lower alkyl group and halogenated lower alkyl group which may be bonded to the α-position of the aforementioned acrylate ester.

In general formula (f1-1-1), $Q^0$ represents a single bond or a divalent linking group.

Preferable examples of the divalent linking group for $Q^0$ include a hydrocarbon group which may have a substituent, and a group containing a hetero atom.

(Hydrocarbon Group which May have a Substituent)

With respect to the divalent linking group for $Q^0$, the hydrocarbon group may "have a substituent" means that part or all of the hydrogen atoms of the hydrocarbon group may be substituted with groups or atoms other than hydrogen atoms.

The hydrocarbon group for $Q^0$ may be either an aliphatic hydrocarbon group, or an aromatic hydrocarbon group.

Here, an aliphatic hydrocarbon group refers to a hydrocarbon group that has no aromaticity. The aliphatic hydrocarbon group may be either saturated or unsaturated, but in general, the aliphatic hydrocarbon group is preferably saturated.

Specific examples of the aliphatic hydrocarbon group include a linear or branched aliphatic hydrocarbon group and an aliphatic hydrocarbon group containing a ring in the structure thereof.

The linear or branched aliphatic hydrocarbon group for $Q^0$ preferably has 1 to 10 carbon atoms, more preferably 1 to 8 carbon atoms, still more preferably 1 to 5 carbon atoms, and most preferably 1 to 3 carbon atoms.

As a linear aliphatic hydrocarbon group, a linear alkylene group is preferable, and specific examples include a methylene group, an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, a branched alkylene group is preferable, and specific examples include alkylalkylene groups, e.g., alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; alkyltrimethylene groups such as —CH(CH$_3$)CH$_2$CH$_2$— and —CH$_2$CH(CH$_3$)CH$_2$—; and alkyltetramethylene groups such as —CH(CH$_3$)CH$_2$CH$_2$CH$_2$— and —CH$_2$CH(CH$_3$)CH$_2$CH$_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of the substituent include a fluorine atom, a fluorinated lower alkyl group of 1 to 5 carbon atoms, and an oxygen atom (=O).

Examples of the aliphatic hydrocarbon group containing a ring represented by $Q^0$ include a cyclic aliphatic hydrocarbon group (an aliphatic hydrocarbon ring having 2 hydrogen atoms removed therefrom), a group in which the cyclic aliphatic hydrocarbon group is bonded to the terminal of the aforementioned chain-like aliphatic hydrocarbon group or interposed within the chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group.

As the monocyclic group, a group in which two or more hydrogen atoms have been removed from a monocycloalkane of 3 to 6 carbon atoms is preferable. Examples of the monocycloalkane include cyclopentane and cyclohexane.

As the polycyclic group, a group in which two or more hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent.

Examples of the substituent include a lower alkyl group of 1 to 5 carbon atoms, a fluorine atom, a fluorinated lower alkyl group of 1 to 5 carbon atoms, and an oxygen atom (=O).

Examples of the aromatic hydrocarbon group for $Q^0$ include a divalent aromatic hydrocarbon group in which one hydrogen atom has been removed from a benzene ring of a monovalent aromatic hydrocarbon group such as a phenyl group, a biphenyl group, a fluorenyl group, a naphthyl group, an anthryl group or a phenanthryl group;

an aromatic hydrocarbon group in which part of the carbon atoms constituting the ring of the aforementioned divalent aromatic hydrocarbon group has been substituted with a hetero atom such as an oxygen atom, a sulfur atom or a nitrogen atom; and an aromatic hydrocarbon group in which one hydrogen atom has been removed from a benzene ring of an arylalkyl group such as a benzyl group, a phenethyl group, a 1-naphthylmethyl group, a 2-naphthylmethyl group, a 1-naphthylethyl group or a 2-naphthylethyl group.

Among these examples, the aforementioned divalent aromatic hydrocarbon group is preferable, and an aromatic hydrocarbon group in which one hydrogen atom has been removed from a phenyl group, or an aromatic hydrocarbon group in which one hydrogen atom has been removed from a naphthyl group is particularly desirable.

The alkyl chain within the arylalkyl group preferably has 1 to 4 carbon atom, more preferably 1 or 2, and most preferably 1.

The aromatic hydrocarbon group may or may not have a substituent. Examples of the substituent include a lower alkyl group of 1 to 5 carbon atoms, a fluorine atom, a fluorinated lower alkyl group of 1 to 5 carbon atoms, and an oxygen atom (=O).

Among the above-mentioned examples, as the hydrocarbon group which may have a substituent, a linear, branched or cyclic aliphatic hydrocarbon group or a divalent aromatic hydrocarbon group is preferable, and a methylene group, and ethylene group, —CH(CH$_3$)—, a group in which one hydrogen atom has been removed from a tetracyclododecyl group, or an aromatic hydrocarbon group in which one hydrogen atom has been removed from a phenyl group is particularly desirable.

(Group Containing a Hetero Atom)

A hetero atom is an atom other than carbon and hydrogen, and examples thereof include an oxygen atom, a nitrogen atom, a sulfur atom and a halogen atom.

Examples of the group containing a hetero atom include —O—, —C(=O)—, —C(=O)—O—, a carbonate bond (—O—C(=O)—O—), —NH—, —NR$^{05}$— (wherein R$^{05}$ represents an alkyl group), —NH—C(=O)—, =N—, and a combination of any of these "groups" with a divalent hydrocarbon group.

As examples of the divalent hydrocarbon group, the same groups as those described above for the hydrocarbon group which may have a substituent can be given, and a linear or branched aliphatic hydrocarbon group is preferable.

Among the above-mentioned examples, as the group containing a hetero atom, a combination of any of the aforementioned "groups" with a divalent hydrocarbon group is preferable. More specifically, it is particularly desirable to use a combination of any of the aforementioned "groups" with the aforementioned aliphatic hydrocarbon group, or a combination of the aforementioned aliphatic hydrocarbon group, any of the aforementioned "groups" and the aforementioned aliphatic hydrocarbon group.

In general formula (f1-1-1), $R^2$ represents an organic group having a fluorine atom, and is the same as defined for $R^2$ in general formula (f1-1-0).

Preferable examples of the structural unit (f1-1) include structural units represented by general formula (f1-1-10) or (f1-1-20) shown below.

[Chemical Formula 14]

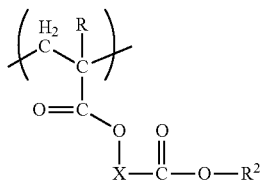

(f1-1-10)

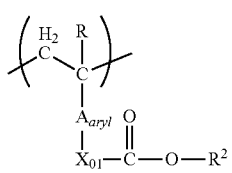

(f1-1-20)

In the formulas, each R independently represents a hydrogen atom, a lower alkyl group of 1 to 5 carbon atoms or a halogenated lower alkyl group of 1 to 5 carbon atoms; X represents a divalent organic group; $A_{aryl}$ represents a divalent aromatic cyclic group which may have a substituent; $X_{01}$ represents a single bond or a divalent linking group; and each $R^2$ independently represents an organic group having a fluorine atom.

In formulas (f1-1-10) and (f1-1-20), $R^2$ is the same as defined above.

In formulas (f1-1-10) and (f1-1-20), as $R^2$, a fluorinated hydrocarbon group is preferable, a fluorinated alkyl group is more preferable, a fluorinated alkyl group of 1 to 5 carbon atoms is still more preferable, and —$CH_2$—$CF_3$, —$CH_2$—$CF_2$—$CF_3$, —$CH(CF_3)_2$, —$CH_2$—$CF_2$—$CF_2$—$CF_3$, —$CH_2$—$CH_2$—$CF_2$—$CF_2$—$CF_3$, and —$CH_2$—$CH_2$—$CF_2$—$CF_2$—$CF_2$—$CF_3$ are most preferable.

As the lower alkyl group for R, a linear or branched lower alkyl group is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

Specific examples of the halogenated lower alkyl group include groups in which part or all of the hydrogen atoms of the aforementioned "lower alkyl group" have been substituted with a halogen atom. Examples of the halogen atom include a fluorine atom, a chlorine atom, a bromine atom and an iodine atom, and a fluorine atom is particularly desirable.

In the present invention, as R, a hydrogen atom, a lower alkyl group or a fluorinated lower alkyl group is preferable, and a hydrogen atom or a methyl group is more preferable in terms of industrial availability.

In general formula (f1-1-10), X represents a divalent organic group.

Preferable examples of X include a hydrocarbon group which may have a substituent, and a group containing a hetero atom, and the same hydrocarbon groups (which may have a substituent) and groups containing a hetero atom described above in the explanation of the divalent linking group for $Q^0$ can be used.1

In general formula (f1-1-20), $A_{aryl}$ represents a divalent aromatic cyclic group which may have a substituent. A specific example of $A_{aryl}$ includes an aromatic hydrocarbon ring (which may have a substituent) having two or more hydrogen atoms removed therefrom.

The ring skeleton of the aromatic cyclic group for $A_{aryl}$ preferably has 6 to 15 carbon atoms. Examples of the ring skeleton include a benzene ring, a naphthalene ring, a phenanthrene ring and an anthracene ring. Among these, a benzene ring or a naphthalene ring is particularly desirable.

Examples of the substituent for the aromatic cyclic group represented by $A_{aryl}$ include a halogen atom, an alkyl group, an alkoxy group, a halogenated lower alkyl group and an oxygen atom (=O). Examples of the halogen atom include a fluorine atom, a chlorine atom, an iodine atom and a bromine atom. As the substituent for the aromatic cyclic group represented by $A_{aryl}$, a fluorine atom is preferable.

$A_{aryl}$ may be either an aromatic cyclic group having no substituent, or an aromatic cyclic group having a substituent, although an aromatic cyclic group having no substituent is preferable.

When $A_{aryl}$ represents an aromatic cyclic group having a substituent, the number of the substituent may be either 1 or at least 2, preferably 1 or 2, and more preferably 1.

In general formula (f1-1-20), $X_{01}$ represents a single bond or a divalent linking group.

Examples of the divalent linking group include an alkylene group of 1 to 10 carbon atoms, —O—, —C(=O)—, —C(=O)—O—, a carbonate bond (—O—C(=O)—O—), and a combination of these groups, and a combination of —O— with an alkylene group of 1 to 10 carbon atoms or a combination of —C(=O)—O— with an alkylene group of 1 to 10 carbon atoms is more preferable.

Examples of alkylene groups of 1 to 10 carbon atoms include linear, branched or cyclic alkylene groups, and a linear or branched alkylene group of 1 to 5 carbon atoms and a cyclic alkylene group of 4 to 10 carbon atoms are preferable.

Among structural units represented by the aforementioned general formula (f1-1-10), structural units represented by general formulas (f1-1-11) to (f1-1-16) shown below are preferable.

Further, among structural units represented by the aforementioned general formula (f1-1-20), structural units represented by general formulas (f1-1-21) to (f1-1-26) shown below are preferable.

[Chemical Formula 15]

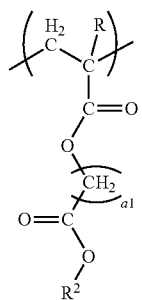

(f1-1-11)

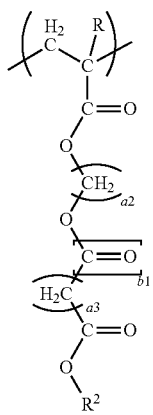 (f1-1-12)
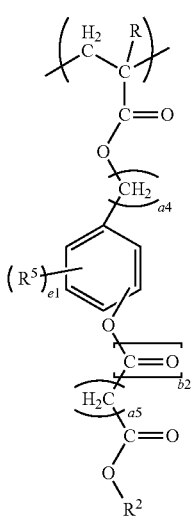 (f1-1-13)
(f1-1-14)
[Chemical Formula 16]
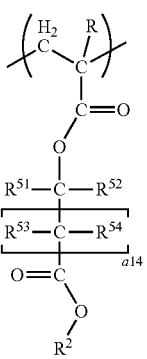 (f1-1-15)
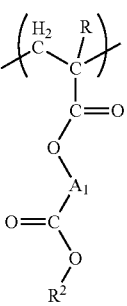 (f1-1-16)
[Chemical Formula 17]
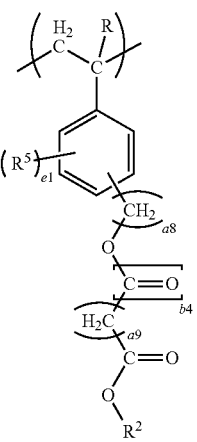 (f1-1-21)
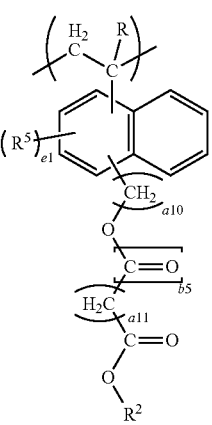 (f1-1-22)

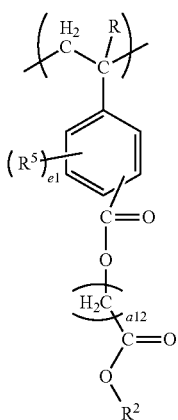

(f1-1-23)

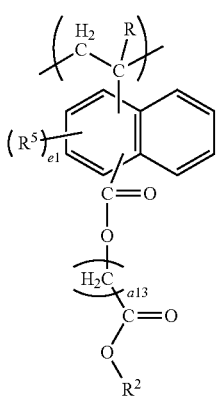

(f1-1-24)

[Chemical Formula 18]

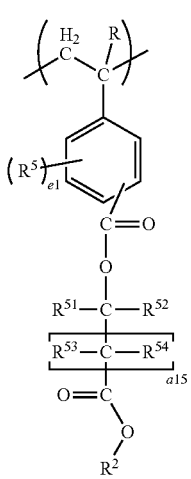

(f1-1-25)

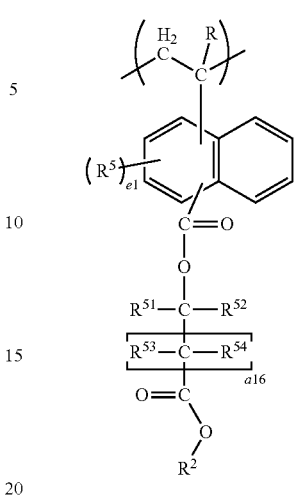

(f1-1-26)

In general formulas (f1-1-11) to (f1-1-16) and (f1-1-21) to (f1-1-26), R and $R^2$ are the same as defined above; each of $R^{51}$ and $R^{52}$ independently represents an alkyl group of 1 to 10 carbon atoms; each of $R^{53}$ and $R^{54}$ independently represents a hydrogen atom or an alkyl group of 1 to 10 carbon atoms; each of a1, a2, a3, a5, a7 a9 and a11 to a13 independently represents an integer of 1 to 5; each of a4, a6, a8 and a10 independently represents an integer of 0 to 5; each of a14 to a16 independently represents an integer of 1 to 5; each of b1 to b5 independently represents 0 or 1; $R^5$ represents a substituent; e1 represents an integer of 0 to 2; and $A_1$ represents a cyclic alkylene group of 4 to 20 carbon atoms.

In formulas (f1-1-11) to (f1-1-16) and (f1-1-21) to (f1-1-26), as R, a hydrogen atom or a methyl group is preferable.

In formula (f1-1-11), a1 is preferably an integer of 1 to 3, more preferably 1 or 2, and most preferably 1.

In formula (f1-1-12), it is preferable that each of a2 and a3 independently represent an integer of 1 to 3, and more preferably 1 or 2.

b1 is preferably 0.

In formula (f1-1-13), a4 is preferably an integer of 0 to 3, more preferably an integer of 0 to 2, and most preferably 0 or 1.

a5 is preferably an integer of 1 to 3, and more preferably 1 or 2.

Examples of the substituent for $R^5$ include a halogen atom, a lower alkyl group, an alkoxy group of 1 to 5 carbon atoms, a halogenated lower alkyl group, or an oxygen atom (=O). As the lower alkyl group, the same lower alkyl groups as those described above for R can be mentioned. Examples of halogen atoms include a fluorine atom, a chlorine atom, an iodine atom and a bromine atom. As the halogenated lower alkyl group, the same halogenated lower alkyl groups as those described above for R can be mentioned.

e1 is preferably 0 or 1, and most preferably 0 from an industrial viewpoint.

b2 is preferably 0.

In general formula (f1-1-14), a6 is preferably an integer of 0 to 3, more preferably an integer of 0 to 2, and most preferably 0 or 1.

a7 is preferably an integer of 1 to 3, and more preferably 1 or 2.

b3 is preferably 0.

$R^5$ and e1 are the same as defined above.

In formula (f1-1-15), a14 is preferably an integer of 0 to 3, more preferably an integer of 0 to 2, and most preferably 0 or 1.

It is preferable that each of $R^{51}$ and $R^{52}$ independently represents a linear, branched or cyclic alkyl group of 1 to 10 carbon atoms, and specific examples thereof include a methyl group, an ethyl group, an n-propyl group, an isopropyl group, an n-butyl group, an isobutyl group, a tert-butyl group, a tert-pentyl group, a cyclopentyl group, a cyclohexyl group, a cyclooctyl group, a norbornyl group, an isobornyl group, a tricyclodecyl group, an adamantyl group and a tetracyclododecyl group. Of these, an alkyl group of 1 to 6 carbon atoms is preferable, more preferably an alkyl group of 1 to 4 carbon atoms, and most preferably a methyl group or an ethyl group.

It is preferable that each of $R^{53}$ and $R^{54}$ independently represents a hydrogen atom, or a linear, branched or cyclic alkyl group of 1 to 10 carbon atoms. For $R^{53}$ and $R^{54}$, the linear, branched or cyclic alkyl group of 1 to 10 carbon atoms is the same as defined above for $R^{51}$ and $R^{52}$.

In formula (f1-1-16), $A_1$ represents a cyclic alkylene group of 4 to 20 carbon atoms, and is preferably a cyclic alkylene group of 5 to 15 carbon atoms, and more preferably a cyclic alkylene group of 6 to 12 carbon atoms. Specific examples of the cyclic alkylene group include those described above as the "cyclic aliphatic hydrocarbon group" for the aforementioned hydrocarbon group which may have a substituent, and the cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include a lower alkyl group of 1 to 5 carbon atoms, a fluorine atom, a fluorinated lower alkyl group of 1 to 5 carbon atoms, and an oxygen atom (=O).

In formula (f1-1-21), a8 is preferably an integer of 0 to 3, more preferably an integer of 0 to 2, and most preferably 0 or 1.

a9 is preferably an integer of 1 to 3, and more preferably 1 or 2.

b4 is preferably 0.

$R^5$ and e1 are the same as defined above.

In formula (f1-1-22), a10 is preferably an integer of 0 to 3, more preferably an integer of 0 to 2, and most preferably 0 or 1.

a11 is preferably an integer of 1 to 3, and more preferably 1 or 2.

b5 is preferably 0.

$R^5$ and e1 are the same as defined above.

In formula (f1-1-23), a12 is preferably an integer of 1 to 3, and more preferably 1 or 2.

$R^5$ and e1 are the same as defined above.

In formula (f1-1-24), a13 is preferably an integer of 1 to 3, and more preferably 1 or 2.

$R^5$ and e1 are the same as defined above.

In formulas (f1-1-25) and (f1-1-26), each of a15 and a16 is preferably an integer of 0 to 3, more preferably an integer of 0 to 2, and most preferably 0 or 1.

Each of $R^{51}$, $R^{52}$, $R^{53}$ and $R^{54}$ are the same as defined above.

$R^5$ and e1 are the same as defined above.

Specific examples of structural units represented by the above general formulas (f1-1-11) to (f1-1-16) and (f1-1-21) to (f1-1-26) are shown below.

[Chemical Formula 19]

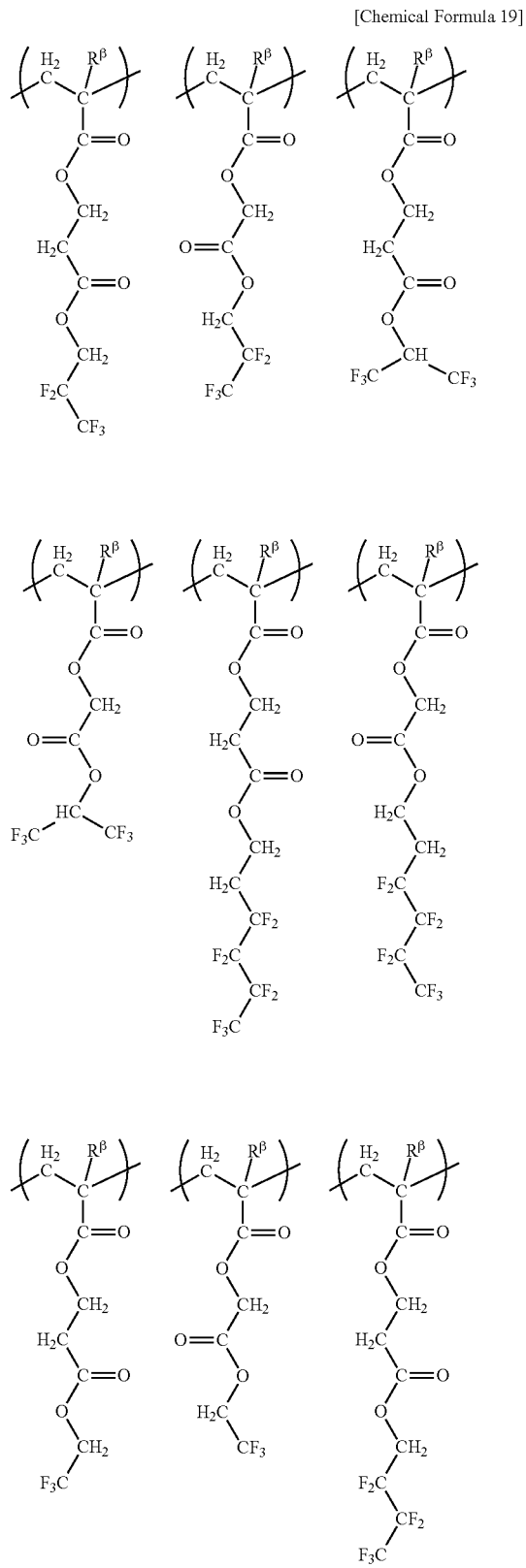

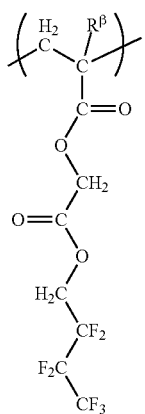
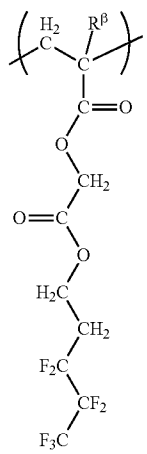
In the formulas, $R^\beta$ represents a hydrogen atom or a methyl group.
In the formulas, $R^\beta$ represents a hydrogen atom or a methyl group.
[Chemical Formula 20]
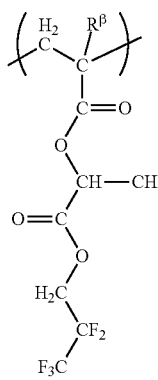 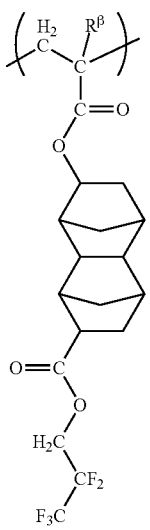 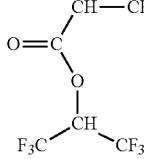
[Chemical Formula 21]
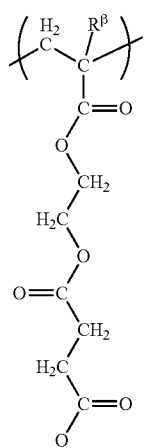 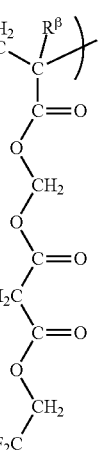 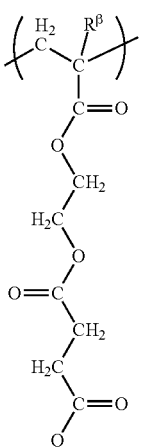
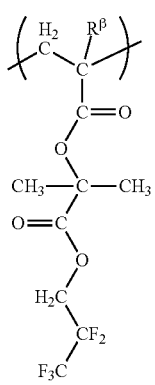 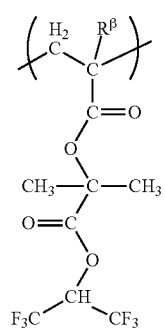 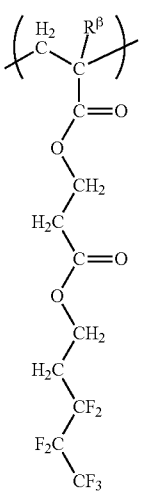
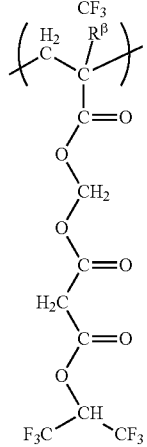 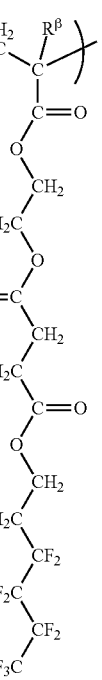 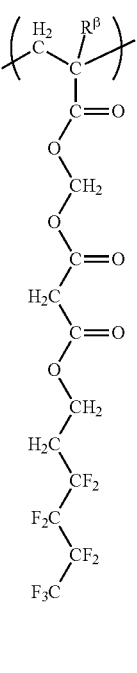

In the formulas, $R^\beta$ represents a hydrogen atom or a methyl group.
[Chemical Formula 22]
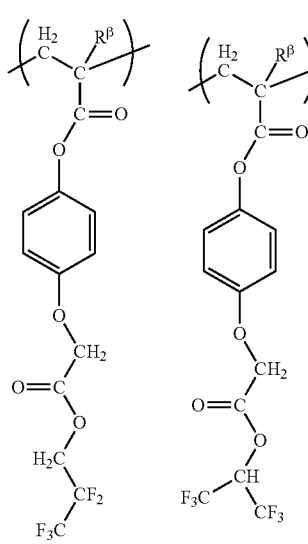
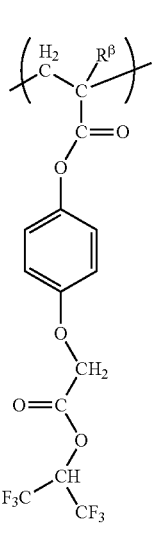
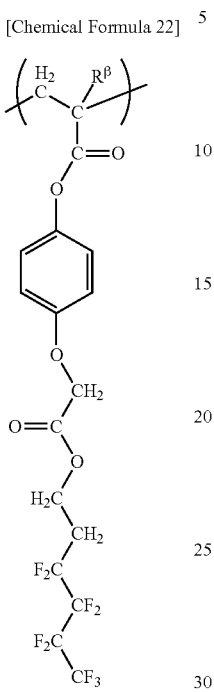
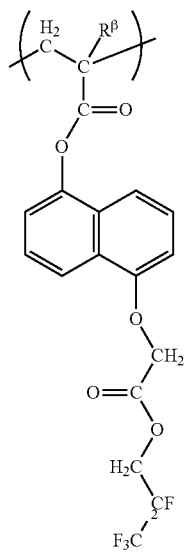
In the formulas, $R^\beta$ represents a hydrogen atom or a methyl group.
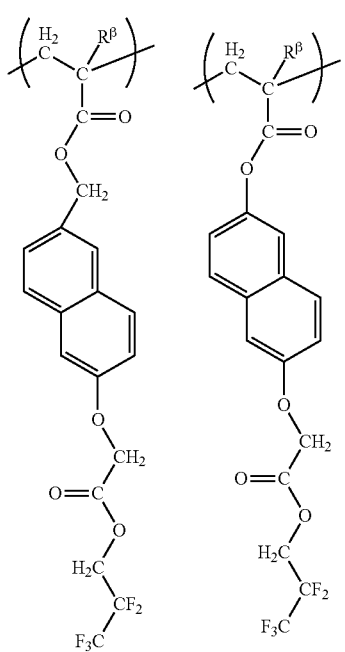
[Chemical Formula 23]
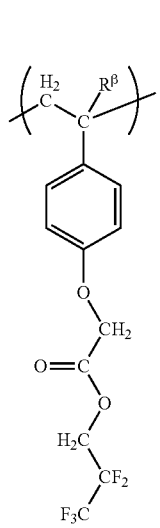
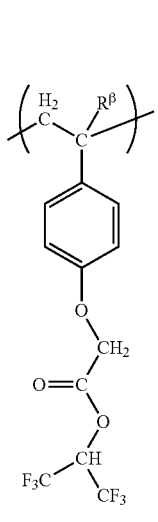
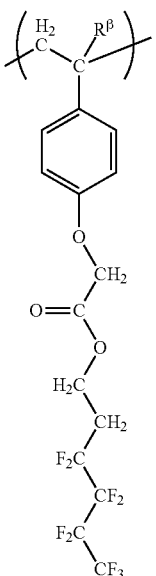

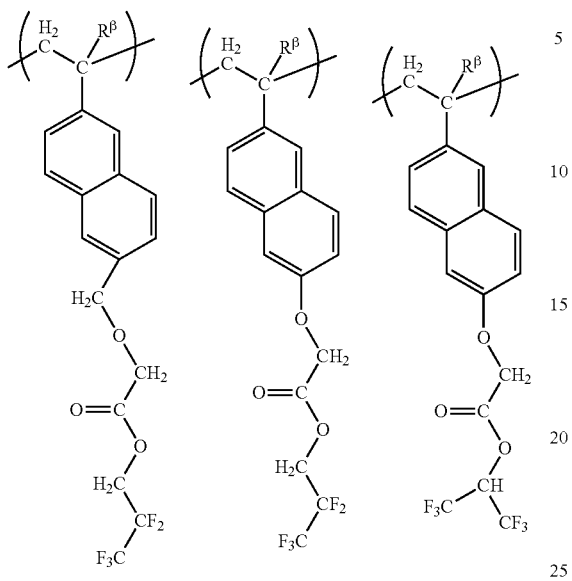

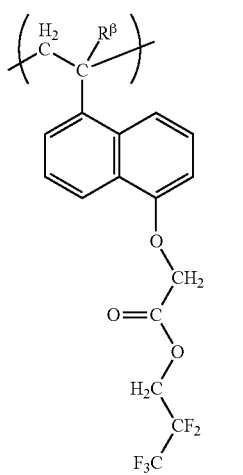

In the formulas, $R^\beta$ represents a hydrogen atom or a methyl group.

As the structural unit (f1-1), at least one structural unit selected from the group consisting of structural units represented by the aforementioned general formulas (f1-1-11) to (f1-1-16) and (f1-1-21) to (f1-1-26) is preferable, more preferably at least one structural unit selected from the group consisting of structural units represented by the aforementioned general formulas (f1-1-11) to (f1-1-13), (f1-1-21) and (f1-1-22), still more preferably at least one structural unit selected from the group consisting of structural units represented by the aforementioned general formulas (f1-1-11) and (f1-1-22), and most preferably structural units represented by the aforementioned general formula (f1-1-11).

Structural Unit (f1-2)

The structural unit (f1-2) is a structural unit derived from an acrylate ester having a fluorine-containing, acid dissociable, dissolution inhibiting group on the side chain.

Specific examples of the structural unit (f1-2), i.e., structural units represented by chemical formulas (f1-2-11) to (f1-2-20) are shown below.

[Chemical Formula 24]

(f1-2-11)

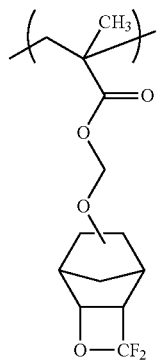

(f1-2-12)

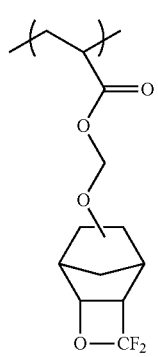

(f1-2-13)

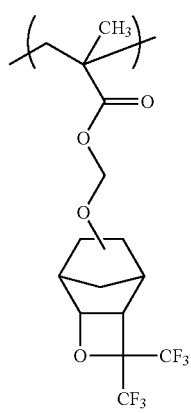

(f1-2-14)

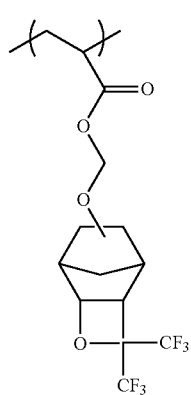

(f1-2-15)

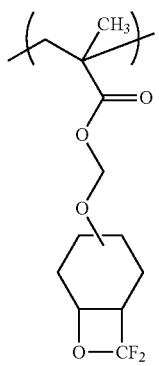

(f1-2-16)

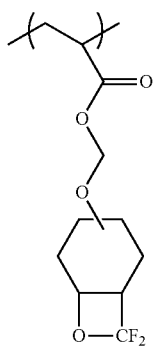

(f1-2-17)

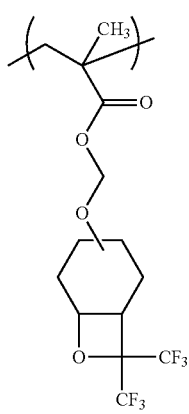

(f1-2-18)

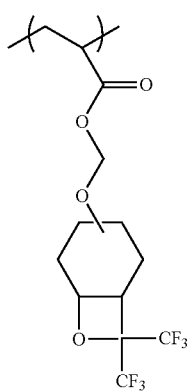

[Chemical Formula 25]

(f1-2-19)

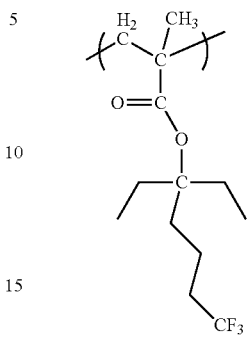

(f1-2-20)

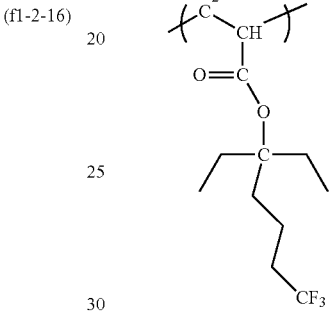

Among these, as the structural unit (f1-2), it is preferable to include at least one structural unit selected from the group consisting of structural units represented by general formulas (f1-2-11) to (f1-2-20), more preferably a structural unit represented by general formula (f1-2-13), (f1-2-14), (f1-2-19) or (f1-2-20), and most preferably a structural unit represented by general formula (f1-2-19) or (f1-2-20).

Structural Unit (f1-3)

The structural unit (f1-3) is a structural unit derived from an acrylate ester having a non-acid dissociable, fluorinated alkyl group of 1 to 20 carbon atoms on the side chain.

Specific examples of the structural unit (f1-3), i.e., structural units represented by chemical formulas (f1-3-11) to (f1-3-17) are shown below.

In formulas (f1-3-14) to (f1-3-17), "F" indicates that all hydrogen atoms on the adamantane skeleton have been substituted with fluorine atoms, i.e., a perfluoroadamantyl group.

[Chemical Formula 26]

(f1-3-11)

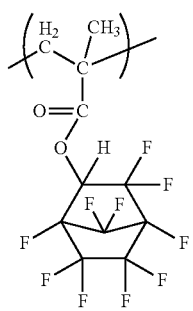

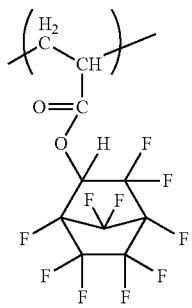 (f1-3-12)

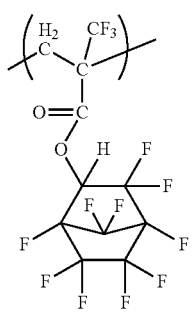 (f1-3-13)

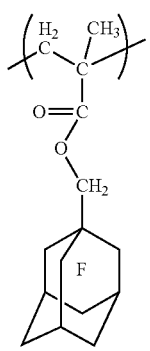 (f1-3-14)

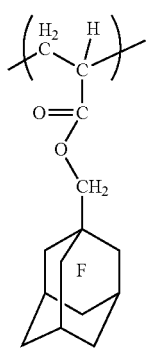 (f1-3-15)

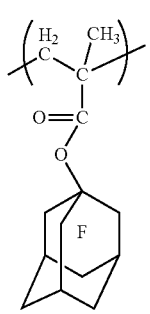 (f1-3-16)

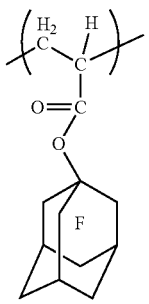 (f1-3-17)

Among these, as the structural unit (f1-3), it is preferable to include at least one structural unit selected from the group consisting of structural units represented by general formulas (f1-3-11) to (f1-3-17), and it is particularly desirable to include a structural unit represented by formula (f1-3-11) or (f1-3-12).

In the component (F), as the structural unit (f1), one type of structural unit may be used alone, or two or more types may be used in combination.

In the component (F), the amount of the structural unit (f1) based on the combined total of all structural units constituting the component (F) is preferably 30 to 95 mol %, more preferably 35 to 90 mol %, still more preferably 40 to 85 mol %, and most preferably 45 to 85 mol %.

When the amount of the structural unit (f1) is at least as large as the lower limit of the above-mentioned range, during resist pattern formation, the characteristic feature of enhancing hydrophobicity of the resist film is improved. On the other hand, when the amount of the structural unit (f1) is no more than the upper limit of the above-mentioned range, a good balance can be achieved with the other structural units.

With respect to the structural unit (f1), the method of producing a monomer for deriving a structural unit (f1-2) which has an acid dissociable, dissolution inhibiting group (I) represented by general formula (f1-2-1) on the side chain is not particularly limited. For example, a method in which a compound (I-0-1) represented by general formula (I-0-1) shown below is reacted with a compound (I-0-2) represented by general formula (I-0-2) shown below can be preferably used.

[Chemical Formula 27]

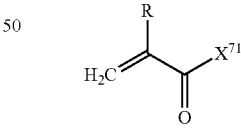 (I-0-1)

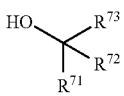 (I-0-2)

In formula (I-0-1), R is the same as defined above, and $X^{71}$ represents a halogen atom. In formula (I-0-2), $R^{71}$ to $R^{73}$ are respectively the same as defined for $R^{71}$ to $R^{73}$ in general formula (f1-2-1).

In general formula (I-0-1), as examples of the halogen atom for $X^{71}$, a bromine atom, a chlorine atom, an iodine atom and a fluorine atom can be given. In terms of reactivity, a chlorine atom is preferable.

In the reaction between the compound (I-0-1) and the compound (I-0-2), the reaction solvent is not particularly limited, and any one capable of dissolving the aforementioned compounds as raw materials can be preferably used. Specific examples thereof include acetonitrile and acetone.

The reaction is preferably performed in the presence of a base. The base is not particularly limited, and any of those which exhibit a low nucleophilicity can be preferably used, e.g., triethylamine.

Further, it is preferable to perform the reaction in the presence of a catalyst, as the reaction proceeds smoothly.

As the catalyst, any of those conventionally known can be used. Preferable examples thereof include 4-dimethylaminopyridine.

In the reaction, it is preferable to mix the compound (I-0-2), and optionally a base and/or a catalyst, with a solvent, and dropwise add the compound (I-0-1) thereto. The compound (I-0-1) may be dissolved and diluted in a solvent in advance.

The temperature and time for the dropwise addition can be appropriately selected depending on the raw materials used. The temperature is preferably −10 to 100° C., more preferably −5 to 90° C., and most preferably 0 to 80° C. The time is preferably 5 to 90 minutes, more preferably 10 to 60 minutes, and most preferably 20 to 40 minutes.

The reaction temperature and reaction time after the addition of the compound (I-0-1) can also be appropriately selected. The reaction temperature is preferably the same as the temperature during the addition of the compound (I-0-1). The reaction time can be appropriately selected depending on the raw materials used, and is preferably 0.5 to 15 hours, more preferably 1 to 10 hours, and most preferably 1.5 to 8 hours.

After the completion of the reaction, the compound of the present invention can be collected by a conventional method. For example, if necessary, the reaction mixture may washed with water, an aqueous basic solution, a saline solution or the like, and the oragnic phase may be concentrated, followed by crystallization of the objective compound. The concentrated organic phase or the crystallized product may be purified by silica gel chromatography or the like.

As the compound (I-0-2), a commercially available product may be used, or a synthesized product may be used. The synthesis of the compound (I-0-2) may be performed by a conventional synthesis method of a tertiary alcohol. For example, the synthesis may be performed by grignard reaction, or a silane compound having a fluorinated alkyl group may be reacted with ketone.

Structural Unit (f2)

The structural unit (f2) is a structural unit containing a hydrophilic group-containing aliphatic hydrocarbon group.

In the present description and claims, a "hydrophilic group" refers to a group which significantly interacts with water and exhibits a significant affinity for water. In particular, a group that exhibits a significant affinity for an alkali developing solution (e.g., a 2.38 weight % TMAH solution at 23° C.) or a group which is soluble in an alkali developing solution is preferable.

Specific examples of the hydrophilic group include a hydroxyl group (—OH), a cyano group (—CN), a carboxy group (—COOH), an amino group (—NH$_2$), a sulfo group (—SO$_2$(OH)) and a mercapto group (—SH), and a hydroxyl group is particularly desirable.

By virtue of the component (F) including the structural unit (f2), the solubility of the component (F) in a resist solvent (especially an alcohol-type organic solvent) is improved. Further, the hydrophilicity of the component (F) is enhanced, and the affinity for an alkali developing solution is improved, thereby increasing the alkali solubility of the component (F).

Examples of the aliphatic hydrocarbon group include linear or branched hydrocarbon groups (preferably alkylene groups) of 1 to 10 carbon atoms, and polycyclic aliphatic hydrocarbon groups (polycyclic groups).

These polycyclic groups can be selected appropriately from the multitude of groups that have been proposed for the resins of resist compositions designed for use with ArF excimer lasers. The polycyclic group preferably has 7 to 30 carbon atoms.

The "main chain" of the structural unit (f2) is not particularly limited, and preferable examples thereof include a structural unit having a cyclic main chain (hereafter, referred to as "cyclic-main chain structural unit") and a structural unit derived from an acrylate ester. Of these, a structural unit derived from an acrylate ester is preferable.

In the resist composition for immersion exposure according to the present invention, as the structural unit (f2), a structural unit derived from an acrylate ester containing a hydrophilic group-containing aliphatic hydrocarbon group is preferable because favorable solubility of the composition in organic solvents can be achieved, and the hydrophobicity of the surface of the resist film can be enhanced.

Among these, a structural unit derived from an acrylate ester containing an aliphatic polycyclic group having a hydroxy group, a cyano group or a carboxy group is preferable.

Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the hydrophilic group-containing aliphatic hydrocarbon group is a linear or branched hydrocarbon group of 1 to 10 carbon atoms, the structural unit (f2) is preferably a structural unit derived from a hydroxyethyl ester of acrylic acid. On the other hand, when the hydrocarbon group is a polycyclic group, structural units represented by formulas (f2-1), (f2-2) and (f2-3) shown below are preferable.

[Chemical Formula 28]

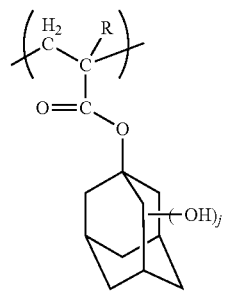

(f2-1)

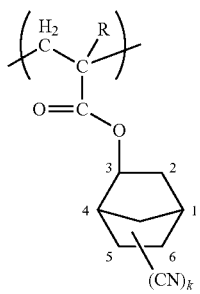

(f2-2)

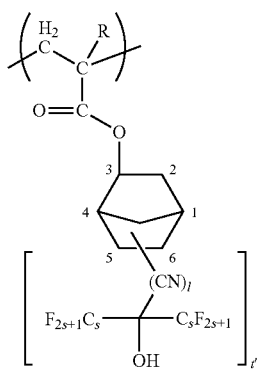

(f2-3)

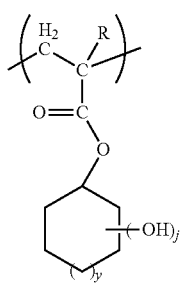

(f2-4)

In the formulas above, R is the same as defined above; each j represents an integer of 1 to 3; k represents an integer of 1 to 3; t' represents an integer of 1 to 3; l represents an integer of 1 to 5; s represents an integer of 1 to 3; and v represents an integer of 0 to 2.

In formula (f2-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (f2-2), k is preferably 1. The cyano group is preferably bonded to the 5th or 6th position of the norbornyl group.

In formula (f2-3), t' is preferably 1. l is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

In formula (f2-4), j is preferably 1. y is preferably 0 or 1, and more preferably 1.

In the component (F), as the structural unit (f2), one type of structural unit may be used alone, or two or more types of structural units may be used in combination.

In the component (F), the amount of the structural unit (f2) based on the combined total of all structural units constituting the component (F) is preferably 5 to 50 mol %, more preferably 5 to 40 mol %, and still more preferably 5 to 25 mol %.

When the amount of the structural unit (f2) is at least as large as the lower limit of the above-mentioned range, the effect of using the structural unit (f2) can be satisfactorily achieved. On the other hand, when the amount of the structural unit (f2) is no more than the upper limit of the above-mentioned range, a good balance can be achieved with the other structural units.

Structural Unit (f3)

The structural unit (f3) is a structural unit represented by general formula (f3-1) shown below.

[Chemical Formula 29]

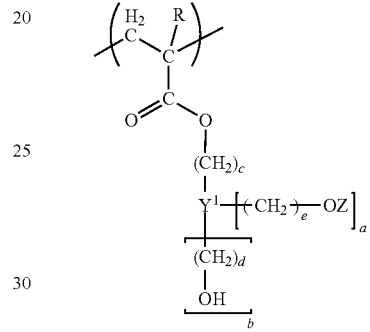

(f3-1)

In general formula (f3-1), R represents a hydrogen atom, a lower alkyl group of 1 to 5 carbon atoms or a halogenated lower alkyl group of 1 to 5 carbon atoms; $Y^1$ represents an aliphatic cyclic group; Z represents a tertiary alkyl group-containing group or an alkoxyalkyl group; a represents an integer of 1 to 3, and b represents an integer of 0 to 2, with the provision that a+b=1 to 3; and each of c, d and e independently represents an integer of 0 to 3.

In general formula (f3-1), R represents a hydrogen atom, a lower alkyl group of 1 to 5 carbon atoms or a halogenated lower alkyl group of 1 to 5 carbon atoms.

The lower alkyl group and halogenated lower alkyl group for R are respectively the same as defined for the lower alkyl group and halogenated lower alkyl group which may be bonded to the α-position of the aforementioned acrylate ester. Of the various possibilities, R is preferably a hydrogen atom or a methyl group.

In general formula (f3-1) above, $Y^1$ represents an aliphatic cyclic group.

In the present descriptions and the claims, the term "aliphatic cyclic group" refers to a monocyclic group or polycyclic group that has no aromaticity.

The "aliphatic cyclic group" within the structural unit (f3) may or may not have a substituent. Examples of the substituent include a lower alkyl group of 1 to 5 carbon atoms, a fluorine atom, a fluorinated lower alkyl group of 1 to 5 carbon atoms, and an oxygen atom (=O).

The basic ring of the "aliphatic cyclic group" exclusive of substituents (aliphatic ring) is not limited to be constituted from only carbon and hydrogen (not limited to hydrocarbon rings), but is preferably a hydrocarbon ring. Further, the "hydrocarbon ring" may be either saturated or unsaturated, but is preferably saturated.

The aliphatic cyclic group may be either a polycyclic group or a monocyclic group. Examples of the aliphatic cyclic group include groups in which two or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated alkyl group. Specific examples include groups in which two or more hydrogen atoms have been removed from a monocycloalkane such as cyclopentane or cyclohexane; and groups in which two or more hydrogen atoms have been removed from a polycycloalkane such as adamantane, norbornane, isobornane, tricyclodecane or tetracyclododecane.

The aliphatic cyclic group within the structural unit (f3) is preferably a polycyclic group, and a group in which two or more hydrogen atoms have been removed from adamantane is particularly desirable.

In general formula (f3-1), Z represents a tertiary alkyl group-containing group or an alkoxyalkyl group.

In the present description and the claims, the term "tertiary alkyl group" refers to an alkyl group having a tertiary carbon atom. As mentioned above, the term "alkyl group" refers to a monovalent saturated hydrocarbon group, and includes chain-like (linear or branched) alkyl groups and cyclic alkyl groups.

The term "tertiary alkyl group-containing group" refers to a group which includes a tertiary alkyl group in the structure thereof. The tertiary alkyl group-containing group may be either constituted of only a tertiary alkyl group, or constituted of a tertiary alkyl group and an atom or group other than a tertiary alkyl group.

Examples of the "atom or group other than a tertiary alkyl group" which constitutes the tertiary alkyl group-containing group with a tertiary alkyl group include a carbonyloxy group, a carbonyl group, an alkylene group and an oxygen atom.

As the tertiary alkyl group-containing group for Z, a tertiary alkyl group-containing group which does not have a ring structure, and a tertiary alkyl group-containing group which has a ring structure can be mentioned.

A tertiary alkyl group-containing group which does not have a ring structure is a group which has a branched tertiary alkyl group as the tertiary alkyl group, and has no ring in the structure thereof.

As the branched tertiary alkyl group, for example, a group represented by general formula (I) shown below can be mentioned.

[Chemical Formula 30]

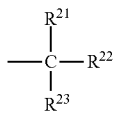

(I)

In formula (I), each of $R^{21}$ to $R^{23}$ independently represents a linear or branched alkyl group. The number of carbon atoms within the alkyl group is preferably from 1 to 5, and more preferably from 1 to 3.

Further, in the group represented by general formula (I), the total number of carbon atoms is preferably from 4 to 7, more preferably from 4 to 6, and most preferably 4 or 5.

Preferable examples of the group represented by general formula (I) include a tert-butyl group and a tert-pentyl group, and a tert-butyl group is more preferable.

Examples of tertiary alkyl group-containing groups which do not have a ring structure include the aforementioned branched tertiary alkyl group; a tertiary alkyl group-containing, chain-like alkyl group in which the aforementioned branched tertiary alkyl group is bonded to a linear or branched alkylene group; a tertiary alkyloxycarbonyl group which has the aforementioned branched tertiary alkyl group as the tertiary alkyl group; and a tertiary alkyloxycarbonylalkyl group which has the aforementioned branched tertiary alkyl group as the tertiary alkyl group.

As the alkylene group within the tertiary alkyl group-containing, chain-like alkyl group, an alkylene group of 1 to 5 carbon atoms is preferable, an alkylene group of 1 to 4 carbon atoms is more preferable, and an alkylene group of 1 or 2 carbon atoms is most desirable.

As a chain-like tertiary alkyloxycarbonyl group, for example, a group represented by general formula (II) shown below can be mentioned. In general formula (II), $R^{21}$ to $R^{23}$ are the same as defined for $R^{21}$ to $R^{23}$ in general formula (I). As the chain-like tertiary alkyloxycarbonyl group, a tert-butyloxycarbonyl group (t-boc) and a tert-pentyloxycarbonyl group are preferable.

[Chemical Formula 31]

(II)

As a chain-like tertiary alkyloxycarbonylalkyl group, for example, a group represented by general formula (III) shown below can be mentioned. In general formula (III), $R^{21}$ to $R^{23}$ are the same as defined for $R^{21}$ to $R^{23}$ in general formula (I). f represents an integer of 1 to 3, and is preferably 1 or 2. As the chain-like tertiary alkyloxycarbonylalkyl group, a tert-butyloxycarbonylmethyl group and a tert-butyloxycarbonylethyl group are preferable.

Among these, as the tertiary alkyl group-containing group which does not have a ring structure, a tertiary alkyloxycarbonyl group or a tertiary alkyloxycarbonylalkyl group is preferable, a tertiary alkyloxycarbonyl group is more preferable, and a tert-butyloxycarbonyl group (t-boc) is most preferable.

[Chemical Formula 32]

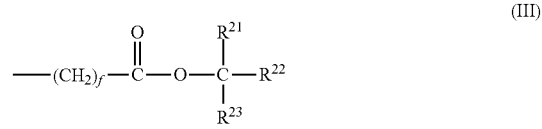

(III)

A tertiary alkyl group-containing group which has a ring structure is a group which contains a tertiary carbon atom and a ring in the structure thereof.

In the tertiary alkyl group-containing group which has a ring structure, the ring structure preferably has 4 to 12 carbon atoms which constitute the ring, more preferably 5 to 10 carbon atoms, and most preferably 6 to 10 carbon atoms. As the ring structure, for example, groups in which one or more hydrogen atoms have been removed from a monocycloalkane or a polycycloalkane such as a bicycloalkane, tricycloalkane or tetracycloalkane can be mentioned. Preferable examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

As the tertiary alkyl group-containing group which has a ring structure, for example, a group having the following group (1) or (2) as the tertiary alkyl group can be mentioned.

(1) A group in which a linear or branched alkyl group is bonded to a carbon atom which constitutes the ring of a cyclic alkyl group (cycloalkyl group), so that the carbon atom becomes a tertiary carbon atom.

(2) A group in which an alkylene group (branched alkylene group) having a tertiary carbon atom is bonded to a carbon atom constituting the ring of a cycloalkyl group.

In the aforementioned group (1), the linear or branched alkyl group preferably has 1 to 5 carbon atoms, more preferably 1 to 4 carbon atoms, and most preferably 1 to 3 carbon atoms.

Examples of the group (1) include a 2-methyl-2-adamantyl group, a 2-ethyl-2-adamantyl group, a 1-methyl-1-cycloalkyl group and a 1-ethyl-1-cycloalkyl group.

In the aforementioned group (2), the cycloalkyl group having a branched alkylene group bonded thereto may have a substituent. Examples of the substituent include a fluorine atom, a fluorinated lower alkyl group of 1 to 5 carbon atoms, and an oxygen atom (=O).

As an example of the group (2), a group represented by general formula (IV) shown below can be given.

[Chemical Formula 33]

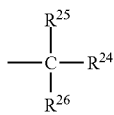

(IV)

In general formula (IV), $R^{24}$ represents a cycloalkyl group which may or may not have a substituent. Examples of the substituent which the cycloalkyl group may have include a fluorine atom, a fluorinated alkyl group of 1 to 5 carbon atoms, and an oxygen atom (=O).

Each of $R^{25}$ and $R^{26}$ independently represents a linear or branched alkyl group. As the alkyl group, the same alkyl groups as those described above for $R^{21}$ to $R^{23}$ in general formula (I) may be mentioned.

As the alkoxyalkyl group for Z, for example, a group represented by general formula (V) shown below can be mentioned.

[Chemical Formula 34]

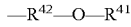

(V)

In formula (V), $R^{41}$ represents a linear, branched or cyclic alkyl group.

When $R^{41}$ represents a linear or branched alkyl group, it is preferably an alkyl group of 1 to 5 carbon atoms, more preferably an ethyl group or a methyl group, and an ethyl group is particularly desirable.

When $R^{41}$ represents a cyclic alkyl group, it preferably has 4 to 15 carbon atoms, more preferably 4 to 12 carbon atoms, and most preferably 5 to 10 carbon atoms. As examples of the cyclic alkyl group, groups in which one or more hydrogen atoms have been removed from a monocycloalkane or a polycycloalkane such as a bicycloalkane, tricycloalkane or tetracycloalkane, and which may or may not be substituted with a fluorine atom or a fluorinated alkyl group, may be mentioned. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

$R^{42}$ represents a linear or branched alkylene group. The alkylene group preferably has 1 to 5 carbon atoms, more preferably 1 to 3 carbon atoms, and most preferably 1 or 2 carbon atoms.

As the alkoxyalkyl group for Z, a group represented by general formula (VI) shown below is particularly desirable.

[Chemical Formula 35]

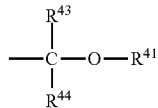

(VI)

In general formula (VI), $R^{41}$ is the same as defined above, and each of $R^{43}$ and $R^{44}$ independently represents a linear or branched alkyl group or a hydrogen atom.

With respect to $R^{43}$ and $R^{44}$, the alkyl group preferably has 1 to 15 carbon atoms, and may be either linear or branched. As the alkyl group, an ethyl group or a methyl group is preferable, and a methyl group is most preferable.

It is particularly desirable that either one of $R^{43}$ and $R^{44}$ be a hydrogen atom, and the other be a methyl group.

Among the above-mentioned examples, as Z, a tertiary alkyl group-containing group is preferable, a group represented by general formula (II) above is more preferable, and a tert-butyloxycarbonyl group (t-boc) is most preferable.

In general formula (f3-1), a represents an integer of 1 to 3, and b represents an integer of 0 to 2, with the provision that a+b=1 to 3.

a is preferably 1.

b is preferably 0.

a+b is preferably 1.

c represents an integer of 0 to 3, preferably 0 or 1, and more preferably 0.

d represents an integer of 0 to 3, preferably 0 or 1, and more preferably 0.

e represents an integer of 0 to 3, preferably 0 or 1, and more preferably 0.

As the structural unit (f3), a structural unit represented by general formula (f3-1-1) shown below is particularly desirable.

[Chemical Formula 36]

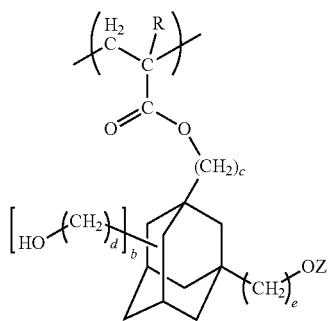

(f3-1-1)

In the formula, R, Z, b, c, d and e are the same as defined above.

A monomer for deriving the structural unit (f3) can be synthesized, for example, by protecting part or all of the hydroxyl groups within a compound represented by general formula (f3-1') shown below (namely, an acrylate ester containing an aliphatic cyclic group having 1 to 3 alcoholic hydroxyl groups) with tertiary alkyl group-containing groups or alkoxyalkyl groups by a conventional method.

[Chemical Formula 37]

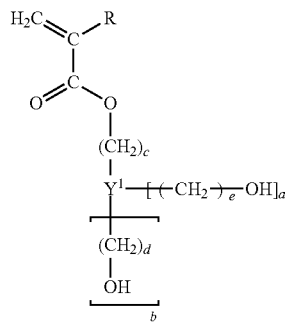

(f3-1')

In the formula, R, $Y^1$, a, b, c, d and e are the same as defined above.

In the component (F), as the structural unit (f3), one type of structural unit may be used alone, or two or more types of structural units may be used in combination.

The amount of the structural unit (f3) within the component (F) based on the combined total of all structural units constituting the component (F) is preferably 1 to 45 mol %, more preferably 5 to 45 mol %, still more preferably 5 to 40 mol %, and most preferably 5 to 35 mol %. When the amount of the structural unit (f3) is at least as large as the lower limit of the above-mentioned range, the solubility of the component (F) in an organic solvent is improved. On the other hand, when the amount of the structural unit (f3) is no more than the upper limit of the above-mentioned range, a good balance can be achieved with the other structural units.

Other Structural Units

The component (F) may include a structural unit other than the structural unit (f1), the structural unit (f2) and the structural unit (f3) (hereafter, frequently referred to as "structural unit (f4)"), as long as the effects of the present invention are not impaired.

There are no particular limitations on the structural unit (f4), provided the structural unit is derived from a compound that is copolymerizable with the compound that derives the structural unit (f1), the compound that derives the structural unit (f2) and the compound that derives the structural unit (f3).

Examples of such structural units include structural units which have been proposed for the base resin of a conventional chemically amplified resist (such as the structural units (a1) to (a4) described later).

In the resist composition for immersion exposure according to the present invention, the component (F) is a resin component including a structural unit (f1), a structural unit (f2) and a structural unit (f3).

Specifically, the component (F) is preferably a copolymer (hereafter, referred to as "copolymer (F-1)") which has a structural unit (f1), a structural unit (12) and a structural unit (f3).

Examples of the copolymer (F-1) include a copolymer consisting of a structural unit (f1), a structural unit (f2) and a structural unit (f3) and a copolymer consisting of a structural unit (f1), a structural unit (f2), a structural unit (f3) and a structural unit (f4). Among these, as the component (F), a copolymer consisting of a structural unit (f1), a structural unit (12) and a structural unit (f3) is preferable, and a copolymer consisting of a structural unit (f1-2), a structural unit (f2) and a structural unit (f3) is particularly desirable.

In the component (F), as the copolymer (F-1), one type of resin may be used, or two or more types of resins may be used in combination.

In the resist composition for immersion exposure according to the present invention, as the copolymer (F-1), a resin that includes a combination of structural units such as that shown below is particularly desirable.

[Chemical Formula 38]

Copolymer (F-1-1)

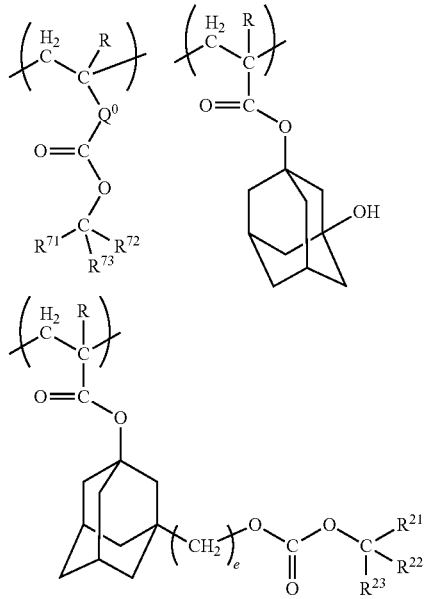

In the formula, R is the same as defined above, and the plurality of R may be either the same or different from each other; $Q^0$ is the same as defined for $Q^0$ in general formula (f1-1-1); $R^{71}$ to $R^{73}$ are respectively the same as defined for $R^{71}$ to $R^{73}$ in general formula (f1-2-1); $R^{21}$, $R^{22}$ and $R^{23}$ are respectively the same as defined for $R^{21}$, $R^{22}$ and $R^{23}$ in general formula (I); and e is the same as defined for e in general formula (f3-1).

[Chemical Formula 39]

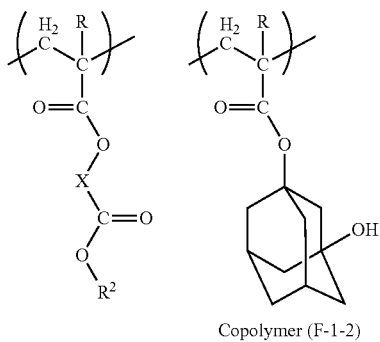

Copolymer (F-1-2)

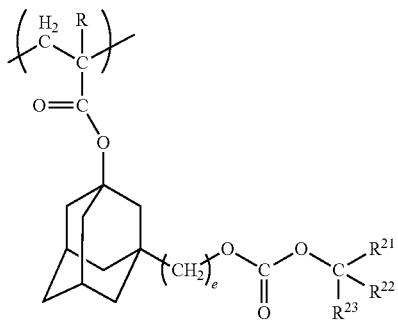

In the formula, R is the same as defined above, and the plurality of R may be either the same or different from each other; X and $R^2$ are respectively the same as defined for X and $R^2$ in general formula (f1-1-10); and $R^{21}$, $R^{22}$, $R^{23}$ and e are the same as defined above.

As the copolymer represented by formula (F-1-2), a copolymer represented by formula (F-1-21) shown below is particularly desirable.

[Chemical Formula 40]

Copolymer (F-1-21)

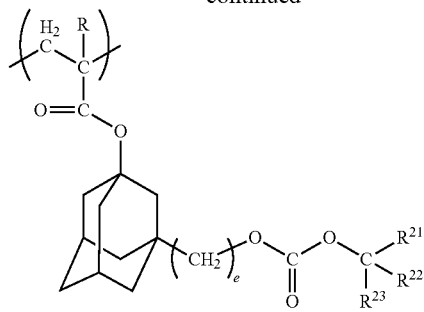

-continued

In the formula, R is the same as defined above, and the plurality of R may be either the same or different from each other; a1 is the same as defined for a1 in formula (f1-1-11); and $R^2$, $R^{21}$, $R^{22}$, $R^{23}$ and e are the same as defined above.

The weight average molecular weight (Mw) (the polystyrene equivalent value determined by gel permeation chromatography) of the component (F) is not particularly limited, but is preferably 2,000 to 50,000, more preferably 3,000 to 30,000, and most preferably 4,000 to 25,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (F) is preferably 1.0 to 5.0, more preferably 1.0 to 3.0, and most preferably 1.2 to 2.5. Here, Mn is the number average molecular weight.

The component (F) can be produced, for example, by a conventional radical polymerization or the like of the monomers corresponding with each of the structural units that constitute the component (F), using a radical polymerization initiator such as azobisisobutyronitrile (AIBN) or dimethyl 2,2'-azobis(isobutyrate) (V-601).

In the resist composition for immersion exposure according to the present invention, the amount of the component (F) relative to 100 parts by weight of the component (A) (described later) is preferably 0.5 to 30 parts by weight, more preferably 0.8 to 25 parts by weight, still more preferably 1 to 20 parts by weight, and most preferably 1 to 15 parts by weight. When the amount of the component (F) is at least as large as the lower limit of the above-mentioned range, the hydrophobicity of a resist film formed using the resist composition for immersion exposure is enhanced, and a resist film exhibiting a suitable hydrophobicity for immersion exposure can be formed. On the other hand, when the amount of the component (F) is no more than the upper limit of the above-mentioned range, solubility of the component (F) in a resist solvent (organic solvent) is improved. Further, the lithographic properties are also improved.

<Component (A)>

As the component (A), an organic compound typically used as a base component for a chemically amplified resist composition can be used alone, or two or more of such organic compounds can be mixed together.

Here, the term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compounds having a molecular weight of 500 or more that may be used as the base component are broadly classified into low molecular weight organic compounds having a molecular weight of 500 to less than 2,000 (namely, "low molecular weight materials") and high molecular weight organic compounds having a molecular weight of 2,000 or more (namely, "polymeric materials"). Generally, a non-polymer is used as the low molecular weight material. A resin (a polymer or copolymer) is used as the polymeric material. The "molecular weight" of the resin refers to the polystyrene equivalent weight average molecular weight determined by GPC (gel permeation chromatography). Hereafter, a "resin" refers to a resin having a molecular weight of 2,000 or more.

The component (A) may be a resin that exhibits changed alkali solubility under the action of acid, a low molecular weight material that exhibits changed alkali solubility under the action of acid, or a combination of these materials.

[Component (A1)]

When the resist composition for immersion exposure according to the present invention is a positive resist composition, as the component (A), a base component (A1) which exhibits increased solubility in an alkali developing solution by action of acid (hereafter, referred to as "component (A1)") is preferable.

More specifically, the component (A1) is substantially insoluble in an alkali developing solution prior to exposure, but when acid is generated from the component (B) upon exposure, the action of this acid causes an increase in the solubility of the base component in an alkali developing solution. Therefore, in the formation of a resist pattern, by conducting selective exposure of a resist film formed by applying the positive resist composition onto a substrate, the exposed portions changes from an insoluble state to a soluble state in an alkali developing solution, whereas the unexposed portions remain insoluble in an alkali developing solution, and hence, a resist pattern can be formed by alkali developing.

The component (A1) may be a resin component (A1-1) that exhibits increased solubility in an alkali developing solution under the action of acid (hereafter, frequently referred to as "component (A1-1)"), a low molecular weight material (A1-2) that exhibits increased solubility in an alkali developing solution under the action of acid (hereafter, frequently referred to as "component (A 1-2)"), or a mixture thereof.

In the present invention, as the component (A), those which include the component (A1-1) is preferable, and the component (A1-1) is particularly desirable.

Resin Component (A1-1)

As the component (A1-1), a resin component (base resin) typically used as a base component for a chemically amplified resist composition can be used alone, or two or more of such resin components can be mixed together.

In the present invention, it is preferable that the component (A1-1) include a structural unit derived from an acrylate ester.

It is particularly desirable that the component (A1-1) have a structural unit (a1) derived from an acrylate ester containing an acid dissociable, dissolution inhibiting group.

Further, it is preferable that the component (A1-1) have a structural unit (a2) derived from an acrylate ester containing a lactone-containing cyclic group, as well as the structural unit (a1).

Furthermore, it is preferable that the component (A1-1) further include a structural unit (a3) represented by general formula (a3-1) shown below, as well as the structural unit (a1), or the structural unit (a1) and the structural unit (a2).

Still further, it is preferable that the component (A1) further include the aforementioned structural unit (f3), as well as the structural unit (a1), the structural unit (a1) and the structural unit (a2), the structural unit (a1) and the structural unit (a3), or the structural unit (a1), the structural unit (a2) and the structural unit (a3).

Also, the component (A1-1) may further include a structural unit other than the above-mentioned structural units (a1), (a2), (a3) and (f3), as well as the structural unit (a1).

Structural Unit (a1)

The structural unit (a1) is a structural unit derived from an acrylate ester containing an acid dissociable, dissolution inhibiting group.

As the acid dissociable, dissolution inhibiting group in the structural unit (a1), any of the groups that have been proposed as acid dissociable, dissolution inhibiting groups for the base resins of chemically amplified resists can be used, provided the group has an alkali dissolution-inhibiting effect that renders the entire component (A1-1) insoluble in an alkali developing solution prior to dissociation, and then following dissociation by action of acid, increases the solubility of the entire component (A1-1) in the alkali developing solution. Generally, groups that form either a cyclic or chain-like tertiary alkyl ester with the carboxyl group of the (meth)acrylic acid, and acetal-type acid dissociable, dissolution inhibiting groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

In the present description and claims, the term "aliphatic" is a relative concept used in relation to the term "aromatic", and defines a group or compound that has no aromaticity.

The term "aliphatic branched" refers to a branched structure having no aromaticity.

The "aliphatic branched, acid dissociable, dissolution inhibiting group" is not limited to be constituted of only carbon atoms and hydrogen atoms (not limited to hydrocarbon groups), but is preferably a hydrocarbon group.

Further, the "hydrocarbon group" may be either saturated or unsaturated, but is preferably saturated.

Examples of aliphatic branched, acid dissociable, dissolution inhibiting groups include tertiary alkyl groups of 4 to 8 carbon atoms, and specific examples include a tert-butyl group, tert-pentyl group and tert-heptyl group.

The term "aliphatic cyclic group" refers to a monocyclic group or polycyclic group that has no aromaticity.

The "aliphatic cyclic group" within the structural unit (a1) may or may not have a substituent. Examples of substituents include lower alkyl groups of 1 to 5 carbon atoms, lower alkoxy groups of 1 to 5 carbon atoms, fluorine atom, fluorinated lower alkyl groups of 1 to 5 carbon atoms, and oxygen atom (=O).

The basic ring of the "aliphatic cyclic group" exclusive of substituents is not limited to be constituted from only carbon and hydrogen (not limited to hydrocarbon groups), but is preferably a hydrocarbon group.

Further, the "hydrocarbon group" may be either saturated or unsaturated, but is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated lower alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

As the aliphatic cyclic group-containing acid dissociable, dissolution inhibiting group, for example, a group which has a tertiary carbon atom on the ring structure of the cycloalkyl group can be used. Specific examples include 2-methyl-2-adamantyl group and a 2-ethyl-2-adamantyl group. Further, groups having an aliphatic cyclic group such as an adamantyl group, cyclohexyl group, cyclopentyl group, norbornyl group, tricyclodecanyl group or tetracyclododecanyl group, and a branched alkylene group having a tertiary carbon atom bonded thereto, as the groups bonded to the oxygen atom of the carbonyl group (—C(O)—O—) within the structural units represented by general formulas (a1"-1) to (a1"-6) shown below, can be used.

[Chemical Formula 41]

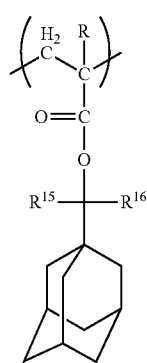

(a1"-1)

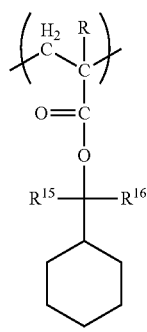

(a1"-2)

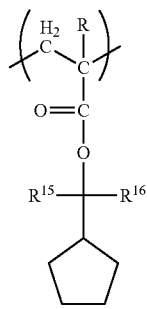

(a1"-3)

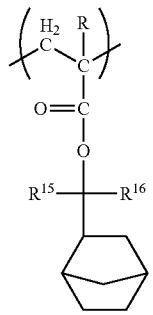

(a1"-4)

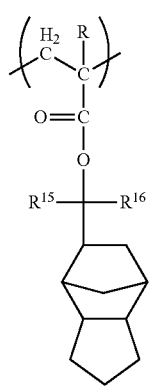

(a1"-5)

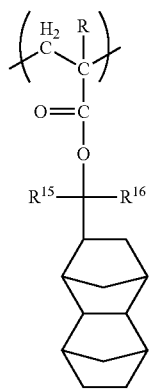

(a1"-6)

In the formulas, R represents a hydrogen atom, a lower alkyl group or a halogenated lower alkyl group; and $R^{15}$ and $R^{16}$ each independently represent an alkyl group (which may be linear or branched, and preferably has 1 to 5 carbon atoms).

In general formulas (a1"-1) to (a1"-6) above, the lower alkyl group or halogenated lower alkyl group for R are the same as the lower alkyl group or halogenated lower alkyl group which can be bonded to the α-position of the aforementioned acrylate ester.

An "acetal-type acid dissociable, dissolution inhibiting group" generally substitutes a hydrogen atom at the terminal of an alkali-soluble group such as a carboxy group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 42]

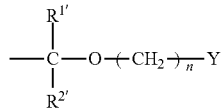

(p1)

In the formula, $R^{1\prime}$ and $R^{2\prime}$ each independently represent a hydrogen atom or a lower alkyl group; n represents an integer of 0 to 3; and Y represents a lower alkyl group or an aliphatic cyclic group.

In general formula (p1) above, n is preferably an integer of 0 to 2, more preferably 0 or 1, and most preferably 0.

As the lower alkyl group for $R^{1\prime}$ and $R^{2\prime}$, the same lower alkyl groups as those described above for R can be used, although a methyl group or ethyl group is preferable, and a methyl group is particularly desirable.

In the present invention, it is preferable that at least one of $R^{1\prime}$ and $R^{2\prime}$ be a hydrogen atom. That is, it is preferable that the acid dissociable, dissolution inhibiting group (p1) is a group represented by general formula (p1-1) shown below.

[Chemical Formula 43]

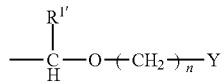

(p1-1)

In the formula, $R^{1\prime}$, n and Y are the same as defined above.

As the lower alkyl group for Y, the same as the lower alkyl groups for R above can be used.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be used.

Further, as the acetal-type, acid dissociable, dissolution inhibiting group, groups represented by general formula (p2) shown below can also be used.

[Chemical Formula 44]

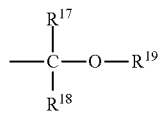

(p2)

In the formula, $R^{17}$ and $R^{18}$ each independently represent a linear or branched alkyl group or a hydrogen atom; and $R^{19}$ represents a linear, branched or cyclic alkyl group; or $R^{17}$ and $R^{19}$ each independently represents a linear or branched alkylene group, and the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable. It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4 to 7-membered ring, and more preferably a 4 to 6-membered ring. Specific examples of the cyclic group include tetrahydropyranyl group and tetrahydrofuranyl group.

As the structural unit (a1), it is preferable to use at least one member selected from the group consisting of structural units represented by formula (a1-0-1) shown below and structural units represented by formula (a1-0-2) shown below.

[Chemical Formula 45]

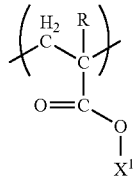

(a1-0-1)

In the formula, R represents a hydrogen atom, a lower alkyl group or a halogenated lower alkyl group; and $X^1$ represents an acid dissociable, dissolution inhibiting group.

[Chemical Formula 46]

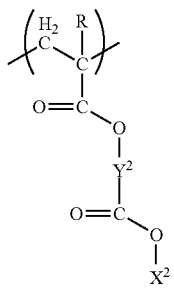

(a1-0-2)

In the formula, R represents a hydrogen atom, a lower alkyl group or a halogenated lower alkyl group; $X^2$ represents an acid dissociable, dissolution inhibiting group; and $Y^2$ represents a divalent linking group.

In general formula (a1-0-1) shown above, lower alkyl group and halogenated lower alkyl group for R are the same as the lower alkyl group and halogenated lower alkyl group which can be bonded to the α-position of the aforementioned acrylate ester.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is the same as defined above.

$X^2$ is the same as defined for $X^1$ in general formula (a1-0-1).

As the divalent linkage group for $Y^2$, an alkylene group, a divalent aliphatic cyclic group, a divalent linkage group containing a hetero atom, or a combination of these groups can be used.

As the aliphatic cyclic group, the same as those used above in connection with the explanation of "aliphatic cyclic group" can be used, except that two hydrogen atoms have been removed therefrom.

When $Y^2$ represents an alkylene group, it preferably has 1 to 10 carbon atoms, more preferably 1 to 6, still more preferably 1 to 4, and most preferably 1 to 3.

When $Y^2$ represents a divalent aliphatic cyclic group, it is particularly desirable that the divalent aliphatic cyclic group be a group in which two or more hydrogen atoms have been removed from cyclopentane, cyclohexane, norbornane, isobornane, adamantane, tricyclodecane or tetracyclododecane.

When $Y^2$ represents a divalent linking group containing a hetero atom, for example, —O—, —C(=O)—O—, —C(=O)—, —O—C(=O)—O—, —C(=O)—NH—, —NH—, —NR$^{04}$— (wherein R$^{04}$ represents an alkyl group, an acyl group or the like), —NH—C(=O)—, =N—, —S—, —S(=O)$_2$—, —S(=O)$_2$—O—, or -A-O-B- (wherein each of A and B independently represents a divalent hydrocarbon group which may have a substituent, and O is an oxygen atom) can be used.

In the group —NR$^{04}$ for —NR$^{04}$—, R$^{04}$ preferably has 1 to 10 carbon atoms, more preferably 1 to 8 carbon atoms, and most preferably 1 to 5 carbon atoms.

When $Y^2$ is "A-O-B", each of A and B independently represents a divalent hydrocarbon group which may have a substituent. A hydrocarbon "has a substituent" means that part or all of the hydrogen atoms within the hydrocarbon group is substituted with groups or atoms other than hydrogen atom.

The hydrocarbon group for A may be either an aliphatic hydrocarbon group, or an aromatic hydrocarbon group. An "aliphatic hydrocarbon group" refers to a hydrocarbon group that has no aromaticity.

The aliphatic hydrocarbon group for A may be either saturated or unsaturated. In general, the aliphatic hydrocarbon group is preferably saturated.

As specific examples of the aliphatic hydrocarbon group for A, a linear or branched aliphatic hydrocarbon group, and an aliphatic hydrocarbon group having a ring in the structure thereof can be given.

The linear or branched aliphatic hydrocarbon group preferably has 1 to 10 carbon atoms, more preferably 1 to 8, still more preferably 2 to 5, and most preferably 2.

As a linear aliphatic hydrocarbon group, a linear alkylene group is preferable, and specific examples include a methylene group, an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, a branched alkylene group is preferable, and specific examples include alkylalkylene groups, e.g., alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; alkyltrimethylene groups such as —CH(CH$_3$)CH$_2$CH$_2$— and —CH$_2$CH(CH$_3$)CH$_2$—; and alkyltetramethylene groups such as —CH(CH$_3$)CH$_2$CH$_2$CH$_2$— and —CH$_2$CH(CH$_3$)CH$_2$CH$_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of substituents include a fluorine atom, a fluorinated lower alkyl group of 1 to 5 carbon atoms, and an oxygen atom (=O).

As examples of the hydrocarbon group containing a ring in the structure thereof, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of substituents include a lower alkyl group of 1 to 5 carbon atoms, a fluorine atom, a fluorinated lower alkyl group of 1 to 5 carbon atoms, and an oxygen atom (=O).

As A, a linear aliphatic hydrocarbon group is preferable, more preferably a linear alkylene group, still more preferably a linear alkylene group of 2 to 5 carbon atoms, and most preferably a methylene group or an ethylene group.

As the hydrocarbon group for B, the same divalent hydrocarbon groups as those described above for A can be used.

As B, a linear or branched aliphatic hydrocarbon group is preferable, and a methylene group or an alkylmethylene group is particularly desirable.

The alkyl group within the alkyl methylene group is preferably a linear alkyl group of 1 to 5 carbon atoms, more preferably a linear alkyl group of 1 to 3 carbon atoms, and most preferably a methyl group.

As the divalent linking group for $Y^2$, an alkylene group, a divalent aliphatic cyclic group or a divalent linking group containing an alkylene group and hetero atom are more preferable, and a divalent linking group containing an alkylene group and hetero atom is particularly desirable.

Specific examples of the structural unit (a1) include structural units represented by general formulas (a1-1) to (a1-4) shown below.

[Chemical Formula 47]

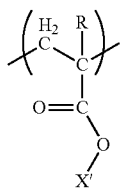
(a1-1)

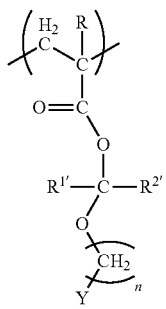
(a1-2)

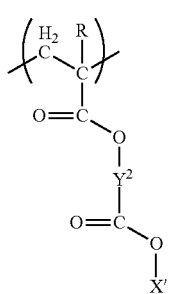
(a1-3)

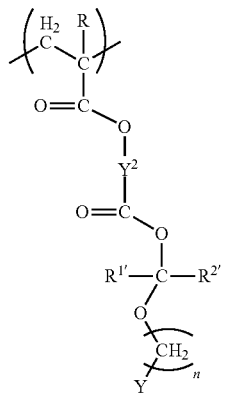
(a1-4)

In the formulas, X' represents a tertiary alkyl ester-type acid dissociable, dissolution inhibiting group; Y represents a lower alkyl group of 1 to 5 carbon atoms or an aliphatic cyclic group; n represents an integer of 0 to 3; $Y^2$ represents a divalent linking group; R is the same as defined above; and each of $R^{1\prime}$ and $R^{2\prime}$ independently represents a hydrogen atom or a lower alkyl group of 1 to 5 carbon atoms.

Examples of the tertiary alkyl ester-type acid dissociable, dissolution inhibiting group for X' include the same tertiary alkyl ester-type acid dissociable, dissolution inhibiting groups as those described above for $X^1$.

As $R^{1\prime}$, $R^{2\prime}$, n and Y are respectively the same as defined for $R^{1\prime}$, $R^{2\prime}$, n and Y in general formula (p1) described above in connection with the "acetal-type acid dissociable, dissolution inhibiting group".

$Y^2$ is the same as defined for $Y^2$ in general formula (a1-0-2).

Specific examples of structural units represented by general formula (a1-1) to (a1-4) are shown below.

[Chemical Formula 48]

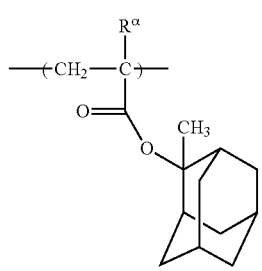
(a1-1-1)

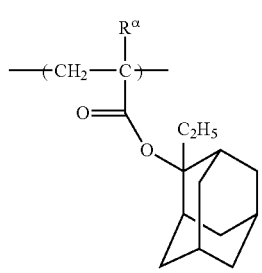
(a1-1-2)

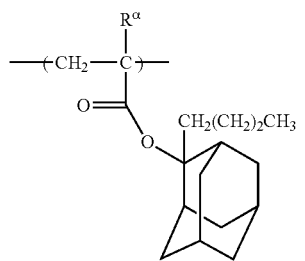 (a1-1-3)
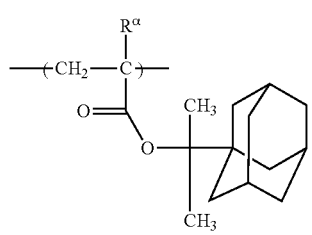 (a1-1-4)
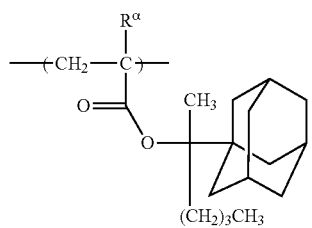 (a1-1-5)
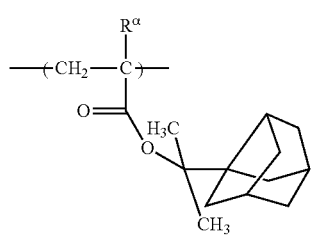 (a1-1-6)
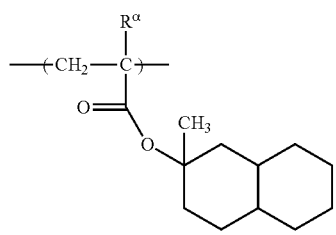 (a1-1-7)
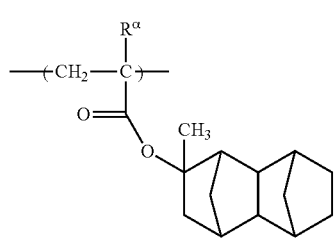 (a1-1-8)
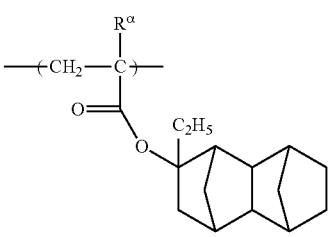 (a1-1-9)
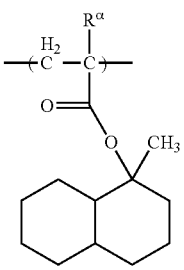 (a1-1-10)
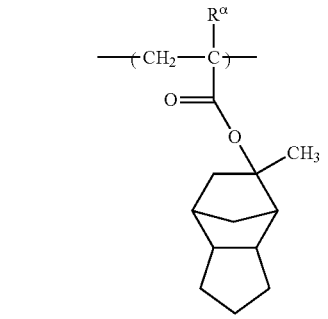 (a1-1-11)
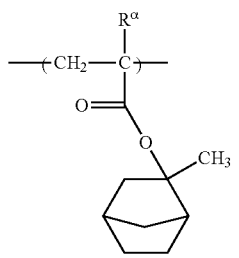 (a1-1-12)
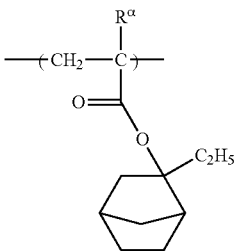 (a1-1-13)
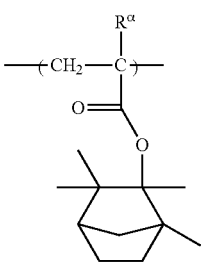 (a1-1-14)

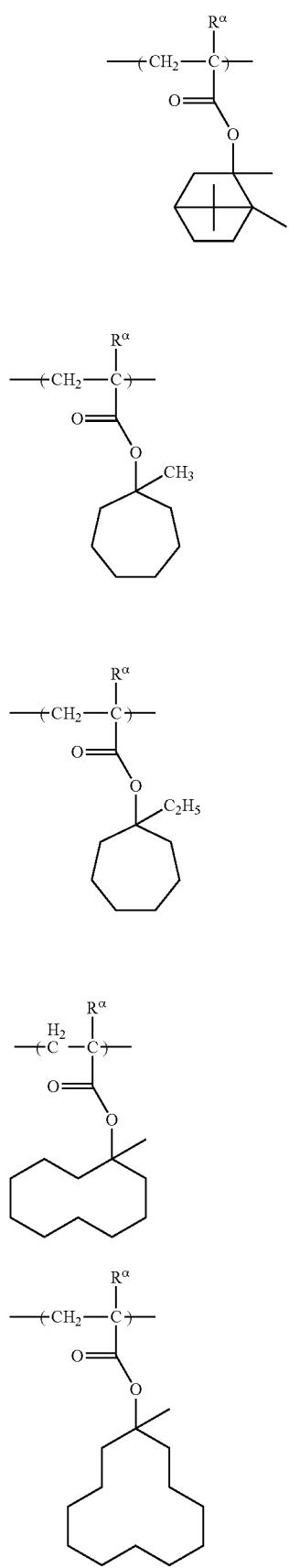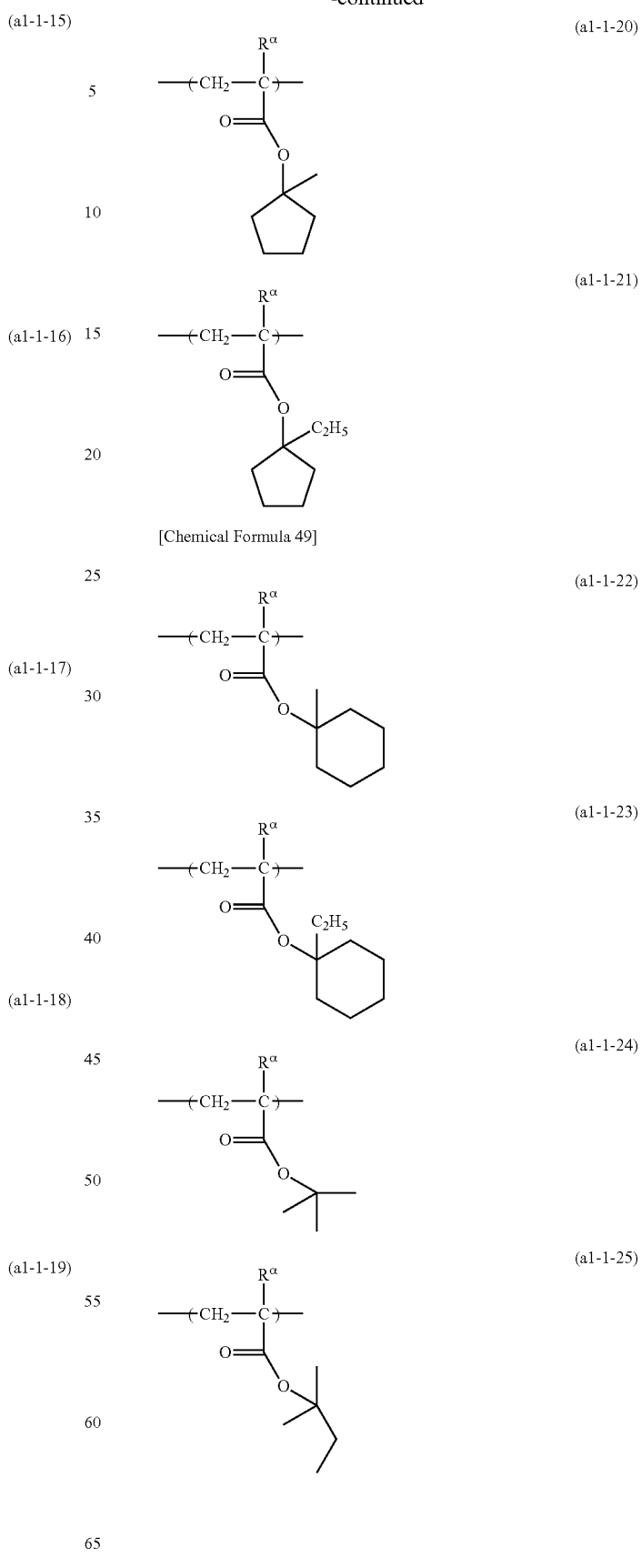

-continued
(a1-1-26)
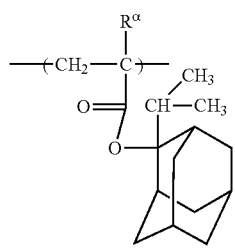
(a1-1-27)
(a1-1-28)
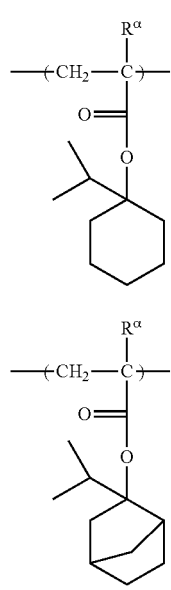
(a1-1-29)
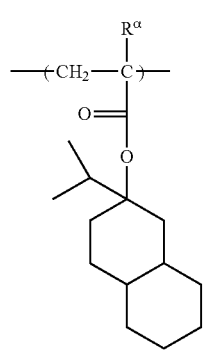
(a1-1-30)
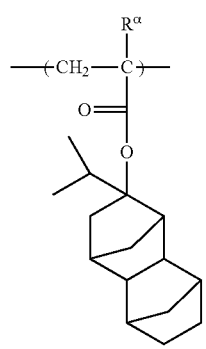
-continued
(a1-1-31)
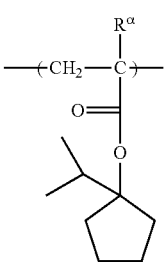
[Chemical Formula 50]
(a1-2-1)
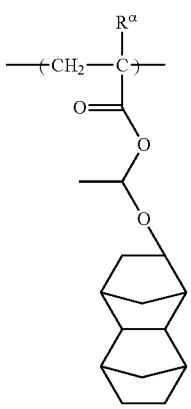
(a1-2-2)
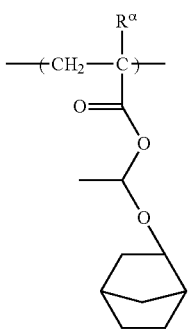
(a1-2-3)
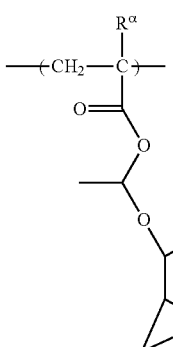

-continued
(a1-2-4)
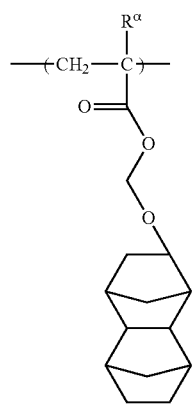
(a1-2-5)
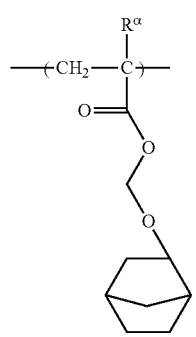
(a1-2-6)
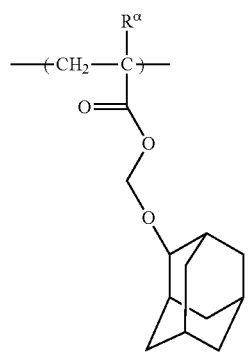
(a1-2-7)
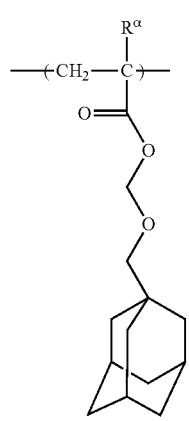
(a1-2-8)
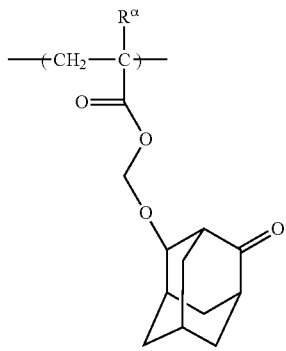
(a1-2-9)
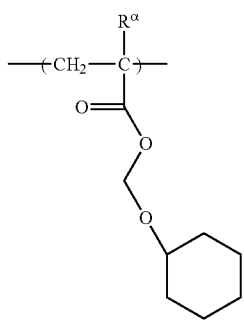
(a1-2-10)
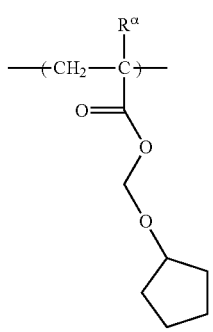
(a1-2-11)
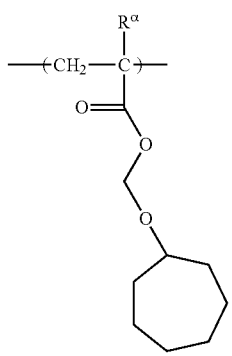

(a1-2-12) 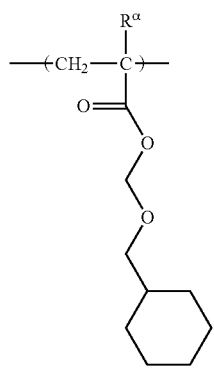
(a1-2-13) 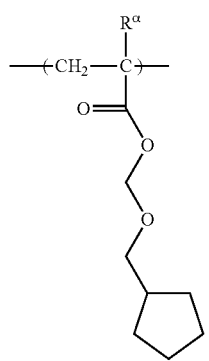
(a1-2-14) 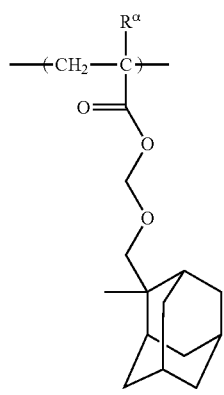
(a1-2-15) 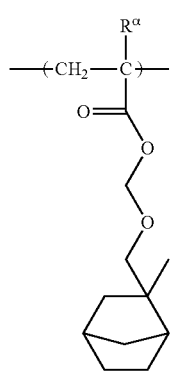
(a1-2-16) 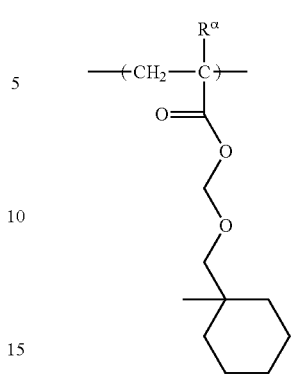
(a1-2-17) 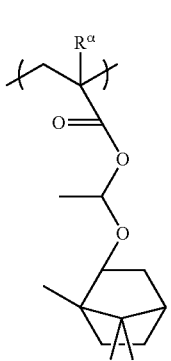
(a1-2-18) 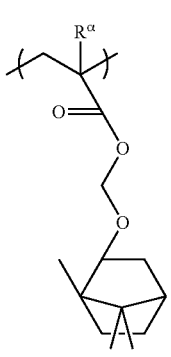
(a1-2-19) 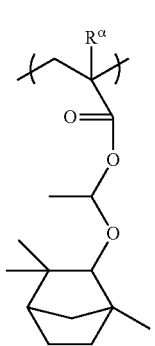

-continued
(a1-2-20)
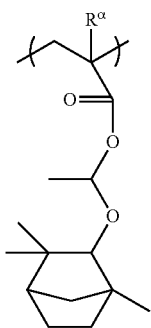
(a1-2-21)
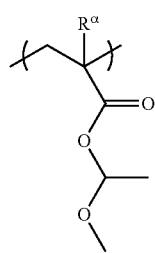
(a1-2-22)
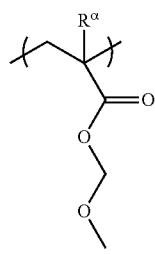
(a1-2-23)
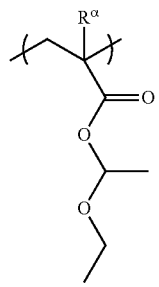
(a1-2-24)
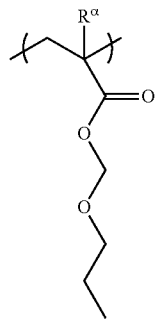
-continued
[Chemical Formula 51]
(a1-3-1)
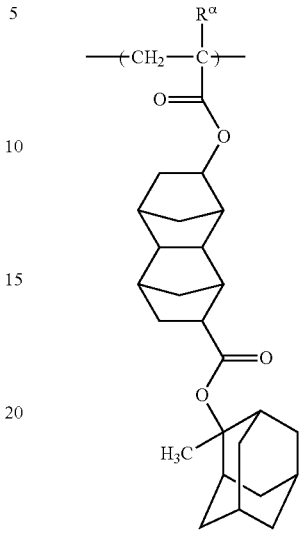
(a1-3-2)
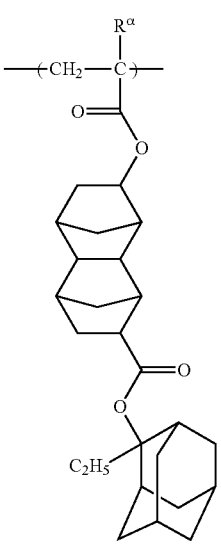
(a1-3-3)
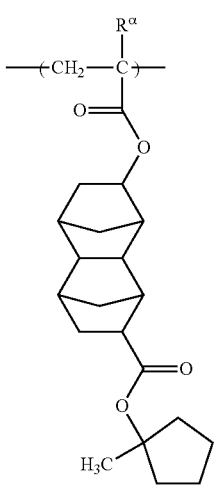

(a1-3-4)
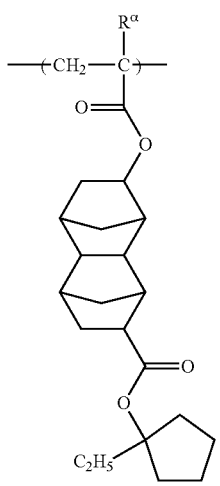
(a1-3-5)
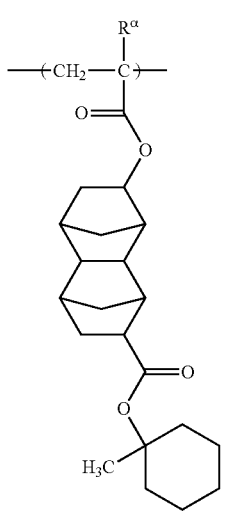
(a1-3-6)
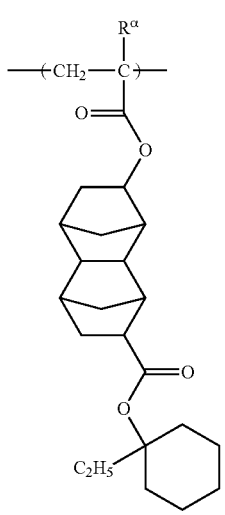
(a1-3-7)
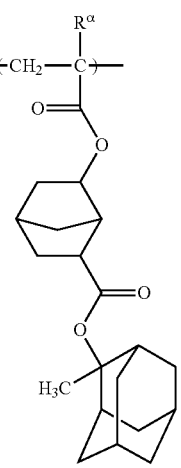
(a1-3-8)
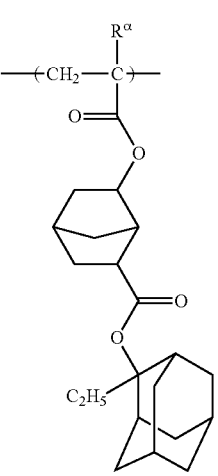
(a1-3-9)
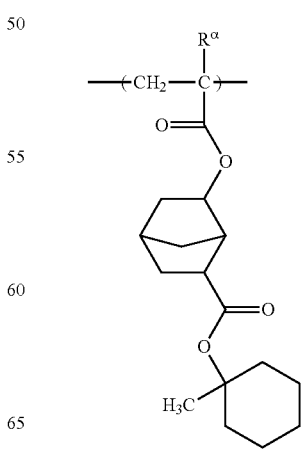

(a1-3-10)
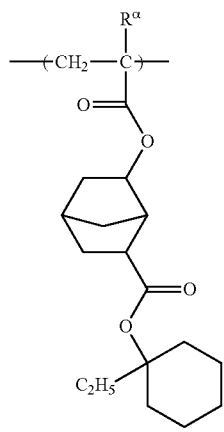
(a1-3-11)
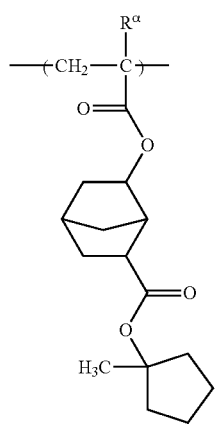
(a1-3-12)
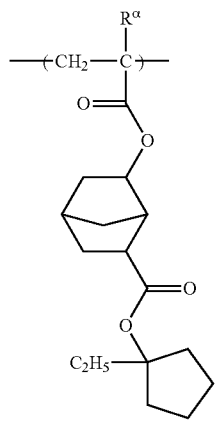
(a1-3-13)
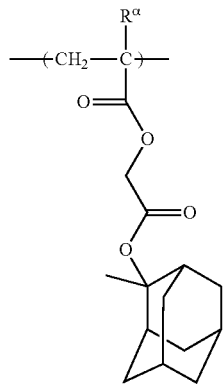
(a1-3-14)
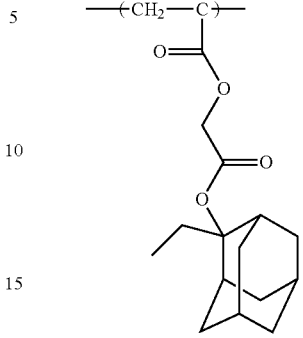
(a1-3-15)
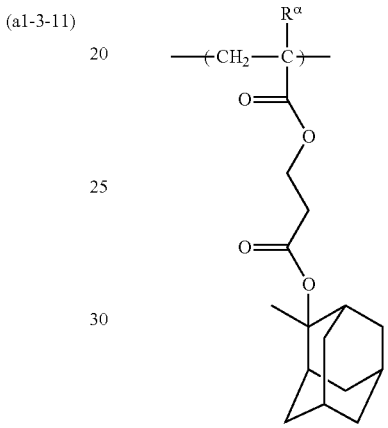
(a1-3-16)
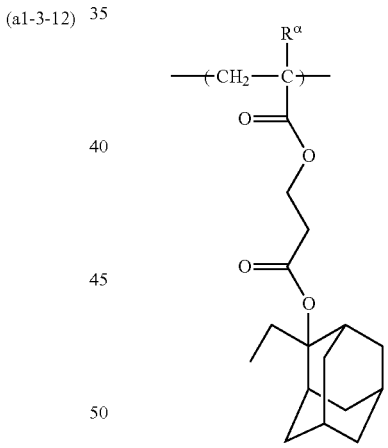
(a1-3-17)
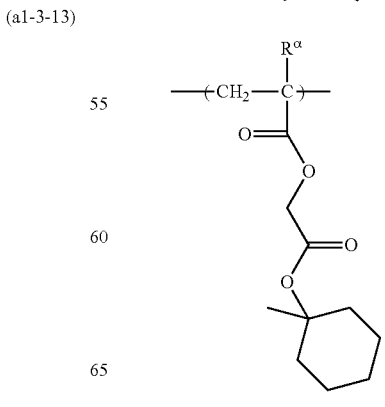

(a1-3-18)
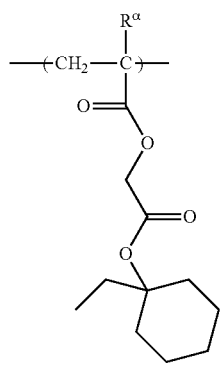
[Chemical Formula 52]
(a1-3-19)
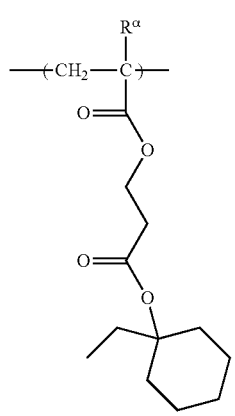
(a1-3-20)
(a1-3-21)
(a1-3-22)
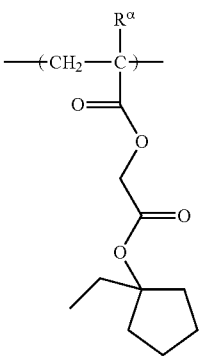
(a1-3-23)
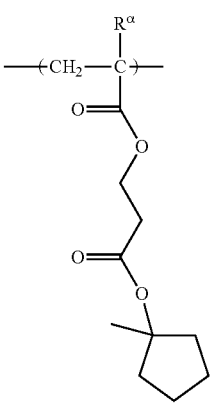
(a1-3-24)
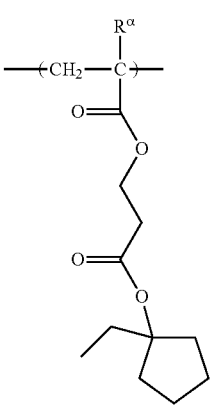

[Chemical Formula 53]
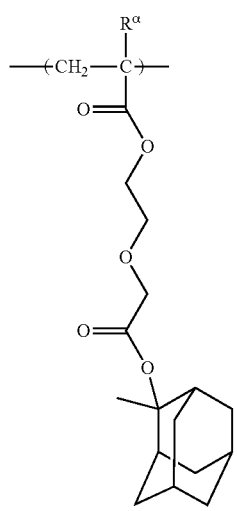
(a1-3-25)
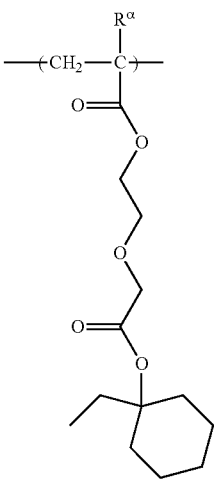
(a1-3-26)
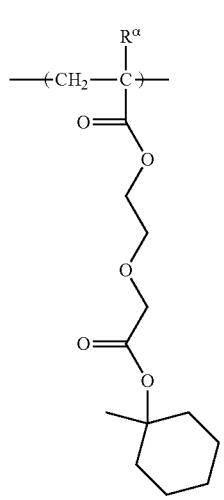
(a1-3-27)
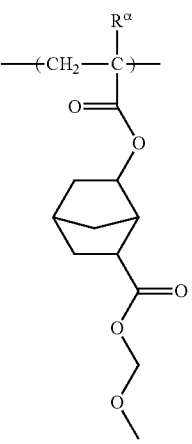
(a1-3-28)
[Chemical Formula 54]
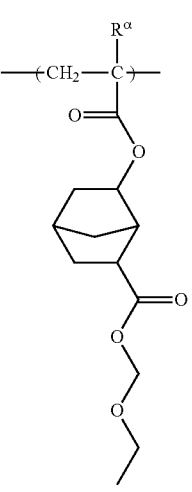
(a1-4-1)
(a1-4-2)

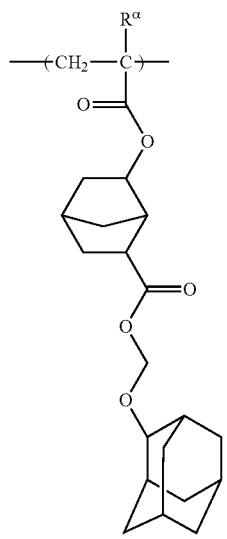 (a1-4-3)
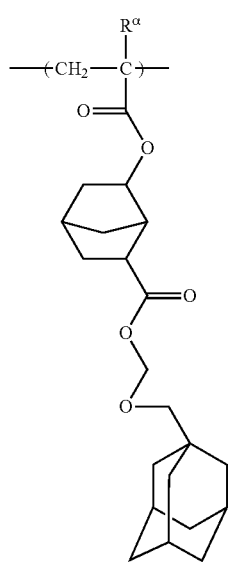 (a1-4-4)
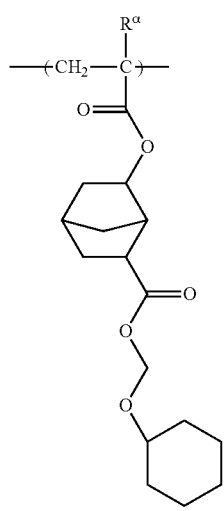 (a1-4-5)
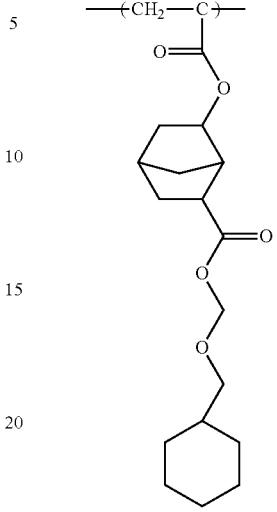 (a1-4-6)
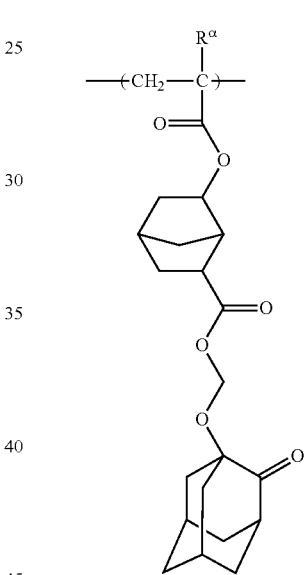 (a1-4-7)
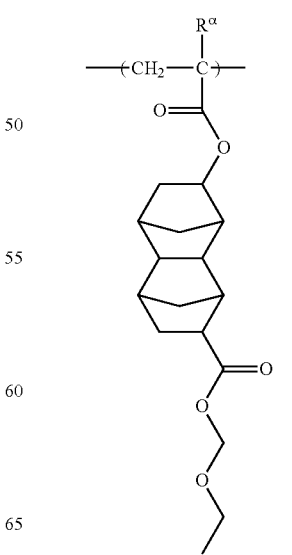 (a1-4-8)

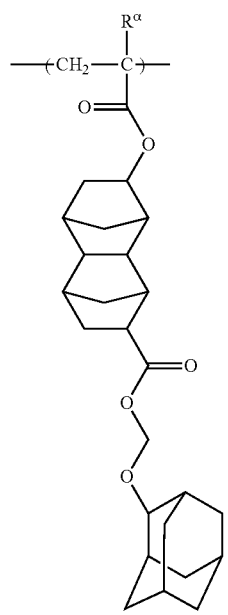 (a1-4-9)
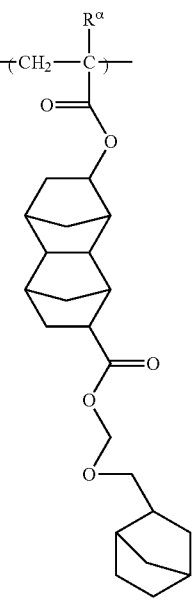 (a1-4-11)
(a1-4-10)
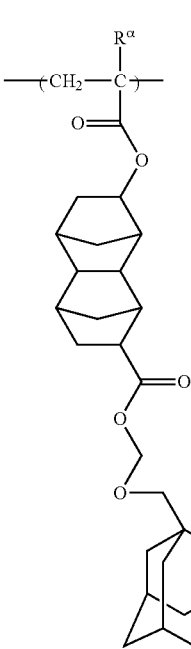 (a1-4-12)

(a1-4-13)

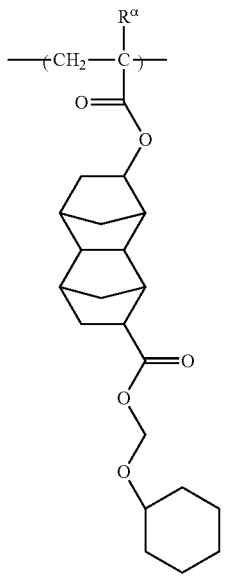

(a1-4-14)

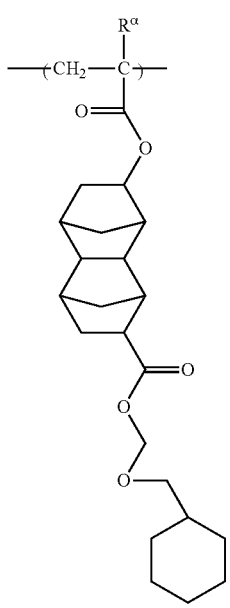

(a1-4-15)

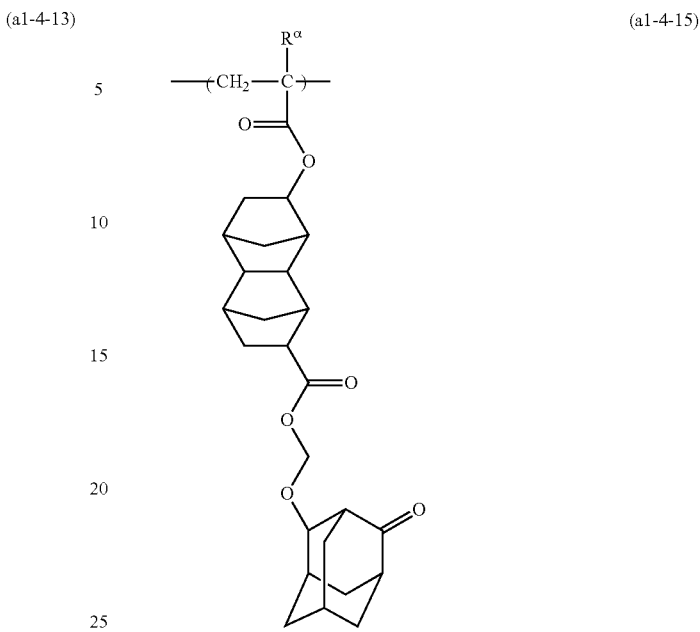

In the formulas shown above, $R^\alpha$ represents a hydrogen atom, a methyl group or a trifluoromethyl group.

As the structural unit (a1), one type of structural unit may be used alone, or two or more types of structural units may be used in combination.

Among these, structural units represented by general formula (a1-1) or (a1-3) are preferable. More specifically, at least one structural unit selected from the group consisting of structural units represented by formulas (a1-1-1) to (a1-1-4), (a1-1-20) to (a1-1-23) and (a1-3-25) to (a1-3-28) is more preferable.

Further, as the structural unit (a1), structural units represented by general formula (a1-1-01) shown below which includes the structural units represented by formulas (a1-1-1) to (a1-1-3), structural units represented by general formula (a1-1-02) shown below which includes the structural units represented by formulas (a1-1-16), (a1-1-17) and (a1-1-20) to (a1-1-23), structural units represented by general formula (a1-3-01) shown below which include the structural units represented by formulas (a1-3-25) and (a1-3-26), and structural units represented by general formula (a1-3-02) shown below which include the structural units represented by formulas (a1-3-27) and (a1-3-28) are also preferable.

[Chemical Formula 55]

(a1-1-01)

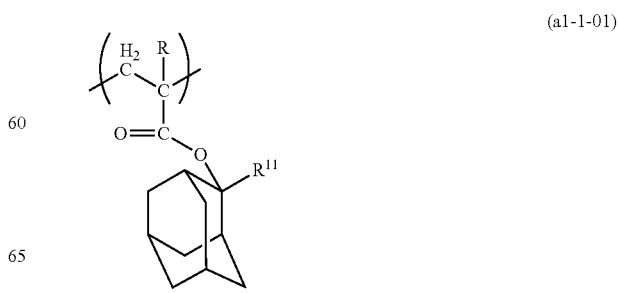

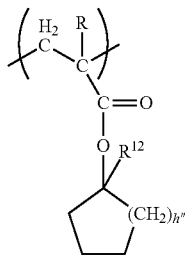
(a1-1-02)

In general formula (a1-1-01), R represents a hydrogen atom, a lower alkyl group or a halogenated lower alkyl group; and $R^{11}$ represents a lower alkyl group. In general formula (a1-1-02), R is the same as defined above; $R^{12}$ represents a lower alkyl group; and h" represents an integer of 1 to 6.

In general formula (a1-1-01), R is the same as defined above. The lower alkyl group for $R^{11}$ is the same as the lower alkyl group for R above. $R^{12}$ is preferably a methyl group or an ethyl group, and most preferably an ethyl group.

In general formula (a1-1-02), R is the same as defined above. The lower alkyl group for $R^{12}$ is the same as the lower alkyl group for R above. $R^{12}$ is preferably a methyl group or an ethyl group, and most preferably an ethyl group. h" is preferably 1 or 2, and most preferably 2.

[Chemical Formula 56]

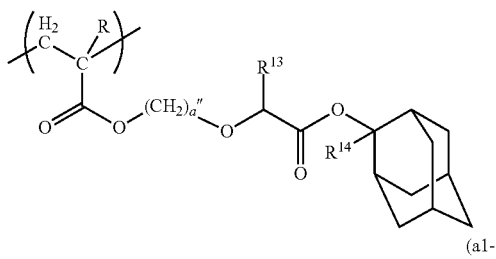
(a1-3-01)

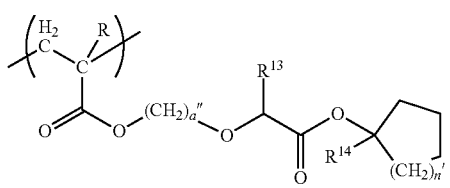
(a1-3-02)

In formula (a1-3-01), R represents a hydrogen atom, a lower alkyl group or a halogenated lower alkyl group; $R^{14}$ represents a lower alkyl group; $R^{13}$ represents a hydrogen atom or a methyl group; and a" represents an integer of 1 to 10. In formula (a1-3-02), R is the same as defined above; $R^{14}$ represents a lower alkyl group; $R^{13}$ represents a hydrogen atom or a methyl group; a" represents an integer of 1 to 10; and n' represents an integer of 1 to 6.

In general formulas (a1-3-01) and (a1-3-02), R is the same as defined above.

$R^{13}$ is preferably a hydrogen atom.

The lower alkyl group for $R^{14}$ is the same as the lower alkyl group for R, and is preferably a methyl group or an ethyl group.

a" is preferably an integer of 1 to 8, more preferably an integer of 2 to 5, and most preferably 2.

n' represents an integer of 1 to 6, and is preferably an integer of 1 to 4, and more preferably an integer of 1 or 2.

In the component (A1-1), the amount of the structural unit (a1) based on the combined total of all structural units constituting the component (A1-1) is preferably 10 to 80 mol %, more preferably 20 to 70 mol %, and still more preferably 25 to 50 mol %. When the amount of the structural unit (a1) is at least as large as the lower limit of the above-mentioned range, a pattern can be easily formed using a resist composition prepared from the component (A1). On the other hand, when the amount of the structural unit (a1) is no more than the upper limit of the above-mentioned range, a good balance can be achieved with the other structural units.

The monomers for deriving the structural units represented by general formulas (a1-3-01) and (a1-3-02) above (hereafter, these monomers are collectively referred to as "monomer W") can be produced by a production method shown below.

Production Method of Monomer W:

A compound represented by general formula (X-2) shown below is added to a compound represented by general formula (X-1) shown below dissolved in a reaction solvent, in the presence of a base, and a reaction is effected to obtain a compound represented by general formula (X-3) shown below (hereafter, referred to as "compound (X-3)"). Then, a compound represented by general formula (X-4) shown below is added to the resulting solution having the compound (X-3) dissolved therein, in the presence of a base, and a reaction is effected to thereby obtain a monomer W.

Examples of the base include inorganic bases such as sodium hydride, $K_2CO_3$ and $Cs_2CO_3$; and organic bases such as triethylamine, 4-dimethylaminopyridine (DMAP) and pyridine.

As the reaction solvent, any reaction solvent capable of dissolving the compounds (X-1) and (X-2) as raw materials can be used, and specific examples include tetrahydrofuran (THF), acetone, dimethylformamide (DMF), dimethylacetamide, dimethylsulfoxide (DMSO) and acetonitrile.

[Chemical Formula 57]

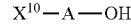
(X-1)

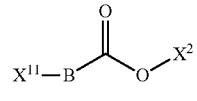
(X-2)

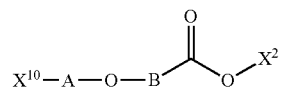
(X-3)

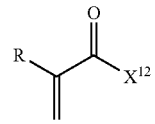
(X-4)

In the formulas, R represents a hydrogen atom, a lower alkyl group or a halogenated lower alkyl group; each of A and B independently represents a divalent hydrocarbon group which may have a substituent; $X^2$ represents an acid dissociable, dissolution inhibiting group; each of $X^{10}$ and $X^{12}$ independently represents a hydroxyl group or a halogen atom, with the provision that either one of $X^{10}$ and $X^{12}$ represents a hydroxyl group and the other represents a halogen atom; and $X^{11}$ represents a halogen atom.

In the formulas above, R, $X^2$, A and B are the same as defined above.

Examples of halogen atoms for $X^{10}$, $X^{11}$ and $X^{12}$ include a bromine atom, a chlorine atom, an iodine atom and a fluorine atom.

In terms of reactivity, the halogen atom for $X^{10}$ or $X^{12}$ is preferably a chlorine atom or a bromine atom.

As $X^{11}$, in terms of reactivity, a bromine atom or a chlorine atom is preferable, and a bromine atom is particularly desirable.

Structural Unit (a2)

The structural unit (a2) is a structural unit derived from an acrylate ester containing a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1-1) is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include groups in which one hydrogen atom has been removed from γ-butyrolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 58]

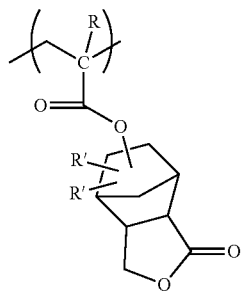
(a2-1)

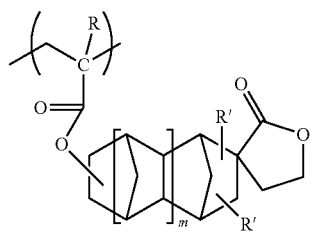
(a2-2)

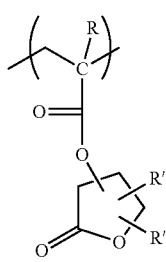
(a2-3)

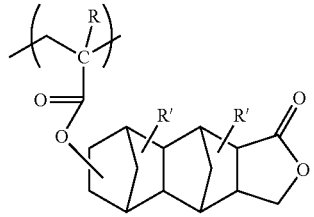
(a2-4)

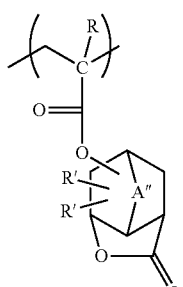
(a2-5)

In the formulas, R represents a hydrogen atom, a lower alkyl group or a halogenated lower alkyl group; R' represents a hydrogen atom, a lower alkyl group, an alkoxy group of 1 to 5 carbon atoms or —COOR", wherein R" represents a hydrogen atom or a linear, branched or cyclic alkyl group of 1 to 15 carbon atoms; m represents 0 or 1; and A" represents an oxygen atom, a sulfur atom, or an alkylene group of 1 to 5 carbon atoms which may contain an oxygen atom or a sulfur atom.

In general formulas (a2-1) to (a2-5), R is the same as defined for R in the structural unit (a1).

The lower alkyl group for R' is the same as the lower alkyl group for R in the structural unit (a1).

When R" is a linear or branched alkyl group, it preferably has 1 to 10 carbon atoms, more preferably 1 to 5 carbon atoms.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

In the structural units represented by general formulas (a2-1) to (a2-5), in consideration of industrial availability, R' is preferably a hydrogen atom.

Specific examples of alkylene groups of 1 to 5 carbon atoms for A" include a methylene group, an ethylene group, an n-propylene group, an isopropylene group, —O—CH$_2$—, —CH$_2$—O—CH$_2$—, —S—CH$_2$— and —CH$_2$—S—CH$_2$—.
Specific examples of structural units represented by general formulas (a2-1) to (a2-5) are shown below.
[Chemical Formula 59]
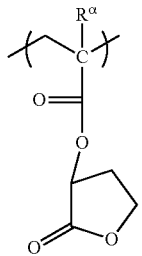
(a2-1-1)
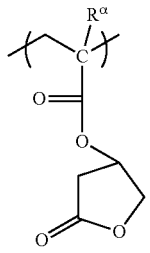
(a2-1-2)
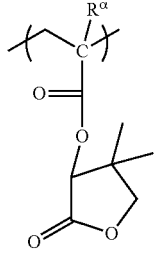
(a2-1-3)
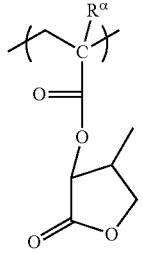
(a2-1-4)
[Chemical Formula 60]
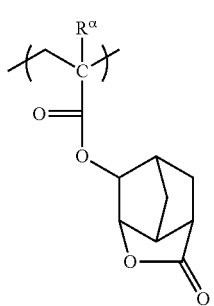
(a2-2-1)
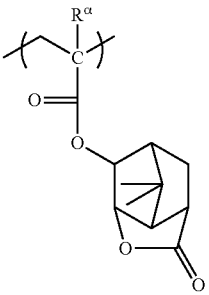
(a2-2-2)
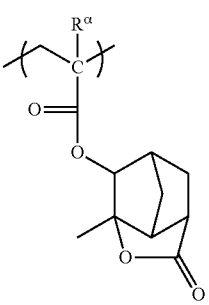
(a2-2-3)
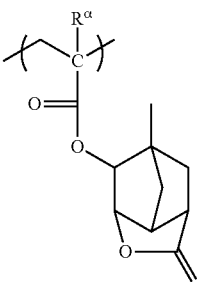
(a2-2-4)
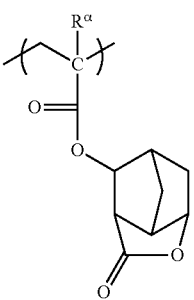
(a2-2-5)
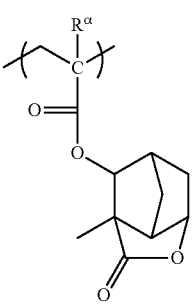
(a2-2-6)

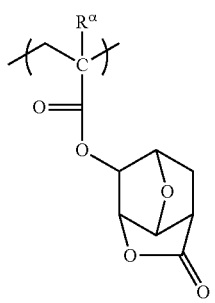 (a2-2-7)
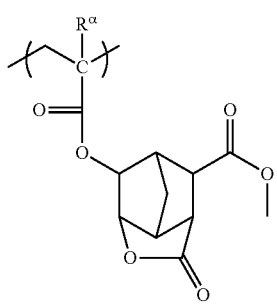 (a2-2-8)
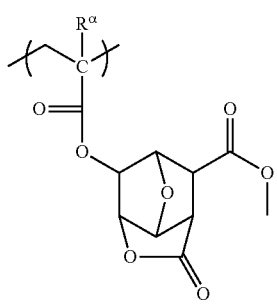 (a2-2-9)
[Chemical Formula 61]
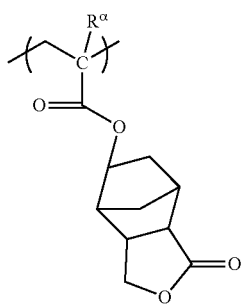 (a2-3-1)
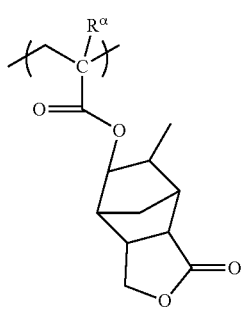 (a2-3-2)
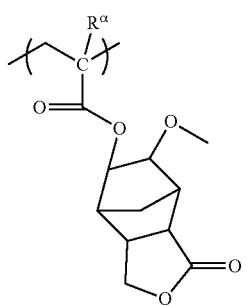 (a2-3-3)
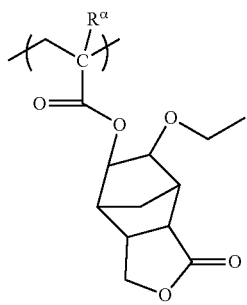 (a2-3-4)
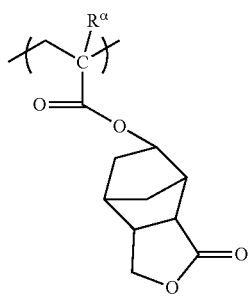 (a2-3-5)
[Chemical Formula 62]
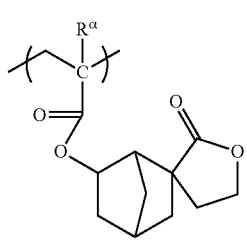 (a2-4-1)
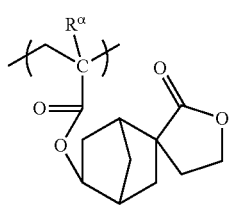 (a2-4-2)
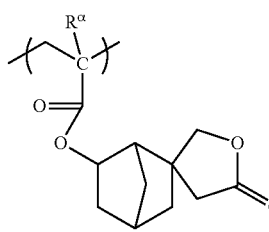 (a2-4-3)

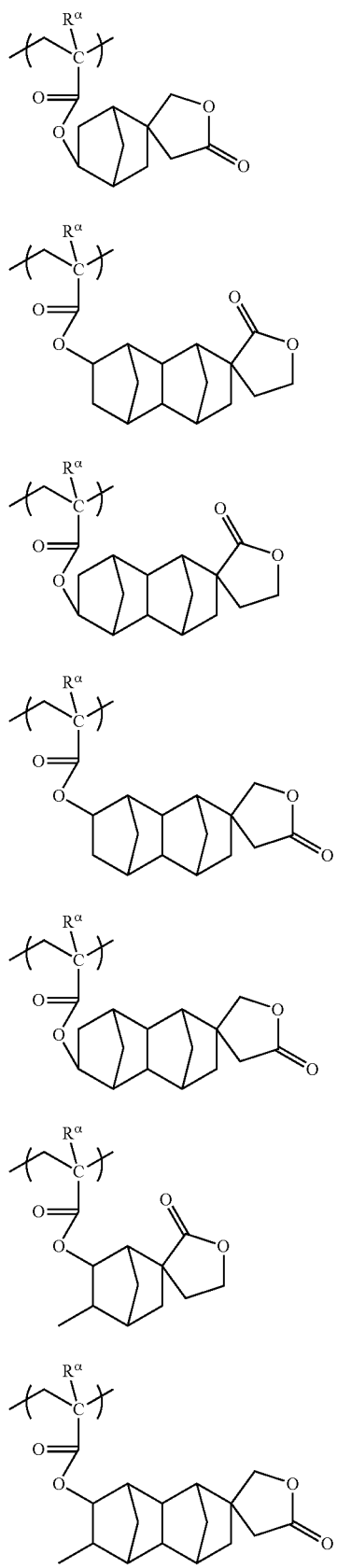

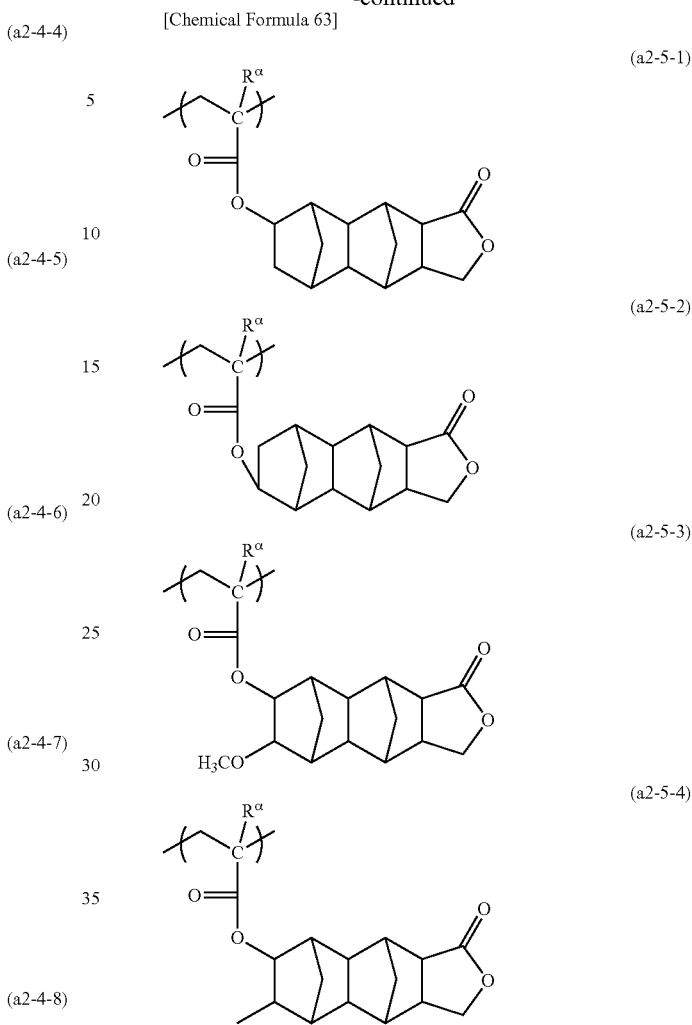

In the formulas shown above, $R^\alpha$ represents a hydrogen atom, a methyl group or a trifluoromethyl group.

In the component (A1-1), as the structural unit (a2), one type of structural unit may be used, or two or more types may be used in combination.

As the structural unit (a2), at least one structural unit selected from the group consisting of formulas (a2-1) to (a2-5) is preferable, and at least one structural unit selected from the group consisting of formulas (a2-1) to (a2-3) is more preferable. Of these, it is preferable to use at least one structural unit selected from the group consisting of structural units represented by formulas (a2-1-1), (a2-1-2), (a2-2-1), (a2-2-7), (a2-3-1) and (a2-3-5).

In the component (A1-1), the amount of the structural unit (a2) based on the combined total of all structural units constituting the component (A1-1) is preferably 5 to 60 mol %, more preferably 8 to 50 mol %, and still more preferably 10 to 50 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units.

Structural Unit (a3)

The structural unit (a3) is a structural unit represented by general formula (a3-1) shown below.

[Chemical Formula 64]

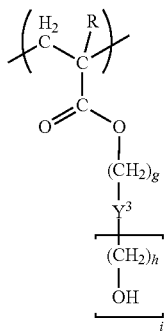

(a3-1)

In general formula (a3-1), R represents a hydrogen atom, a lower alkyl group of 1 to 5 carbon atoms or a halogenated lower alkyl group of 1 to 5 carbon atoms; $Y^3$ represents an alkylene group or an aliphatic cyclic group; each of g and h independently represents an integer of 0 to 3; and i represents an integer of 1 to 3.

In general formula (a3-1), R represents a hydrogen atom, a lower alkyl group of 1 to 5 carbon atoms or a halogenated lower alkyl group of 1 to 5 carbon atoms. R is the same as defined for R in the aforementioned structural unit (a1).

$Y^3$ represents an alkylene group or an aliphatic cyclic group.

As the alkylene group for $Y^3$, an alkylene group of 1 to 10 carbon atoms can be used.

As the aliphatic cyclic group for $Y^3$, the same groups as those described above for the aliphatic cyclic group for $Y^1$ in general formula (f3-1) can be mentioned. It is preferable that the structure of the basic ring (aliphatic ring) in $Y^3$ be the same as that in $Y^1$.

g represents an integer of 0 to 3, preferably 0 or 1, and more preferably 0.

h represents an integer of 0 to 3, preferably 0 or 1, and more preferably 0.

i represents an integer of 1 to 3, and is most preferably 1.

As the structural unit (a3), a structural unit represented by general formula (a3-1-1) shown below is preferable, and a structural unit in which one of the "i" groups of —(CH$_2$)$_h$—OH is bonded to the 3rd position of the 1-adamantyl group is particularly desirable.

[Chemical Formula 65]

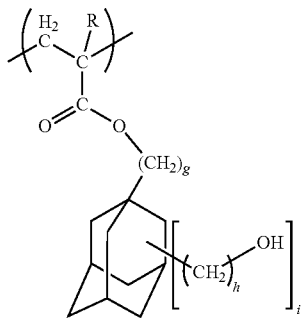

(a3-1-1)

In the formula, R, g, h and i are respectively the same as defined above.

As the structural unit (a3), one type of structural unit may be used, or two or more types may be used in combination.

The amount of the structural unit (a3) within the component (A1-1) based on the combined total of all structural units constituting the component (A1-1) is preferably 1 to 40 mol %, more preferably 1 to 35 mol %, still more preferably 5 to 30 mol %, and most preferably 5 to 25 mol %. When the amount of the structural unit (a3) is at least as large as the lower limit of the above-mentioned range, the rectangularity of the cross-sectional shape of the resist pattern is improved, and hence, a resist pattern having an excellent shape can be formed. On the other hand, when the amount of the structural unit (a3) is no more than the upper limit of the above-mentioned range, a good balance can be achieved with the other structural units.

Structural Unit (f3)

In the component (A1-1), the structural unit (f3) is the same as defined for the structural unit (f3) in the aforementioned component (F).

As the structural unit (f3), a structural unit represented by general formula (f3-1-1) is particularly desirable.

In the component (A1-1), as the structural unit (f3), one type of structural unit may be used alone, or two or more types of structural units may be used in combination.

The amount of the structural unit (f3) within the component (A1-1) based on the combined total of all structural units constituting the component (A1-1) is preferably 1 to 45 mol %, more preferably 5 to 45 mol %, still more preferably 5 to 40 mol %, and most preferably 5 to 35 mol %. When the amount of the structural unit (f3) is at least as large as the lower limit of the above-mentioned range, the solubility of the component (A1-1) in an organic solvent is improved. On the other hand, when the amount of the structural unit (f3) is no more than the upper limit of the above-mentioned range, a good balance can be achieved with the other structural units.

Other Structural Units

The component (A1-1) may also include a structural unit other than the above-mentioned structural units (a1) to (a3) and (f3), as long as the effects of the present invention are not impaired.

As such a structural unit, any other structural unit which cannot be classified as one of the above structural units (a1) to (a3) and (f3) can be used without any particular limitations, and any of the multitude of conventional structural units used within resist resins for ArF excimer lasers or KrF excimer lasers (and particularly for ArF excimer lasers) can be used.

As such a structural unit, for example, a structural unit derived from an acrylate ester containing a non-acid-dissociable aliphatic polycyclic group (hereafter, referred to as "structural unit (a4)") and a structural unit derived from an acrylate ester containing a polar group-containing aliphatic hydrocarbon group excluding the aforementioned structural unit (a3) and the aforementioned structural unit (f3) (hereafter, referred to as "structural unit (a5)").

Structural Unit (a4)

The structural unit (a4) is a structural unit derived from an acrylate ester containing a non-acid dissociable, aliphatic polycyclic group.

Examples of this polycyclic group include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 66]

(a4-1)
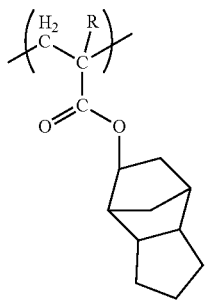

(a4-2)
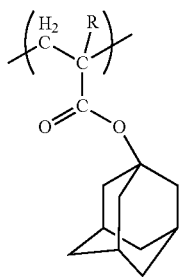

(a4-3)
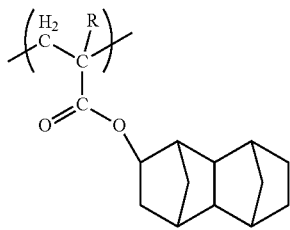

(a4-4)
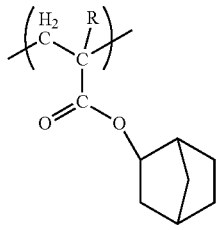

(a4-5)
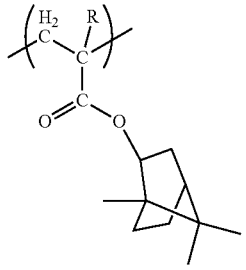

In the formulas, R is the same as defined above.

When the structural unit (a4) is included in the component (A1-1), the amount of the structural unit (a4) based on the combined total of all the structural units that constitute the component (A1-1) is preferably within the range from 1 to 30 mol %, and more preferably from 10 to 20 mol %.

Structural Unit (a5)

The structural unit (a5) is a structural unit derived from an acrylate ester containing a polar group-containing aliphatic hydrocarbon group (excluding the aforementioned structural unit (a3) and the aforementioned structural unit (f3)).

Examples of the structural unit (a5) include a structural unit represented by formula (f2-2) or (f2-3) which are described above in the explanation of the structural unit (f2) for the component (F).

When the structural unit (a5) is included in the component (A1-1), the amount of the structural unit (a4) based on the combined total of all the structural units that constitute the component (A1-1) is preferably within the range from 5 to 50 mol %, more preferably from 5 to 40 mol %, and still more preferably 5 to 25 mol %.

In the present invention, the component (A1-1) is preferably a resin component having the structural unit (a1).

Preferable examples of such resin components include a copolymer having the structural units (a1) and (a2); a copolymer having the structural units (a1) and (f3); a copolymer having the structural units (a1), (a2) and (f3); a copolymer having the structural units (a1) and (a3); a copolymer having the structural units (a1), (a2) and (a3); a copolymer having the structural units (a1), (f3) and (a3); and a copolymer having the structural units (a1), (a2), (f3) and (a3).

Examples of such copolymers include a copolymer consisting of the structural units (a1), (a2), (f3) and (a3); a copolymer consisting of the structural units (a1), (a2), (f3) and (a5); and a copolymer consisting of the structural units (a1), (13) and (a5).

In the present invention, as the component (A1-1), a polymeric compound that includes a combination of structural units such as that shown below (polymeric compound (A1-1-10) or (A1-1-20)) is particularly desirable.

[Chemical Formula 67]

(A1-1-10)
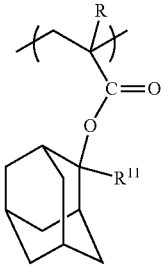

Polymeric compound
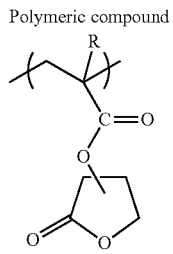 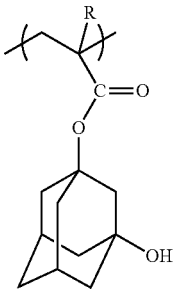

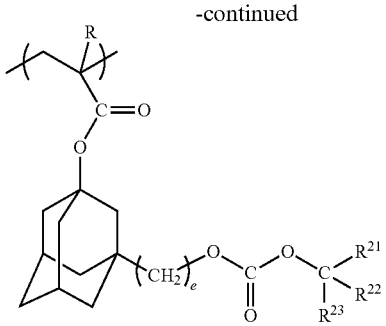

(A1-1-20)

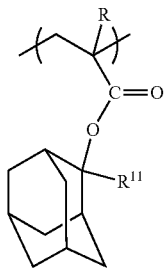

Polymeric compound

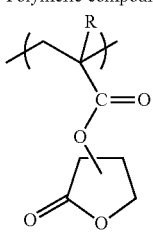 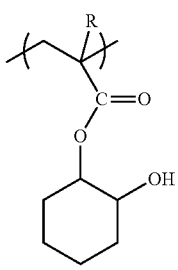

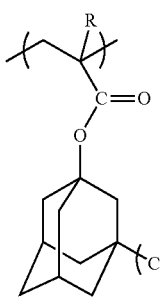

In the formulas, R is the same as defined above, and the plurality of R may the same or different from each other; $R^{11}$ is the same as defined for $R^{11}$ in formula (a1-1-01); $R^{21}$ to $R^{23}$ are the same as defined for $R^{21}$ to $R^{23}$ in formula (II); and e is the same as defined for e in formula (f3-1).

In the component (A1), as the component (A1-1), one type may be used alone, or two or more types may be combined for use as a mixed resin composition.

The component (A1-1) can be obtained, for example, by a conventional radical polymerization or the like of the monomers corresponding with each of the structural units, using a radical polymerization initiator such as azobisisobutyronitrile (AIBN).

Furthermore, in the component (A1-1), by using a chain transfer agent such as HS—$CH_2$—$CH_2$—$CH_2$—$C(CF_3)_2$—OH, a —$C(CF_3)_2$—OH group can be introduced at the terminals of the component (A1-1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

The weight average molecular weight (Mw) (the polystyrene equivalent value determined by gel permeation chromatography) of the component (A1-1) is not particularly limited, but is preferably 2,000 to 50,000, more preferably 3,000 to 30,000, and most preferably 5,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

Low Molecular Weight Material (A1-2)

As the component (A1-2), it is preferable to use a compound that has a molecular weight of at least 500 and less than 2,000, contains a hydrophilic group, and also contains an acid dissociable, dissolution inhibiting group described above in connection with the component (A1-1). Specific examples include compounds containing a plurality of phenol skeletons in which a part of the hydrogen atoms within hydroxyl groups have been substituted with the aforementioned acid dissociable, dissolution inhibiting groups.

Examples of the component (A1-2) include low molecular weight phenolic compounds in which a portion of the hydroxyl group hydrogen atoms have been substituted with an aforementioned acid dissociable, dissolution inhibiting group, and these types of compounds are known, for example, as sensitizers or heat resistance improvers for use in non-chemically amplified g-line or i-line resists.

Examples of these low molecular weight phenol compounds include
bis(4-hydroxyphenyl)methane, bis(2,3,4-trihydroxyphenyl)methane,
2-(4-hydroxyphenyl)-2-(4'-hydroxyphenyl)propane,
2-(2,3,4-trihydroxyphenyl)-2-(2',3',4'-trihydroxyphenyl)propane,
tris(4-hydroxyphenyl)methane,
bis(4-hydroxy-3,5-dimethylphenyl)-2-hydroxyphenyl-methane,
bis(4-hydroxy-2,5-dimethylphenyl)-2-hydroxyphenyl-methane,
bis(4-hydroxy-3,5-dimethylphenyl)-3,4-dihydroxyphenyl-methane,
bis(4-hydroxy-2,5-dimethylphenyl)-3,4-dihydroxyphenyl-methane,
bis(4-hydroxy-3-methylphenyl)-3,4-dihydroxyphenyl-methane,
bis(3-cyclohexyl-4-hydroxy-6-methylphenyl)-4-hydroxyphenylmethane,
bis(3-cyclohexyl-4-hydroxy-6-methylphenyl)-3,4-dihydroxyphenylmethane,
1-[1-(4-hydroxyphenyl)isopropyl]-4-[1,1-bis(4-hydroxyphenyl)ethyl]benzene, and dimers, trimers and tetramers of formalin condensation products of phenols such as phenol, m-cresol, p-cresol and xylenol. Needless to say, the low molecular weight phenol compound is not limited to these examples.

Also, there are no particular limitations on the acid dissociable, dissolution inhibiting group, and suitable examples include the groups described above.

In the component (A1), as the component (A1-2), one type may be used alone, or two or more types may be used in combination.

In the resist composition for immersion exposure according to the present invention, as the component (A1), one type may be used, or two or more types of compounds may be used in combination.

In the resist composition for immersion exposure according to the present invention, the amount of the component (A1) can be appropriately adjusted depending on the thickness of the resist film to be formed, and the like.

[Component (A2)]

When the resist composition for immersion exposure according to the present invention is a negative resist composition, as the component (A), a base component (A2) which is soluble in an alkali developing solution (hereafter, referred to as "component (A2)") is preferable.

In such a negative resist composition, the component (A2) is used, and it is preferable to further include a cross-linking agent (C) (hereafter, referred to as "component (C)").

In the negative resist composition, when acid is generated from the component (B) upon exposure, the action of the generated acid causes cross-linking between the component (A2) and the component (C), and the cross-linked portion becomes insoluble in an alkali developing solution. Therefore, in the formation of a resist pattern, by conducting selective exposure of a resist film formed by applying the negative resist composition onto a substrate, the exposed portions become insoluble in an alkali developing solution, whereas the unexposed portions remain soluble in an alkali developing solution, and hence, a resist pattern can be formed by alkali developing.

When the resist composition for immersion exposure according to the present invention is a negative resist composition, it is preferable that the component (A2) include a resin component soluble in an alkali developing solution (hereafter, referred to as "alkali-soluble resin component (A2-1)").

Component (A2-1)

The alkali-soluble resin component (A2-1) (hereafter, referred to as "component (A2-1)") may contain an alkali-soluble resin having a fluorinated hydroxyalkyl group such as that represented by general formula (a1-1-1) described later.

As a specific example of a preferable alkali-soluble resin having a fluorinated hydroxyalkyl group, a polymeric compound (A2-1-10) (hereafter, referred to as "component (A2-1-10)") containing a structural unit (a1') that contains, within the main chain, an aliphatic cyclic group having a fluorinated hydroxyalkyl group, and preferably also containing a structural unit (a2') having a hydroxyalkyl group, can be given.

Further, another example of a preferable alkali-soluble resin having a fluorinated hydroxyalkyl group includes a polymeric compound (A2-1-20) (hereafter, referred to as "component (A2-1-20)") containing a structural unit (a1") that contains an aliphatic cyclic group having a fluorinated hydroxyalkyl group, and preferably also containing a structural unit (a2") derived from an acrylate ester containing a hydroxyl group-containing aliphatic cyclic group, and/or a structural unit (a3") derived from an acrylic acid that has no cyclic structure and has an alcoholic hydroxyl group on a side chain.

Polymeric Compound (A2-1-10)

The component (A2-1-10) includes a structural unit (a1') that contains, within the main chain, an aliphatic cyclic group having a fluorinated hydroxyalkyl group.

Further, the component (A2-1-10) preferably also includes, in addition to the structural unit (a1'), a structural unit (a2') having a hydroxyalkyl group (hereafter, simply abbreviated as "structural unit (a2')").

Structural Unit (a1')

The component (A2-1-10) includes a structural unit (a1') that contains, within the main chain, an aliphatic cyclic group having a fluorinated hydroxyalkyl group.

In the structural unit (a1'), the "aliphatic cyclic group having a fluorinated hydroxyalkyl group" refers to a group in which a fluorinated hydroxyalkyl group is bonded to a carbon atom that constitutes part of a ring of an aliphatic cyclic group.

Furthermore, the description of the aliphatic cyclic group as being "within the main chain" means that at least one, and preferably two or more carbon atoms within the ring structure of the aliphatic cyclic group constitute part of the main chain of the component (A2-1-10).

In the resist composition for immersion exposure according to the present invention, by using a component (A2) that includes a component (A2-1-10) containing the structural unit (a1'), the solubility of the resist film within an alkali developing solution is enhanced, and lithography properties such as the resolution, resist pattern shape, and line edge roughness (LER) are also improved. Further, because the resin (A1) includes the aliphatic cyclic group (such as a norbornane or tetracyclododecane structure) within the main chain, the carbon density is increased, yielding an improvement in the etching resistance.

Here, a "fluorinated hydroxyalkyl group" refers to a hydroxyalkyl group, in which a portion of the hydrogen atoms of an alkyl group have been substituted with hydroxyl groups, wherein some or all of the remaining hydrogen atoms within the hydroxyalkyl group have been substituted with fluorine atoms.

In a fluorinated hydroxyalkyl group, the fluorination increases the ease with which the hydrogen atom of the hydroxyl group is released.

In the fluorinated hydroxyalkyl group, the alkyl group is preferably a linear or branched alkyl group.

Although there are no particular limitations on the number of carbon atoms within the alkyl group, the number of carbon atoms is preferably from 1 to 20, more preferably from 4 to 16, and most preferably from 4 to 12.

There are no particular limitations on the number of hydroxyl groups, although a single hydroxyl group is preferred.

Of the various possibilities, groups in which a fluorinated alkyl group and/or a fluorine atom is bonded to the carbon atom to which the hydroxyl group is bonded (which refers to the α-position carbon atom of the hydroxyalkyl group) are preferred as the fluorinated hydroxyalkyl group.

Furthermore, the fluorinated alkyl group bonded to the α-position is preferably a group in which all of the hydrogen atoms of the alkyl group have been substituted with fluorine atoms. Furthermore, as the alkyl group of this fluorinated alkyl group, a linear or branched alkyl group of 1 to 5 carbon atoms is preferred, and an alkyl group of one carbon atom is the most desirable.

The term "aliphatic" in the expression "aliphatic cyclic group having a fluorinated hydroxyalkyl group" is a relative concept used in relation to the term "aromatic", and defines a group or compound or the like that contains no aromaticity. The aliphatic cyclic group may be either monocyclic or polycyclic.

The expression "monocyclic aliphatic cyclic group" describes a monocyclic group that contains no aromaticity, whereas the expression "polycyclic aliphatic cyclic group" describes a polycyclic group that contains no aromaticity.

In the structural unit (a1'), the aliphatic cyclic group is preferably a polycyclic group, as such groups provide superior etching resistance and the like.

The aliphatic cyclic group includes both hydrocarbon groups formed solely from carbon and hydrogen (alicyclic groups), and heterocyclic groups in which a portion of the carbon atoms that constitute the ring structure of an alicyclic group have been substituted with a hetero atom such as an oxygen atom, nitrogen atom, or sulfur atom. These aliphatic cyclic groups may include substituent groups, and examples of these substituent groups include alkyl groups of 1 to 5 carbon atoms.

The expression "include substituent groups" means that some or all of the hydrogen atoms bonded to the carbon atoms that constitute the ring structure of the aliphatic cyclic group have been substituted with substituent groups (atoms or groups other than a hydrogen atom). In the present invention, an alicyclic group is preferred as the aliphatic cyclic group.

The aliphatic cyclic group may be either saturated or unsaturated, although a saturated group is preferred, as such groups exhibit superior transparency to ArF excimer lasers and the like, and also exhibit excellent resolution and depth of focus (DOF) and the like.

The aliphatic cyclic group preferably has 5 to 15 carbon atoms.

Specific examples of the aliphatic cyclic group include the groups described below.

Examples of the monocyclic groups include groups in which two or more hydrogen atoms have been removed from a cycloalkane. Specific examples include groups in which two or more hydrogen atoms have been removed from cyclopentane or cyclohexane.

Examples of the polycyclic groups include groups in which two or more hydrogen atoms have been removed from a bicycloalkane, tricycloalkane or tetracycloalkane or the like. Specific examples include groups in which two or more hydrogen atoms have been removed from a polycycloalkane such as adamantane, norbornane, isobornane, tricyclodecane or tetracyclododecane.

These types of aliphatic cyclic groups can be selected appropriately from the multitude of groups that have been proposed for the resins of photoresist compositions used in ArF excimer laser processes.

Of the various possibilities, groups in which two or more hydrogen atoms have been removed from cyclopentane, cyclohexane, adamantane, norbornane or tetracyclododecane are readily available industrially, and are consequently preferred.

Of the alicyclic groups described above, groups such as those shown in a structural unit (a1'-1) below, in which three hydrogen atoms have been removed from norbornane or tetracyclododecane, are preferred, and groups in which three hydrogen atoms have been removed from norbornane are particularly desirable.

Of the units included within the definition of the structural unit (a1), structural units (a1-1) represented by general formula (a1'-1) shown below are preferred. By including the structural unit (a1'-1), the solubility of the resin in an alkali developing solution improves significantly. Furthermore, the lithography properties such as the resolution are also improved.

[Chemical Formula 68]

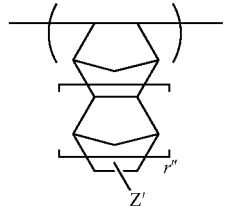

(a1'-1)

In general formula (a1'-1), Z represents a fluorinated hydroxyalkyl group, and r" is either 0 or 1.

In formula (a1'-1), r" is either 0 or 1, and in terms of industrial availability, is preferably 0.

Further, in formula (a1'-1), examples of the "fluorinated hydroxyalkyl group" represented by Z include the same groups as those described above. Of these, Z is preferably a group represented by general formula (a1'-1-1) shown below, as such groups yield a particularly superior resist pattern shape as well as reduced levels of line edge roughness (LER).

"Line edge roughness (LER)" refers to non-uniform unevenness in the side walls of pattern lines.

[Chemical Formula 69]

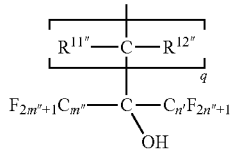

(a1'-1-0)

In general formula (a1'-1-0), $R^{11''}$ and $R^{12''}$ each independently represent a hydrogen atom or a lower alkyl group of 1 to 5 carbon atoms, m" and n" each independently represents an integer of 1 to 5, and q also represents an integer of 1 to 5.

In formula (a1'-1-0), $R^{11''}$ and $R^{12''}$ each independently represents a hydrogen atom or a lower alkyl group.

As the lower alkyl group, a linear or branched lower alkyl group of no more than 5 carbon atoms is preferred, and specific examples include a methyl group, an ethyl group, a propyl group, an isopropyl group, an n-butyl group, an isobutyl group, a tert-butyl group, a pentyl group, an isopentyl group or an neopentyl group, and a methyl group is particularly desirable.

Of the various possibilities, groups in which both $R^{11''}$ and $R^{12''}$ are hydrogen atoms are particularly desirable.

q represents an integer of 1 to 5, and preferably an integer of 1 to 3, and is most preferably 1.

m" and n" each independently represents an integer of 1 to 5, and preferably an integer of 1 to 3. Groups in which both m" and n" are 1 are preferred in terms of ease of synthesis.

The structural unit (a1') may use either one type of structural unit, or a mixture of two or more types.

In the component (A2-1-10), the amount of the structural unit (a1') based on the combined total of all structural units constituting the component (A2-1-10) is preferably 50 to 90 mol %, more preferably 55 to 90 mol %, and still more preferably 60 to 80 mol %. Making this proportion at least as large as the lower limit of the above-mentioned range yields an improvement in the effects achieved by including the structural unit (a1'). On the other hand, by making the proportion no more than the upper limit of the above-mentioned range, a good balance can be achieved with the other structural units.

Structural Unit (a2')

In addition to the structural unit (a1'), the component (A1) preferably also includes a structural unit (a2') having a hydroxyalkyl group.

In the present invention, including a component (A2-1-10) containing the structural unit (a2') within the component (A2) improves the solubility of the component (A2) within an alkali developing solution. Further, the cross-linking of the component (A) with the component (C) is enhanced; meaning the difference in the solubility within the alkali developing solution (the contrast) between the exposed portions and the unexposed portions can be increased, enabling the composition to function more effectively as a negative resist.

As the structural unit (a2), units such as a structural unit (a210) that contains, within the main chain, an aliphatic cyclic group having a hydroxyalkyl group, and a structural unit (a220) derived from an acrylate ester having a hydroxyl group-containing alkyl group are preferred.

Structural Unit (a210)

In the present invention, the structural unit (a210) is a structural unit that contains, within the main chain, an aliphatic cyclic group having a hydroxyalkyl group.

Examples of the structural unit (a210) include the same units as those described above for the structural unit (a1'), with the exception that the "fluorinated hydroxyalkyl group" within the structural unit (a1') is replaced with an unfluorinated hydroxyalkyl group, namely a hydroxyalkyl group in which a portion of the hydrogen atoms of an alkyl group have been substituted with hydroxyl groups, and the remaining hydrogen atoms have not been substituted with fluorine atoms.

Of the units included within the definition of the structural unit (a210), structural units (a2'-1) represented by general formula (a2'-1) shown below are preferred.

By including the structural unit (a2'-1), lithography properties such as the resolution, resist pattern shape and line width roughness (LWR) are improved. Further, a favorable contrast is more readily obtained, and thus, the etching resistance also improves.

[Chemical Formula 70]

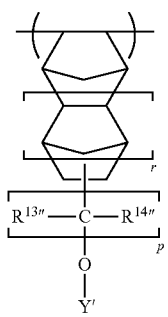

(a2'-1)

In general formula (a2'-1), $R^{13''}$ and $R^{14''}$ each independently represent a hydrogen atom or a lower alkyl group of 1 to 5 carbon atoms, Y' represents a hydrogen atom or a hydroxyalkyl group, r represents either 0 or 1, and p represents an integer of 1 to 3.

The structural unit (a2'-1) represented by general formula (a2'-1) is a structural unit containing, within the main chain, a norbornane or tetracyclododecane structure having a hydroxyalkyl group.

In formula (a2'-1), $R^{13''}$ and $R^{14''}$ each independently represents a hydrogen atom or a lower alkyl group. Examples of the lower alkyl group include the same groups as those described above in relation to the lower alkyl groups represented by $R^{11''}$ and $R^{12''}$ in formula (a1'-1-1). Of the various possibilities, groups in which both $R^{13''}$ and $R^{14''}$ are hydrogen atoms are particularly desirable.

Y' represents a hydrogen atom or a hydroxyalkyl group.

As the hydroxyalkyl group, a linear or branched hydroxyalkyl group of not more than 10 carbon atoms is preferred, a linear or branched hydroxyalkyl group of not more than 8 carbon atoms is more preferred, and a linear lower hydroxyalkyl group of 1 to 3 carbon atoms is still more preferred.

There are no particular limitations on the number of hydroxyl groups or the bonding positions of those hydroxyl groups within the hydroxyalkyl group, although a single hydroxyl group is typical, and this hydroxyl group is preferably bonded to the alkyl group terminal.

Y' is most preferably a hydrogen atom.

r is either 0 or 1, and is preferably 0.

p represents an integer of 1 to 3, is preferably 1 or 2, and is most preferably 1.

Specific examples of the structural unit (a2'-1) include units represented by chemical formulas (a2'-1-1) to (a2'-1-7) shown below.

[Chemical Formula 71]

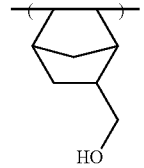

(a2'-1-1)

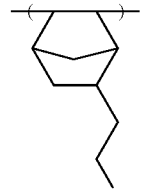

(a2'-1-2)

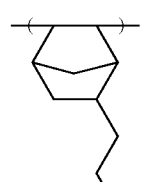

(a2'-1-3)

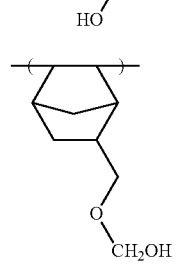

(a2'-1-4)

-continued

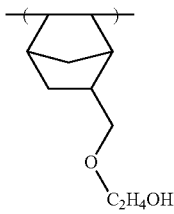
(a2'-1-5)

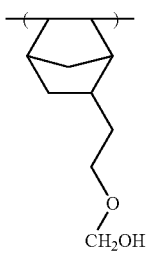
(a2'-1-6)

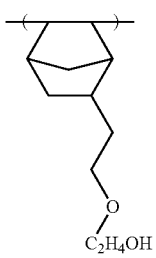
(a2'-1-7)

Of these structural units, those represented by the above-mentioned chemical formulas (a2'-1-1), (a2'-1-2) and (a2'-1-3) are preferred.

The structural unit (a210) may use either one type of structural unit, or a mixture of two or more types.

In the component (A2-1-10), the amount of the structural unit (a210) based on the combined total of all structural units constituting the component (A2-1-10) is preferably 10 to 50 mol %, more preferably 15 to 50 mol %, and still more preferably 20 to 45 mol %. Making this proportion at least as large as the lower limit of the above-mentioned range improves the effects achieved by including the structural unit (a210) such as improving the alkali solubility and making a favorable contrast more readily obtainable. On the other hand, by making the proportion no more than the upper limit of the above-mentioned range, a good balance can be achieved with the other structural units.

Structural Unit (a220)

The structural unit (a220) is a structural unit derived from an acrylate ester having a hydroxyl group-containing alkyl group.

If the structural unit (a220) is a structural unit that includes a hydroxyl group-containing cyclic alkyl group (hereafter, this structural unit is abbreviated as "structural unit (a221)"), the resist pattern swelling suppression effect is further enhanced. Further, the resolution is also improved. Furthermore, favorable levels of contrast and etching resistance are also more readily obtained.

Examples of the structural unit (a221) include those units, amongst the structural units described below in the description of a "structural unit (a2") derived from an acrylate ester containing a hydroxyl group-containing aliphatic cyclic group" that constitutes a component (A2-1-20) described below, in which the aliphatic cyclic group is a saturated hydrocarbon group. Of these structural units, units in which the substituent bonded to the α-position of the acrylate ester is a fluorinated lower alkyl group are particularly preferred, and this substituent is most preferably a trifluoromethyl group ($-CF_3$).

Furthermore, if the structural unit (a220) is a structural unit that includes a hydroxyl group-containing chain-like alkyl group (hereafter, this structural unit is abbreviated as "structural unit (a222)"), then the hydrophilicity of the entire component (A2-1-10) is increased, the solubility of the component within an alkali developing solution is improved, and the resolution also improves.

Further, the controllability of the cross-linking reaction that occurs during resist pattern formation improves, yielding improvements in the pattern shape and the resolution. Moreover, the film density also tends to increase, and this enables suppression of thickness loss during etching, and tends to also improve the heat resistance.

Examples of the structural unit (a222) include those units, amongst the structural units described below in the explanation of a "structural unit (a3") derived from an acrylic acid that has no cyclic structure and has an alcoholic hydroxyl group on a side chain" that constitutes the component (A2-1-20) described below, that include a hydroxyalkyl group. Of these structural units, units having a hydroxyalkyl group at the acrylate ester portion are preferred, structural units in which the substituent bonded to the α-position of the acrylate ester is a fluorinated alkyl group are particularly preferred, and this substituent is most preferably a trifluoromethyl group ($-CF_3$).

The structural unit (a220) may use either one type of structural unit, or a mixture of two or more types.

In the component (A2-1-10), the amount of the structural unit (a220) based on the combined total of all structural units constituting the component (A2-1-10) is preferably 10 to 80 mol %, more preferably 15 to 60 mol %, and still more preferably 20 to 55 mol %. Making this proportion at least as large as the lower limit of the above-mentioned range ensures that the effects obtained by including the structural unit (a220) are achieved. On the other hand, by making the proportion no more than the upper limit of the above-mentioned range, a good balance can be achieved with the other structural units.

In those cases where the structural unit (a220) includes both the structural unit (a221) and the structural unit (a222), the mixing ratio between the two structural units, reported as a molar ratio, is preferably such that structural unit (a221): structural unit (a222) is from 9:1 to 1:9, more preferably from 8:2 to 2:8, and most preferably from 6:4 to 7:3.

By including the structural unit (a221) and the structural unit (a222) in a favorable balance that satisfies the above-mentioned mixing ratio, a favorable exposure margin can be obtained. Further, a suitable level of contrast is obtained, and the resolution is improved. Moreover, the etching resistance also improves.

Other Structural Units

In the negative resist composition of the present invention, besides the structural units (a1') and (a2') described above, the component (A) may also include other structural units typically used in the resin component of conventional chemically amplified resist compositions.

However, in the present invention, the component (A2-1-10) is preferably a polymeric compound having the structural unit (a1') and the structural unit (a2'), and more preferably a polymeric compound in which the structural units (a1) and (a2) represent the main components.

Here the term "main components" means that the combined quantity of the structural unit (a1') and the structural unit (a2'), relative to the combined total of all the structural units that constitute the component (A2-1-10), is preferably at least 70 mol %. This proportion is more preferably 80 mol % or higher, and may be 100 mol %. Of the various possibilities, as the component (A2-1-10), polymeric compounds formed solely from the structural units (a1') and (a2') are the most desirable.

The combination of the structural unit (a1') and the structural unit (a2') within the component (A2-1-10) is preferably a combination of the structural unit (a1') and the structural unit (a210).

Preferable examples of the component (A2-1-10) include combinations of structural units represented by general formulas (A2-1-11) to (A2-1-14) shown below.

[Chemical Formula 72]

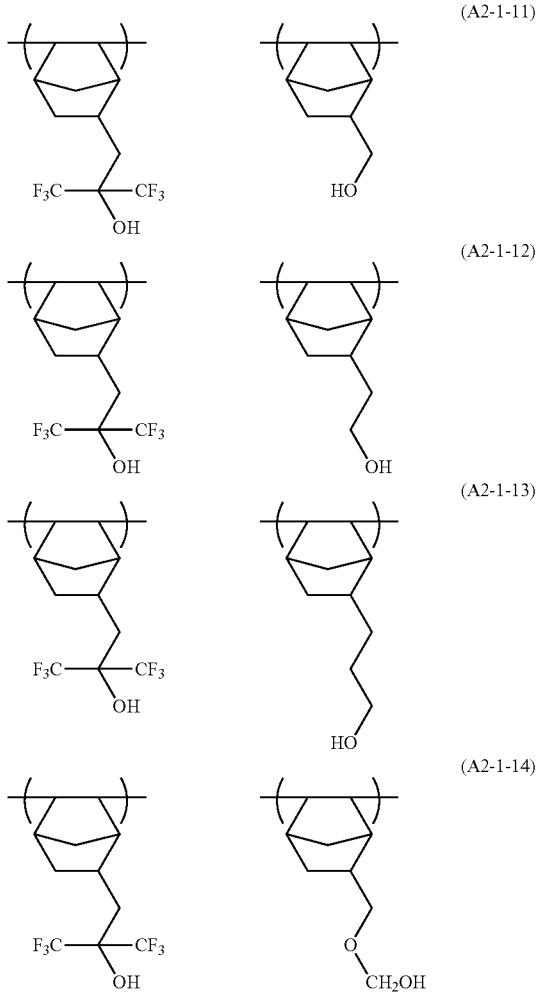

Of the above examples, the component (A2-1-10) is preferably a polymeric compound that includes at least one combination of structural units selected from the combinations represented by chemical formulas (A2-1-11) to (A2-1-14), and is most preferably a polymeric compound including the combination of structural units represented by chemical formula (A2-1-11).

In the present invention, the weight average molecular weight (Mw, the polystyrene equivalent molecular weight measured by gel permeation chromatography) of the component (A2-1-10) is preferably within a range from 2,000 to 10,000, more preferably from 3,000 to 6,000, and most preferably from 3,000 to 5,000.

Ensuring that this molecular weight is at least as large as the lower limit of the above-mentioned range enables good contrast to be obtained, whereas ensuring the molecular weight is no more than the upper limit of the above-mentioned range can suppress swelling of the resist pattern. As a result, the resolution can be improved. Further, suppressing swelling of the pattern also yields an improvement in the depth of focus (DOF) properties and improved suppression of line edge roughness (LER). Furthermore, ensuring a weight average molecular weight within the above range is preferred in terms of achieving a large suppression effect on resist pattern swelling. For the weight average molecular weight, lower values within the above-mentioned range tend to yield more favorable properties.

Further, the degree of dispersion (Mw/Mn) is preferably from 1.0 to 5.0, and more preferably from 1.0 to 2.5. Mn represents the number average molecular weight.

When the component (A2-1) is used in the component (A2), one type of the component (A2-1-10) may be used alone, or a mixture of two or more types may be used.

In those cases where the component (A2-1-10) is used, the proportion of the component (A2-1-10) within the component (A2-1) is preferably 40% by weight or more, more preferably 50% by weight or more, and most preferably 60% by weight or more.

Polymeric Compound (A2-1-10)

The resin component (A2-1-20) includes a structural unit (a1") that contains an aliphatic cyclic group having a fluorinated hydroxyalkyl group.

In addition to the structural unit (a1"), the component (A2-1-20) preferably also includes a structural unit (a2") derived from an acrylate ester containing a hydroxyl group-containing aliphatic cyclic group.

Furthermore, in addition to the structural unit (a1"), or in addition to a combination of the structural unit (a1") and the structural unit (a2"), the component (A2-1-20) preferably also includes a structural unit (a3") derived from an acrylic acid that has no cyclic structure and has an alcoholic hydroxyl group on a side chain.

Structural Unit (a1")

The structural unit (a1") is a structural unit that includes an aliphatic cyclic group having a fluorinated hydroxyalkyl group. Including the structural unit (a1") improves the solubility in an alkali developing solution. Further, swelling of the resist pattern is suppressed, and lithography properties such as the resolution, pattern shape and LWR are improved.

Examples of the aliphatic cyclic group having a fluorinated hydroxyalkyl group include the same groups as those described above for the structural unit (a1'). As the aliphatic cyclic group (prior to the bonding of the fluorinated hydroxyalkyl group), groups in which two hydrogen atoms have been removed from cyclohexane, adamantane, norbornane or tetracyclododecane are readily available industrially, and are consequently preferred.

Of these monocyclic and polycyclic groups, a group in which two hydrogen atoms have been removed from norbornane is particularly desirable.

The structural unit (a1") is preferably a structural unit derived from acrylic acid. A structure in which the above-mentioned aliphatic cyclic group is bonded to the oxygen atom (—O—) at the terminal of the carbonyloxy group [—C(O)—O—] of an acrylate ester (namely, a structure in which the hydrogen atom of the carboxyl group of acrylic acid has been substituted with the aliphatic cyclic group) is particularly desirable.

As the structural unit (a1"), structural units (a1"-1) represented by general formula (1) shown below are preferred.

[Chemical Formula 73]

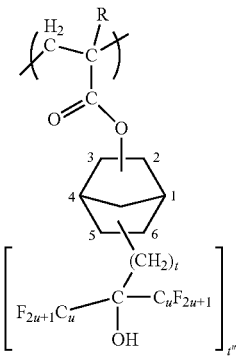

In general formula (1), R represents a hydrogen atom, a lower alkyl group or a halogenated lower alkyl group, and u, t and t" each independently represents an integer of 1 to 5.

In formula (1), R represents a hydrogen atom, a lower alkyl group or a halogenated lower alkyl group.

Examples of the lower alkyl group or halogenated lower alkyl group for R include the same groups as those described above for the lower alkyl group or halogenated lower alkyl group that may be bonded to the α-position of the above-mentioned acrylate ester.

In the present invention, R is preferably a hydrogen atom or a lower alkyl group, and in terms of industrial availability, is most preferably a hydrogen atom or a methyl group.

Each u independently represents an integer of 1 to 5, and is preferably an integer of 1 to 3, and most preferably 1.

t represents an integer of 1 to 5, preferably an integer of 1 to 3, and most preferably 1.

t" represents an integer of 1 to 5, preferably an integer of 1 to 3, still more preferably 1 or 2, and most preferably 1.

The structural unit (a1"-1) represented by general formula (1) preferably has a 2-norbornyl group or 3-norbornyl group bonded to the terminal of the carboxyl group of the (α-lower alkyl)acrylic acid. The fluorinated alkyl alcohol is preferably bonded to the 5th or 6th position of the norbornyl group.

The structural unit (a1") may use either one type of structural unit, or a mixture of two or more types.

The proportion of the structural unit (a1") within the component (A2-1-20), relative to the combined total of all the structural units that constitute the component (A2-1-20), is preferably within a range from 10 to 90 mol %, more preferably from 20 to 90 mol %, still more preferably from 40 to 90 mol %, and most preferably from 45 to 85 mol %. Making this proportion at least as large as the lower limit of the above-mentioned range ensures that the effects obtained by including the structural unit (a1") are achieved. On the other hand, by making the proportion no more than the upper limit of the above-mentioned range, a good balance can be achieved with the other structural units.

Structural Unit (a2")

In addition to the structural unit (a1"), the component (A2-1-20) preferably also includes a structural unit (a2") derived from an acrylate ester containing a hydroxyl group-containing aliphatic cyclic group.

When a component (A2-1-20) that includes the structural unit (a2") is blended into the negative resist composition, the hydroxyl group (the alcoholic hydroxyl group) of this structural unit (a2") reacts with the component (C) under the action of the acid generated from the component (B), and this reaction causes the component (A2-1-20) to change from a state that is soluble in the alkali developing solution to a state that is insoluble.

The expression "hydroxyl group-containing aliphatic cyclic group" describes a group in which a hydroxyl group is bonded to an aliphatic cyclic group.

The number of hydroxyl groups bonded to the aliphatic cyclic group is preferably within a range from 1 to 3, and is most preferably 1.

The aliphatic cyclic group may be either monocyclic or polycyclic, but is preferably a polycyclic group. Furthermore, an alicyclic hydrocarbon group is preferred. Moreover, a saturated group is preferred. Furthermore, the number of carbon atoms within the aliphatic cyclic group is preferably within a range from 5 to 15.

Specific examples of the aliphatic cyclic group (prior to bonding of the hydroxyl group) include the same aliphatic cyclic groups as those described above in relation to the structural unit (a1").

As the aliphatic cyclic group of the structural unit (a2"), of the groups described above, a cyclohexyl group, adamantyl group, norbornyl group or tetracyclododecanyl group are readily available commercially, and are preferred. Of these, a cyclohexyl group or adamantyl group is particularly preferred, and an adamantyl group is the most desirable.

Besides the hydroxyl group, a linear or branched alkyl group of 1 to 4 carbon atoms may also be bonded to the aliphatic cyclic group.

In the structural unit (a2"), the hydroxyl group-containing aliphatic cyclic group is preferably bonded to the oxygen atom at the terminal of the ester group (—C(O)—O—) of the acrylate ester.

In such cases, in the structural unit (a2"), another substituent may be bonded to the α-position (the α-position carbon atom) of the acrylate ester instead of a hydrogen atom. Examples of preferred substituents include a lower alkyl group or a halogenated lower alkyl group.

Examples of the lower alkyl group or halogenated lower alkyl group include the same groups as those described for R within general formula (1) representing the above-mentioned structural unit (a1"). Of the various moieties that can be bonded to the α-position, a hydrogen atom or a lower alkyl group is preferred, and a hydrogen atom or methyl group is particularly desirable.

As the structural unit (a2"), structural units (a2"-1) represented by general formula (2) shown below are preferred.

[Chemical Formula 74]

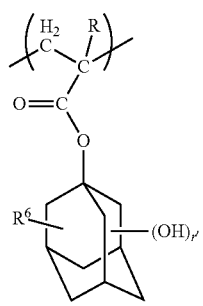

In general formula (2), R is as defined for R in general formula (1), $R^6$ represents a hydrogen atom, a lower alkyl group, or an alkoxy group of 1 to 5 carbon atoms, and r' represents an integer of 1 to 3.

R is the same as defined above for R in general formula (1).

The lower alkyl group for $R^6$ is the same as defined above for the lower alkyl group for R in general formula (1).

In general formula (2), R and $R^6$ are both preferably hydrogen atoms.

r' represents an integer of 1 to 3, and is most preferably 1.

Although there are no particular limitations on the bonding position of the hydroxyl group, units in which the hydroxyl group is bonded to the 3rd position of the adamantyl group are preferred.

The structural unit (a2") may use either one type of structural unit, or a mixture of two or more types.

The proportion of the structural unit (a2") within the component (A2-1-20), relative to the combined total of all the structural units that constitute the component (A2-1-20), is preferably within a range from 10 to 70 mol %, more preferably from 10 to 50 mol %, and still more preferably from 20 to 40 mol %. Making this proportion at least as large as the lower limit of the above-mentioned range ensures that the effects obtained by including the structural unit (a2") are achieved. On the other hand, by making the proportion no more than the upper limit of the above-mentioned range, a good balance can be achieved with the other structural units.

Structural Unit (a3")

In addition to the structural unit (a1"), or in addition to both the structural unit (a1") and the structural unit (a2"), the component (A2-1-20) preferably also includes a structural unit (a3") derived from an acrylic acid that has no cyclic structure and has an alcoholic hydroxyl group on a side chain.

When a component (A2-1-20) that includes the structural unit (a3") is blended into the negative resist composition, the alcoholic hydroxyl group of this structural unit (a3") reacts with the component (C), together with the hydroxyl group of the structural unit (a2"), under the action of the acid generated from the component (B).

Accordingly, the component (A2-1-20) changes more readily from a state that is soluble in the alkali developing solution to a state that is insoluble, which has the effect of improving the lithography properties such as the resolution. Further, thickness loss can also be suppressed, and the controllability of the cross-linking reaction that occurs during pattern formation improves. Moreover, the film density also tends to increase. As a result, the heat resistance tends to improve. Moreover, the etching resistance also improves.

In the structural unit (a3"), the expression "has no cyclic structure" means that the structural unit includes no aliphatic cyclic groups or aromatic groups.

The structural unit (a3") is readily distinguishable from the structural unit (a2") as a result of having no cyclic structure.

Examples of structural units that include an alcoholic hydroxyl group on a side chain include structural units having a hydroxyalkyl group.

Examples of this hydroxyalkyl group include the same hydroxyalkyl groups as those within the "fluorinated hydroxyalkyl group" described above in relation to the structural unit (a1").

The hydroxyalkyl group may, for example, be bonded directly to the α-position carbon atom of the main chain (the portion formed by cleavage of the ethylenic double bond of the acrylic acid), or may form an ester group through substitution of the hydrogen atom of the acrylic acid carboxyl group.

In the structural unit (a3"), the hydroxyalkyl group preferably exists at either one, or both of these locations.

In those cases where the hydroxyalkyl group is not bonded to the α-position, the hydrogen atom at the α-position carbon atom may be replaced with a lower alkyl group or a halogenated lower alkyl group.

Examples of this lower alkyl group or halogenated lower alkyl group include the same groups as those described above for R within general formula (1).

As the structural unit (a3"), structural units (a3"-1) represented by general formula (3) shown below are preferred.

{Chemical Formula 75]

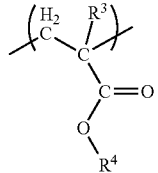

(3)

In general formula (3), $R^3$ represents a hydrogen atom, a lower alkyl group, a halogenated lower alkyl group or a hydroxyalkyl group, and $R^4$ represents a hydrogen atom, an alkyl group or a hydroxyalkyl group, provided that at least one of $R^3$ and $R^4$ represents a hydroxyalkyl group.

The hydroxyalkyl group for $R^3$ is preferably a hydroxyalkyl group of not more than 10 carbon atoms, is preferably a linear or branched group, is more preferably a hydroxyalkyl group of 2 to 8 carbon atoms, and is most preferably a hydroxymethyl group or hydroxyethyl group.

There are no particular limitations on the number of hydroxyl groups or the bonding positions of those groups, although one hydroxyl group is typical, and the hydroxyl group is preferably bonded to the terminal of the alkyl group.

The lower alkyl group for $R^3$ is preferably an alkyl group of not more than 10 carbon atoms, even more preferably an alkyl group of 1 to 8 carbon atoms, and is most preferably an ethyl group or methyl group.

The halogenated lower alkyl group for $R^3$ is preferably a lower alkyl group of not more than 5 carbon atoms (most preferably an ethyl group or methyl group) in which some or all of the hydrogen atoms have been substituted with halogen atoms (and preferably fluorine atoms).

Examples of the alkyl group and hydroxyalkyl group for $R^4$ include the same groups as the lower alkyl group and hydroxyalkyl group of $R^3$.

Specific examples of the structural unit (a3"-1) represented by general formula (3) include structural units derived from α-(hydroxyalkyl)acrylic acids (not including structural units derived from acrylate esters), structural units derived from alkyl α-(hydroxyalkyl)acrylate esters, and structural units derived from hydroxyalkyl (α-alkyl)acrylate esters.

Of these, including a structural unit derived from an alkyl α-(hydroxyalkyl)acrylate ester as the structural unit (a3") is preferred in terms of improving the film density. Of the various possibilities, structural units derived from ethyl α-(hydroxymethyl)acrylate or methyl α-(hydroxymethyl)acrylate are particularly desirable.

Furthermore, including a structural unit derived from a hydroxyalkyl (α-alkyl)acrylate ester as the structural unit (a3") is preferred in terms of improving the cross-linking efficiency. Of such units, structural units derived from hydroxyethyl α-methyl-acrylate or hydroxymethyl α-methyl-acrylate are particularly desirable.

The structural unit (a3") may use either one type of structural unit, or a mixture of two or more types.

The proportion of the structural unit (a3") within the component (A2-1-20), relative to the combined total of all the structural units that constitute the component (A2-1-20), is preferably within a range from 5 to 50 mol %, more preferably from 5 to 40 mol %, still more preferably from 5 to 30 mol %, and most preferably from 10 to 25 mol %. Making this proportion at least as large as the lower limit of the above-mentioned range ensures that the effects obtained by including the structural unit (a3") are achieved. By making the proportion no more than the upper limit of the above-mentioned range, a good balance can be achieved with the other structural units.

Other Structural Units

Besides each of the structural units (a1") to (a3") described above, the component (A2-1-20) may also include other copolymerizable structural units.

As such structural units, any of the structural units used in known resin components of conventional chemically amplified resist compositions can be used. An example is a structural unit (a4") derived from an acrylate ester that includes a lactone-containing monocyclic or polycyclic group.

As the structural unit (a4"), any unit can be used without any particular limitations. Specifically, examples of lactone-containing monocyclic groups include groups in which one hydrogen atom has been removed from γ-butyrolactone. Further, specific examples of lactone-containing polycyclic groups include groups in which one hydrogen atom has been removed from a lactone ring-containing bicycloalkane, tricycloalkane or tetracycloalkane.

The structural unit (a4") may use either one type of structural unit, or a mixture of two or more types.

If the structural unit (a4") is included in the component (A2-1-20), then the proportion of the structural unit (a4") within the component (A2-1-20), relative to the combined total of all the structural units that constitute the component (A2-1-20), is preferably within a range from 10 to 70 mol %, more preferably from 10 to 40 mol %, and most preferably from 10 to 25 mol %. Making this proportion at least as large as the lower limit of the above-mentioned range ensures that the effects obtained by including the structural unit (a4") are achieved. On the other hand, by making the proportion no more than the upper limit of the above-mentioned range, a good balance can be achieved with the other structural units.

However, in the present invention, the component (A2-1-20) is preferably a polymeric compound in which the structural units (a1") to (a3") represent the main components.

Here, the term "main components" means that the combined quantity of the structural units (a1") to (a3") represents at least 50 mol %, preferably at least 70 mol %, and more preferably 80 mol % or greater, of all the structural units. Component (A2-1-20) in which this proportion is 100 mol %, namely component (A2-1-20) composed solely of the structural unit (a1"), the structural unit (a2") and the structural unit (a3"), is the most desirable.

As the component (A2-1-20), resins that include a combination of structural units such as that represented by formula (A2-1-21) shown below are particularly desirable.

[Chemical Formula 76]

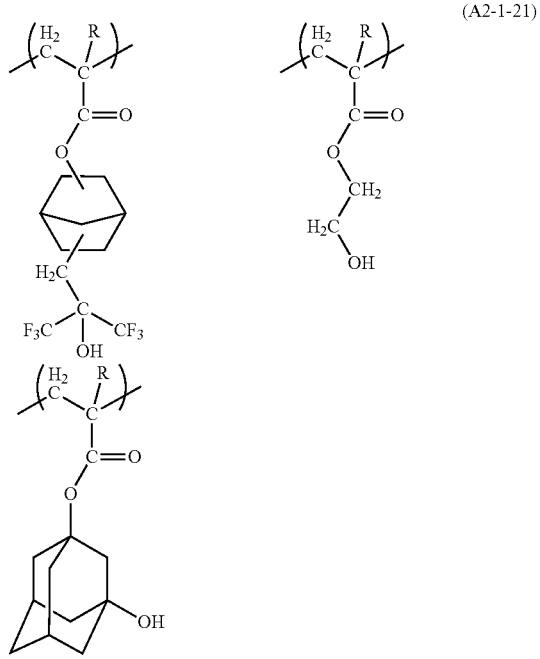

(A2-1-21)

In the formulas, R is the same as defined above, and the plurality of R may be the same or different from each other.

The weight average molecular weight (Mw) of the component (A2-1-20) is preferably within a range from 2,000 to 30,000, more preferably from 2,000 to 10,000, and most preferably from 3,000 to 8,000. Ensuring a molecular weight within this range is preferred in terms of obtaining a favorable dissolution rate within an alkali developing solution, and achieving a high level of resolution. For the weight average molecular weight, lower values within the above-mentioned range tend to yield more favorable properties.

Further, the degree of dispersion (Mw/Mn) is preferably from 1.0 to 5.0, and more preferably from 1.0 to 2.5.

When the component (A2-1) is used in the component (A2), one type of the component (A2-1-20) may be used alone, or a mixture of two or more types may be used.

In those cases where the component (A2-1-20) is used, the proportion of the component (A2-1-20) within the component (A2-1) is preferably 40% by weight or more, more preferably 50% by weight or more, and most preferably 60% by weight or more.

The component (A2-1-10) and the component (A2-1-20) used in the present invention can be synthesized, for example, by the method disclosed in International Patent Publication 2004/076495 pamphlet, or a method in which the monomers that give rise to each of the structural units are subjected to a radical polymerization using conventional methods.

In the resist composition for immersion exposure according to the present invention, as the component (A2), one type may be used, or two or more types of compounds may be used in combination.

Besides the component (A2-1-10) and the component (A2-1-20), the component (A2) may also use other polymeric compounds used within conventional negative resist compositions (such as hydroxystyrene resins, novolak resins or acrylic resins).

In the resist composition for immersion exposure according to the present invention, the amount of the component (A2) can be appropriately adjusted depending on the thickness of the resist film to be formed, and the like.

<Component (B)>

In the resist composition for immersion exposure according to the present invention, as the component (B), there is no particular limitation, and any of the known acid generators used in conventional chemically amplified resist compositions can be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

As an onium salt acid generator, a compound represented by general formula (b-1) or (b-2) shown below can be used.

[Chemical Formula 77]

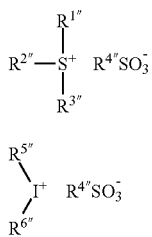

In the formulas above, $R^{1\prime\prime}$ to $R^{3\prime\prime}$, $R^{5\prime\prime}$ and $R^{6\prime\prime}$ each independently represent an aryl group which may have a substituent or an alkyl group which may have a substituent, wherein two of $R^{1\prime\prime}$ to $R^{3\prime\prime}$ may be bonded to each other to form a ring with the sulfur atom; and $R^{4\prime\prime}$ represents a linear, branched or cyclic alkyl group which may have a substituent or a fluorinated alkyl group which may have a substituent, with the provision that at least one of $R^{1\prime\prime}$ to $R^{3\prime\prime}$ represents an aryl group, and at least one of $R^{5\prime\prime}$ and $R^{6\prime\prime}$ represents an aryl group.

In formula (b-1), $R^{1\prime\prime}$ to $R^{3\prime\prime}$ each independently represents an aryl group or an alkyl group. In formula (I-1), two of $R^{1\prime\prime}$ to $R^{3\prime\prime}$ may be bonded to each other to form a ring with the sulfur atom.

Further, among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly desirable that all of $R^{1\prime\prime}$ to $R^{3\prime\prime}$ are aryl groups.

The aryl group for $R^{1\prime\prime}$ to $R^{3\prime\prime}$ is not particularly limited. Examples thereof include an unsubstituted aryl group having 6 to 20 carbon atoms, a substituted aryl group in which part or all of the hydrogen atoms of the aforementioned unsubstituted aryl group has been substituted with alkyl groups, alkoxy groups, alkoxyalkyloxy groups, alkoxycarbonylalkyloxy groups, halogen atoms or hydroxyl groups, and a group represented by the formula —($R^{8\prime}$)—C(=O)—$R^{9\prime}$. $R^{8\prime}$ represents an alkylene group of 1 to 5 carbon atoms. $R^{9\prime}$ represents an aryl group. As the aryl group for $R^{9\prime}$, the same aryl groups as those described above for $R^{1\prime\prime}$ to $R^{3\prime\prime}$ can be used.

The unsubstituted aryl group is preferably an aryl group having 6 to 10 carbon atoms because it can be synthesized at a low cost. Specific examples thereof include a phenyl group and a naphthyl group.

The alkyl group as the substituent for the substituted aryl group is preferably an alkyl group having 1 to 5 carbon atoms, and a methyl group, an ethyl group, a propyl group, an n-butyl group, or a tert-butyl group is particularly desirable.

The alkoxy group as the substituent for the substituted aryl group is preferably an alkoxy group having 1 to 5 carbon atoms, and a methoxy group, an ethoxy group, an n-propoxy group, an iso-propoxy group, an n-butoxy group or a tert-butoxy group is particularly desirable.

The halogen atom as the substituent for the substituted aryl group is preferably a fluorine atom.

Examples of alkoxyalkyloxy groups as the substituent for the substituted aryl group include groups represented by a general formula shown below:

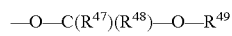

In the formula, $R^{47}$ and $R^{48}$ each independently represents a hydrogen atom or a linear or branched alkyl group; and $R^{49}$ represents an alkyl group.

The alkyl group for $R^{47}$ and $R^{48}$ preferably has 1 to 5 carbon atoms, and may be either linear or branched. As the alkyl group, an ethyl group or a methyl group is preferable, and a methyl group is most preferable.

It is preferable that at least one of $R^{47}$ and $R^{48}$ be a hydrogen atom. It is particularly desirable that at least one of $R^{47}$ and $R^{48}$ be a hydrogen atom, and the other be a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms. Examples thereof include a methyl group, an ethyl group, a propyl group, an n-butyl group and a tert-butyl group.

The cyclic alkyl group for $R^{49}$ preferably has 4 to 15 carbon atoms, more preferably 4 to 12, and most preferably 5 to 10.

Specific examples thereof include groups in which one or more hydrogen atoms have been removed from a monocycloalkane or a polycycloalkane such as a bicycloalkane, tricycloalkane or tetracycloalkane, and which may or may not be substituted with an alkyl group of 1 to 5 carbon atoms, a fluorine atom or a fluorinated alkyl group. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

An example of the alkoxycarbonylalkyloxy group as the substituent for the substituted aryl group includes a group represented by a general formula —O—$R^{45}$—C(=O)—O—$R^{46}$ (in the formula, $R^{45}$ represents a linear or branched alkylene group; and $R^{46}$ represents a tertiary alkyl group.)

The linear or branched alkylene group for $R^{45}$ preferably has 1 to 5 carbon atoms, and examples thereof include a methylene group, an ethylene group, a trimethylene group, a tetramethylene group and a 1,1-dimethylethylene group.

Examples of the tertiary alkyl group for $R^{46}$ include a 2-methyl-2-adamantyl group, a 2-ethyl-2-adamantyl group, a 1-methyl-1-cyclopentyl group, a 1-ethyl-1-cyclopentyl group, a 1-methyl-1-cyclohexyl group, a 1-ethyl-1-cyclohexyl group, a 1-(1-adamantyl)-1-methylethyl group, a 1-(1-adamantyl)-1-methylpropyl group, a 1-(1-adamantyl)-1-methylbutyl group, a 1-(1-adamantyl)-1-methylpentyl group, a 1-(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, a 1-(1-cyclohexyl)-1-methylpentyl group, a tert-butyl group, a tert-pentyl group and a tert-hexyl group.

The aryl group for each of $R^{1\prime\prime}$ to $R^{3\prime\prime}$ is preferably a phenyl group or a naphthyl group.

The alkyl group for $R^{1\prime\prime}$ to $R^{3\prime\prime}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

When two of $R^{1\prime\prime}$ to $R^{3\prime\prime}$ are bonded to each other to form a ring with the sulfur atom, it is preferable that the two of $R^{1\prime\prime}$ to $R^{3\prime\prime}$ form a 3 to 10-membered ring including the sulfur atom, and it is particularly desirable that the two of $R^{1\prime\prime}$ to $R^{3\prime\prime}$ form a 5 to 7-membered ring including the sulfur atom.

When two of $R^{1\prime\prime}$ to $R^{3\prime\prime}$ are bonded to each other to form a ring with the sulfur atom, the remaining one of $R^{1\prime\prime}$ to $R^{3\prime\prime}$ is preferably an aryl group. As examples of the aryl group, the same as the above-mentioned aryl groups for $R^{1\prime\prime}$ to $R^{3\prime\prime}$ can be given.

Specific examples of cation moiety represented by general formula (b-1) include triphenylsulfonium, (3,5-dimethylphenyl)diphenylsulfonium, (4-(2-adamantoxymethyloxy)-3,5-dimethylphenyl)diphenylsulfonium, (4-(2-adamantoxymethyloxy)phenyl)diphenylsulfonium, (4-(tert-butoxycarbonylmethyloxy)phenyl)diphenylsulfonium, (4-(tert-butoxycarbonylmethyloxy)-3,5-dimethylphenyl)diphenylsulfonium, (4-(2-methyl-2-adamantyloxycarbonylmethyloxy)phenyl)diphenylsulfonium, (4-(2-methyl-2-adamantyloxycarbonylmethyloxy)-3,5-dimethylphenyl)diphenylsulfonium, tri(4-methylphenyl)sulfonium, dimethyl(4-hydroxynaphthyl)sulfonium, monophenyldimethylsulfonium, diphenylmonomethylsulfonium, (4-methylphenyl)diphenylsulfonium, (4-methoxyphenyl)diphenylsulfonium, tri(4-tert-butyl)phenylsulfonium, diphenyl(1-(4-methoxy)naphthyl)sulfonium, di(1-naphthyl)phenylsulfonium, 1-phenyltetrahydrothiophenium, 1-(4-methylphenyl)tetrahydrothiophenium, 1-(3,5-dimethyl-4-hydroxyphenyl)tetrahydrothiophenium, 1-(4-methoxynaphthalene-1-yl)tetrahydrothiophenium, 1-(4-ethoxynaphthalene-1-yl)tetrahydrothiophenium, 1-(4-n-butoxynaphthalene-1-yl)tetrahydrothiophenium, 1-phenyltetrahydrothiopyranium, 1-(4-hydroxyphenyl)tetrahydrothiopyranium, 1-(3,5-dimethyl-4-hydroxyphenyl)tetrahydrothiopyranium and 1-(4-methylphenyl)tetrahydrothiopyranium.

As the cation moiety represented by general formula (b-1), cations represented by general formulas (b-1-1) to (b-1-10) shown below are preferable. Among these, cation moieties having a triphenyl skeleton, such as cation moieties represented by formulas (b-1-1) to (b-1-8) shown below are particularly desirable.

In formulas (b-1-9) and (b-1-10) shown below, each of $R^9$ and $R^{10}$ independently represents a phenyl group or naphthyl group which may have a substituent, an alkyl group of 1 to 5 carbon atoms, an alkoxy group or a hydroxyl group.

w is an integer of 1 to 3, and most preferably 1 or 2.

[Chemical Formula 78]

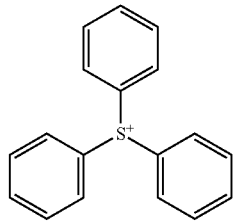
(b-1-1)

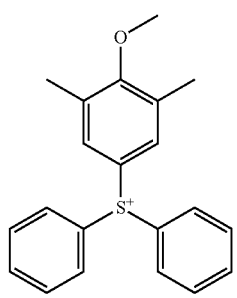
(b-1-2)

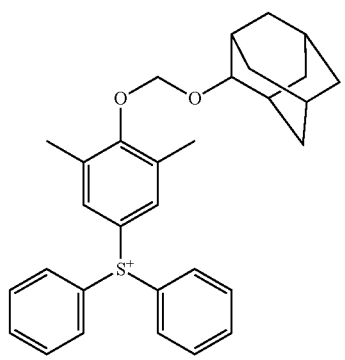
(b-1-3)

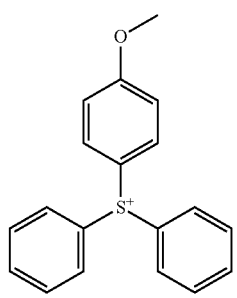
(b-1-4)

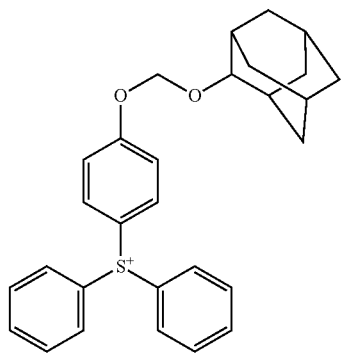
(b-1-5)

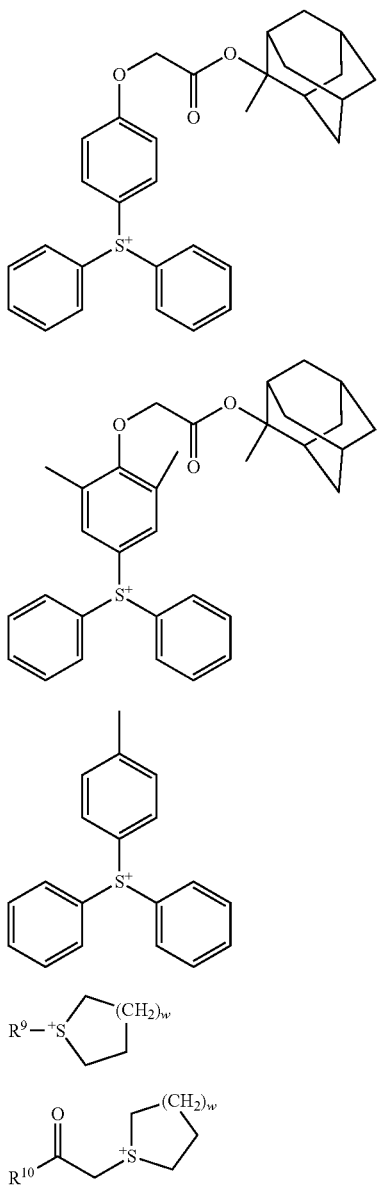

(b-1-6)

(b-1-7)

(b-1-8)

(b-1-9)

(b-1-10)

In formula (b-2), $R^{5\prime\prime\prime}$ and $R^{6\prime\prime\prime}$ each independently represent an aryl group or alkyl group. At least one of $R^{5\prime\prime\prime}$ and $R^{6\prime\prime\prime}$ represents an aryl group. It is preferable that both of $R^{5\prime\prime\prime}$ and $R^{6\prime\prime\prime}$ represent an aryl group.

As the aryl group for $R^{5\prime\prime\prime}$ and $R^{6\prime\prime\prime}$, the same as the aryl groups for $R^{1\prime\prime\prime}$ to $R^{3\prime\prime\prime}$ can be used.

As the alkyl group for $R^{5\prime\prime\prime}$ and $R^{6\prime\prime\prime}$, the same as the alkyl groups for $R^{1\prime\prime\prime}$ to $R^{3\prime\prime\prime}$ can be used.

It is particularly desirable that both of $R^{5\prime\prime\prime}$ and $R^{6\prime\prime\prime}$ represents a phenyl group.

Specific examples of the cation moiety represented by general formula (b-2) include diphenyliodonium and bis(4-tert-butylphenyl)iodonium.

In formulas (b-1) and (b-2), $R^{4\prime\prime\prime}$ represents a linear, branched or cyclic alkyl group which may have a substituent or a linear, branched or cyclic fluorinated alkyl group which may have a substituent.

Examples of the substituent for $R^{4\prime\prime\prime}$ include a halogen atom, a hetero atom and an alkyl group.

The linear or branched alkyl group preferably has 1 to 10 carbon atoms, more preferably 1 to 8 carbon atoms, and most preferably 1 to 4 carbon atoms.

The cyclic alkyl group is preferably a cyclic group, as those mentioned above in relation to $R^{1\prime\prime\prime}$, having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms.

Further, the fluorination ratio of the fluorinated alkyl group (percentage of fluorine atoms within the alkyl group) is preferably from 10 to 100%, more preferably from 50 to 100%, and it is particularly desirable that all hydrogen atoms are substituted with fluorine atoms (namely, the fluorinated alkyl group is a perfluoroalkyl group) because the acid strength increases.

$R^{4\prime\prime\prime}$ is most preferably a linear or cyclic alkyl group or a fluorinated alkyl group.

Examples of the anion moiety for the onium salt-based acid generator represented by formula (b-1) or (b-2) include trifluoromethanesulfonate, heptafluoropropanesulfonate, nonafluorobutanesulfonate, methanesulfonate, n-propanesulfonate, n-butanesulfonate and n-octanesulfonate.

Further, onium salt-based acid generators in which the anion moiety in general formula (b-1) or (b-2) is replaced by an anion moiety represented by general formula (b-3) or (b-4) shown below (the cation moiety is the same as the cation moiety represented in formula (b-1) or (b-2)) may also be used.

[Chemical Formula 79]

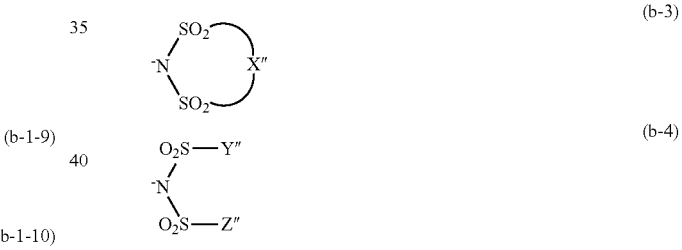

(b-3)

(b-4)

In formulas (b-3) and (b-4) above, X″ represents an alkylene group of 2 to 6 carbon atoms in which at least one hydrogen atom has been substituted with a fluorine atom; and each of Y″ and Z″ independently represents an alkyl group of 1 to 10 carbon atoms in which at least one hydrogen atom has been substituted with a fluorine atom.

X″ represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y″ and Z″ independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X″ or those of the alkyl group for Y″ and Z″ within the above-mentioned range of the number of carbon atoms, the more the solubility in a resist solvent is improved.

Further, in the alkylene group for X″ or the alkyl group for Y″ and Z″, it is preferable that the number of hydrogen atoms substituted with fluorine atoms is as large as possible because the acid strength increases and the transparency to high energy radiation of 200 nm or less or electron beam is improved.

The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Furthermore, as an onium salt-based acid generator, a sulfonium salt having a cation moiety represented by general formula (b-5) or (b-6) shown below may be used.

two or more of the individual $R^{91}$ to $R^{96}$ group may be the same or different from each other.

$n_0$ is preferably 0 or 1.

$n_1$ is preferably 0 to 2.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1.

Specific examples of preferable cation moieties represented by formula (b-5) or (b-6) are shown below.

[Chemical Formula 80]

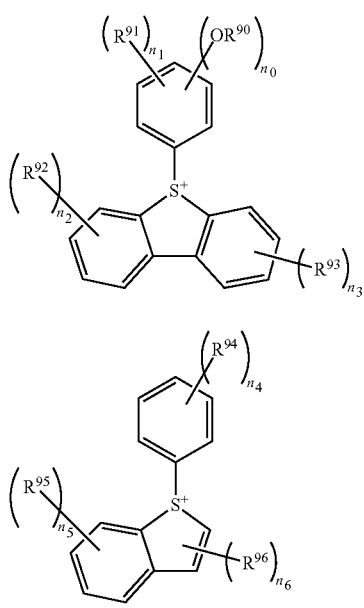

(b-5)

(b-6)

[Chemical Formula 81]

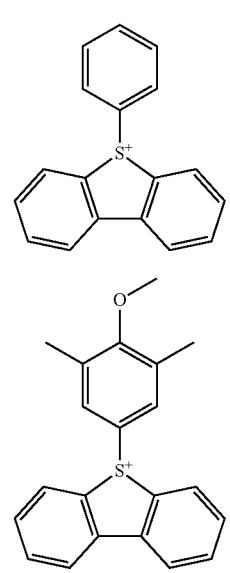

(b-5-1)

(b-5-2)

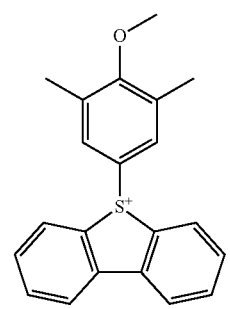

(b-5-3)

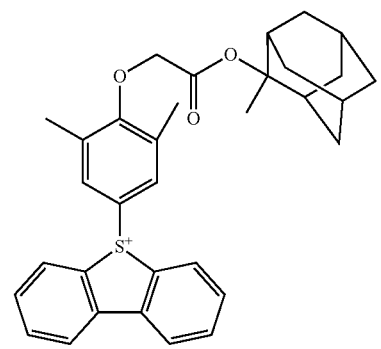

(b-5-4)

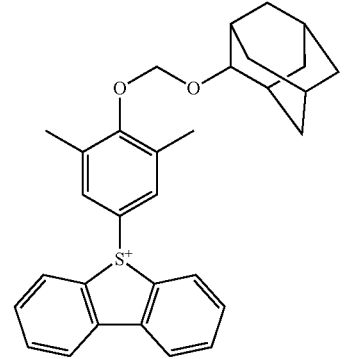

In the formulas, $R^{90}$ represents a hydrogen atom or an alkyl group; $R^{91}$ represents an alkyl group, an acetyl group, a carboxy group or a hydroxyalkyl group; each of $R^{92}$ to $R^{96}$ independently represents an alkyl group, an acetyl group, an alkoxy group, a carboxy group, or a hydroxyalkyl group; each of $n_0$ to $n_5$ independently represents an integer of 0 to 3, with the provision that $n_0+n_1$ is 5 or less; and $n_6$ represents an integer of 0 to 2.

In general formulas (b-5) and (b-6), with respect to $R^{90}$ to $R^{96}$, the alkyl group is preferably an alkyl group of 1 to 5 carbon atoms, more preferably a linear or branched alkyl group, and most preferably a methyl group, an ethyl group, a propyl group, an isopropyl group, an n-butyl group or a tert butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

If there are two or more of the $OR^{90}$ group, as indicated by the value of $n_0$, then the two or more of the $OR^{90}$ group may be the same or different from each other.

If there are two or more of an individual $R^{91}$ to $R^{96}$ group, as indicated by the corresponding value of $n_1$ to $n_6$, then the The anion moiety of the sulfonium salt having a cation moiety represented by general formula (b-5) or (b-6) as a cation moiety thereof is not particularly limited, and the same anion moieties for onium salt-based acid generators which have been proposed may be used.

Examples of such anion moieties include fluorinated alkylsulfonic acid ions such as anion moieties ($R^{4'''}SO_3^-$) for onium salt-based acid generators represented by general formula (b-1) or (b-2) shown above; and anion moieties represented by general formula (b-3) or (b-4) shown above.

Among these, a fluorinated alkylsulfonate ion is preferable, a fluorinated alkylsulfonate ion of 1 to 4 carbon atoms is more preferable, and a linear perfluoroalkylsulfonate ion of 1 to 4 carbon atoms is particularly desirable. Specific examples thereof include a trifluoromethylsulfonate ion, a heptafluoro-n-propanesulfonate ion and a nonafluoro-n-butanesulfonate ion.

In the present description, an oximesulfonate-based acid generator is a compound having at least one group represented by general formula (B-1) shown below, and has a feature of generating acid by irradiation. Such oxime-sulfonate acid generators are widely used for a chemically amplified resist composition, and can be appropriately selected.

[Chemical Formula 82]

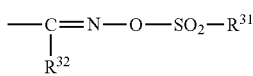

(B-1)

In the formula, each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 83]

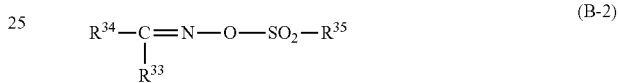

(B-2)

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 84]

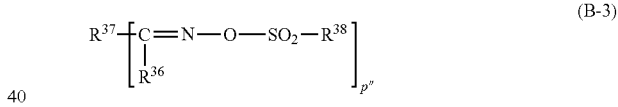

(B-3)

In the formula, $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate acid generators include

α-(p-toluenesulfonyloxyimino)-benzyl cyanide,
α-(p-chlorobenzenesulfonyloxyimino)-benzyl cyanide,
α-(4-nitrobenzenesulfonyloxyimino)-benzyl cyanide,
α-(4-nitro-2-trifluoromethylbenzenesulfonyloxyimino)-benzyl cyanide,
α-(benzenesulfonyloxyimino)-4-chlorobenzyl cyanide,
α-(benzenesulfonyloxyimino)-2,4-dichlorobenzyl cyanide,
α-(benzenesulfonyloxyimino)-2,6-dichlorobenzyl cyanide,
α-(benzenesulfonyloxyimino)-4-methoxybenzyl cyanide,
α-(2-chlorobenzenesulfonyloxyimino)-4-methoxybenzyl cyanide,
α-(benzenesulfonyloxyimino)-thien-2-yl acetonitrile,
α-(4-dodecylbenzenesulfonyloxyimino)benzyl cyanide,
α-[(p-toluenesulfonyloxyimino)-4-methoxyphenyl]acetonitrile,
α-[(dodecylbenzenesulfonyloxyimino)-4-methoxyphenyl] acetonitrile,
α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile,
α-(methylsulfonyloxyimino)-1-cycloheptenyl acetonitrile,
α-(methylsulfonyloxyimino)-1-cyclooctenyl acetonitrile,
α-(trifluoromethylsulfonyloxyimino)-1-cyclopentenyl acetonitrile,
α-(trifluoromethylsulfonyloxyimino)-cyclohexyl acetonitrile,
α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile,
α-(cyclohexylsulfonyloxyimino)-cyclohexyl acetonitrile,
α-(cyclohexylsulfonyloxyimino)-1-cyclopentenyl acetonitrile,
α-(ethylsulfonyloxyimino)-1-cyclopentenyl acetonitrile,
α-(isopropylsulfonyloxyimino)-1-cyclopentenyl acetonitrile,
α-(n-butylsulfonyloxyimino)-1-cyclopentenyl acetonitrile,
α-(ethylsulfonyloxyimino)-1-cyclohexenyl acetonitrile,
α-(isopropylsulfonyloxyimino)-1-cyclohexenyl acetonitrile,
α-(n-butylsulfonyloxyimino)-1-cyclohexenyl acetonitrile,
α-(methylsulfonyloxyimino)-phenyl acetonitrile,
α-(methylsulfonyloxyimino)-p-methoxyphenyl acetonitrile,
α-(trifluoromethylsulfonyloxyimino)-phenyl acetonitrile,
α-(trifluoromethylsulfonyloxyimino)-p-methoxyphenyl acetonitrile,
α-(ethylsulfonyloxyimino)-p-methoxyphenyl acetonitrile,
α-(propylsulfonyloxyimino)-p-methylphenyl acetonitrile, and
α-(methylsulfonyloxyimino)-p-bromophenyl acetonitrile.

Further, oxime sulfonate acid generators disclosed in Japanese Unexamined Patent Application, First Publication No. Hei 9-208554 (Chemical Formulas 18 and 19 shown in paragraphs [0012] to [0014]) and oxime sulfonate acid generators disclosed in WO 2004/074242A2 (Examples 1 to 40 described at pages 65 to 85) may be preferably used.

Furthermore, as preferable examples, the following can be used.

[Chemical Formula 85]

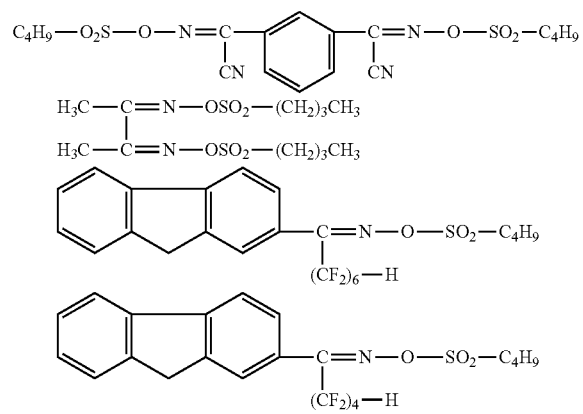

Of the aforementioned diazomethane acid generators, specific examples of suitable bisalkyl or bisaryl sulfonyl diazomethanes include bis(isopropylsulfonyl)diazomethane, bis (p-toluenesulfonyl)diazomethane, bis(1,1-dimethylethylsulfonyl)diazomethane, bis (cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis (phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis (cyclohexylsulfonyldiazomethylsulfonyl)ethane, 1,3-bis (cyclohexylsulfonyldiazomethylsulfonyl)propane, 1,6-bis (cyclohexylsulfonyldiazomethylsulfonyl)hexane, and 1,10-bis(cyclohexylsulfonyldiazomethylsulfonyl)decane, may be given.

As the component (B), one type of acid generator may be used, or two or more types of acid generators may be used in combination.

In the present invention, as the component (B), it is preferable to use an onium salt-based acid generator having a fluorinated alkylsulfonic acid ion as the anion moiety.

In the resist composition for immersion exposure according to the present invention, the amount of the component (B) relative to 100 parts by weight of the component (A) is preferably 0.5 to 60 parts by weight, more preferably 1 to 40 parts by weight, and most preferably 2 to 30 parts by weight. When the amount of the component (B) is within the above-mentioned range, formation of a resist pattern can be satisfactorily performed. Further, by virtue of the above-mentioned range, a uniform solution can be obtained and the storage stability becomes satisfactory.

<Component (S)>

The component (S) may be any organic solvent which can dissolve the respective components for the resist material to give a uniform solution, and one or more kinds of any organic solvent can be appropriately selected from those which have been conventionally known as solvents for a chemically amplified resist.

Component (S1)

As an example of the component (S), an alcohol-based organic solvent (hereafter, referred to as "component (S1)") can be given. In the present description, the term "alcohol-based organic solvent" refers to a compound in which at least one hydrogen atom within an aliphatic hydrocarbon has been substituted with a hydroxyl group, and is a liquid at normal temperature (room temperature) and normal pressure (atmospheric pressure). Here, the term "boiling point" refers to the normal boiling point measured under normal pressure.

Specific examples of the component (S1) having a chain-like structure include propylene glycol (PG; boiling point: 188° C.), 1-butoxy-2-propanol (BP; boiling point: 170° C.), n-hexanol (boiling point: 157.1° C.), 2-heptanol (boiling point: 160.4° C.), 3-heptanol (boiling point: 156.2° C.), 1-heptanol (boiling point: 176° C.), 5-methyl-1-hexanol (boiling point: 167° C.), 6-methyl-2-heptanol (boiling point: 171° C.), 1-octanol (boiling point: 196° C.), 2-octanol (boiling point: 179° C.), 3-octanol (boiling point: 175° C.), 4-octanol (boiling point: 175° C.), 2-ethyl-1-hexanol (boiling point: 185° C.), 2-(2-butoxyethoxy)ethanol (boiling point: 231° C.), n-pentylalcohol (boiling point: 138.0° C.), s-pentylalcohol (boiling point: 119.3° C.), t-pentylalcohol (boiling point: 101.8° C.), isopentylalcohol (boiling point: 130.8° C.), isobutanol (also called as isobutylalcohol or 2-methyl-1-propanol) (boiling point: 108° C.), isopropylalcohol (boiling point: 82.3° C.), 2-ethylbutanol (boiling point: 147° C.), neopentylalcohol (boiling point: 114° C.), n-butanol (boiling point: 117.7° C.), s-butanol (boiling point: 99.5° C.), t-butanol (boiling point: 82.5° C.), 1-propanol (boiling point: 97.2° C.), 2-methyl-1-butanol (boiling point: 128.0° C.), 2-methyl-2-butanol (boiling point: 112.0° C.) and 4-methyl-2-pentanol (boiling point: 132° C.).

Further, specific examples of the component (S1) having a ring structure include monohydric alcohols such as cyclopentane methanol (boiling point: 162° C.), 1-cyclopentylethanol (boiling point: 167° C.), cyclohexanol (boiling point: 160° C.), cyclohexane methanol (CM; boiling point: 183° C.), cyclohexane ethanol (boiling point: 205° C.), 1,2,3,6-tetrahydrobenzyl alcohol (boiling point: 191° C.), exo-norborneol (boiling point: 176° C.), 2-methylcyclohexanol (boiling point: 165° C.), cycloheptanol (boiling point: 185° C.), 3,5-dimethylcyclohexanol (boiling point: 185° C.), and benzyl alcohol (boiling point: 204° C.).

Among these examples, as the component (S1), those which have a high boiling point is preferable. More specifically, a solvent having a boiling point of 150° C. or higher is preferable, a solvent having a boiling point of 155° C. or higher is more preferable, and a solvent having a boiling point of 155 to 250° C. is most preferable.

When the component (S1) has a high boiling point, preferably at least 150° C., a resist material containing the component (F) and the like exhibits excellent solubility in the organic solvent (S) containing the component (S1). Further, the effect of enhancing the hydrophobicity of the resist film surface is further improved. In particular, by making the lower limit and upper limit of the boiling point at least 150° C. and no more than 250° C., respectively, properties of the resist composition in terms of coatability (wettability) to a substrate become excellent. Furthermore, because the resist material exhibits excellent solubility in the component (S1), the number of options (that is, the polymeric compounds which can be used as the component (A)) increases, which contributes to improvements in the lithographic properties. These advantages can also be achieved in the application of a double patterning process.

As the component (S1), a monohydric alcohol is preferable, and a primary or secondary monohydric alcohol is more preferable. Further, the component (S1) preferably has a ring structure composed of at least 5 carbon atoms (more preferably at least 7 carbon atoms) or a chain-like structure composed of at least 5 carbon atoms (more preferably at least 7 carbon atoms). The ring structure or chain-like structure described above may contain an ether bond within the structure.

With respect to the chain-like structure composed of at least 5 carbon atoms (more preferably at least 7 carbon atoms), it is even more preferable that the longest main chain containing an —OH group have at least 5 carbon atoms. The main chain may contain an ether bond within the structure.

It is particularly desirable that the component (S1) be a monohydric alcohol having a chain-like structure composed of at least 5 carbon atoms (more preferably at least 7 carbon atoms).

Here, the term "monohydric alcohol" refers to compounds in which the number of hydroxyl groups incorporated within the alcohol molecule is 1, and does not include dihydric alcohols, trihydric alcohols, or derivatives thereof.

Of these, monohydric alcohols having a chain-like structure are preferable, and 1-butoxy-2-propanol is particularly desirable.

In the resist composition for immersion exposure according to the present invention, as the component (S1), a mixed solvent containing a solvent having a boiling point of at least 150° C. (hereafter, referred to as "component (S1a)") and a solvent having a boiling point of lower than 150° C. (hereafter, referred to as "component (S1b)") may also be used favorably. When such a mixed solvent is used, the solubility of resist materials, especially that of the component (F) and the component (A) (preferably the resist material) is significantly enhanced, as compared to the case where the component (S1b) is used alone.

Examples of the combination of the component (S1a) and the component (S1b) include a combination of isobutanol and 1-butoxy-2-propanol, a combination of isobutanol and cyclohexanemethanol, and a combination of isobutanol and propyleneglycol.

The mixing ratio (weight ratio) of the component (S1a) to the component (S1b) (i.e., (S1a)/(S1b)) is preferably within a range from 1/99 to 99/1, more preferably from 5/95 to 95/5, and is most preferably from 10/90 to 90/10. When the ratio of the component (S1a) to the component (S1b) is within the above-mentioned range, the solubility of the resist materials and other properties can be improved even further.

Component (S2)

As the component (S), for example, an ether-based organic solvent having no hydroxyl group (hereafter, referred to as "component (S2)") may also be used.

Here, an "ether-based organic solvent having no hydroxyl group" refers to a compound that contains an ether bond (C—O—C) within the molecule but has no hydroxyl group, and is a liquid at normal temperature (room temperature) and normal pressure (atmospheric pressure).

Of the various possibilities, it is more preferable that the component (S2) be a compound having neither a hydroxyl group nor a carbonyl group.

Preferable examples of the component (S2) include compounds represented by general formula (s1'-1) shown below.

$$R^{74}\text{—}O\text{—}R^{75} \qquad (s1'\text{-}1)$$

In the formula, each of $R^{74}$ and $R^{75}$ independently represents a hydrocarbon group. Alternatively, $R^{74}$ and $R^{75}$ may be bonded to each other to form a ring. —O— represents an ether bond.

In general formula (s1'-1), as the hydrocarbon group for $R^{74}$ and $R^{75}$, for example, an alkyl group, an aryl group or the like can be mentioned, and an alkyl group is preferable. It is more preferable that both of $R^{74}$ and $R^{75}$ represent an alkyl group, and it is particularly desirable that $R^{74}$ and $R^{75}$ represent the same alkyl group.

The alkyl group for $R^{74}$ and $R^{75}$ is not particularly limited and includes, for example, a linear, branched or cyclic alkyl group having 1 to 20 carbon atoms. Part or all of the hydrogen atoms of the alkyl group may or may not be substituted with halogen atoms or the like.

The alkyl group preferably has 1 to 15 carbon atoms, and more preferably 1 to 10 carbon atoms, because the coatability of the resist composition becomes satisfactory. Specific examples include an ethyl group, a propyl group, an isopropyl group, an n-butyl group, an isobutyl group, an n-pentyl group, an isopentyl group, a cyclopentyl group and a hexyl group, and an n-butyl group and an isopentyl group are particularly desirable.

The halogen atom, with which hydrogen atoms of the alkyl group may be substituted, is preferably a fluorine atom.

The aryl group for $R^{74}$ and $R^{75}$ is not particularly limited. For example, an aryl group having 6 to 12 carbon atoms may be used in which part or all of the hydrogen atoms of the aryl group may or may not be substituted with alkyl groups, alkoxy groups, or halogen atoms.

The aryl group is preferably an aryl group having 6 to 10 carbon atoms because it can be synthesized at a low cost. Specific examples thereof include a phenyl group, a benzyl group and a naphthyl group.

The alkyl group, with which hydrogen atoms of the aryl group may be substituted, is preferably an alkyl group having 1 to 5 carbon atoms, and more preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and more preferably a methoxy group or an ethoxy group.

The halogen atom, with which hydrogen atoms of the aryl group may be substituted, is preferably a fluorine atom.

Alternatively, in general formula (s1'-1), $R^{74}$ and $R^{75}$ may be bonded to each other to form a ring.

In this case, $R^{74}$ and $R^{75}$ each independently represents a linear or branched alkylene group (preferably an alkylene group of 1 to 10 carbon atoms) and the terminal of $R^{74}$ and the terminal of $R^{75}$ are bonded to each other to form a ring. Further, a carbon atom of the alkylene group may be substituted with an oxygen atom.

Specific examples of such ether-based organic solvents include 1,8-cineole, tetrahydrofuran and dioxane.

The boiling point (at normal pressure (atmospheric pressure)) of the component (S2) is preferably within a range from 30 to 300° C., more preferably from 100 to 200° C., and still more preferably from 140 to 180° C. When the boiling point of the component (S2) is at least as large as the lower limit of the above-mentioned temperature range, the component (S) hardly evaporates during the spin coating process when applying a resist composition, thereby suppressing coating irregularities and improving the resulting coating properties. On the other hand, when the boiling point of the component (S2) is no more than the upper limit of the above-mentioned temperature range, the component (S) is satisfactorily removed from the resist film by a prebake (PAB) treatment, thereby improving formability of the resist film. Further, when the boiling point of the component (S2) is within the above-mentioned temperature range, the effect of reducing the thickness loss of the resist patterns and the stability of the composition upon storage are further improved. The above-mentioned temperature range for the boiling point of the component (S2) is also preferable from the viewpoints of the heating temperature required in the PAB step and/or post exposure baking (PEB) step.

Specific examples of the component (S2) include 1,8-cineole (boiling point: 176° C.), dibutyl ether (boiling point: 142° C.), diisopentyl ether (boiling point: 171° C.), dioxane (boiling point: 101° C.), anisole (boiling point: 155° C.), ethylbenzyl ether (boiling point: 189° C.), diphenyl ether (boiling point: 259° C.), dibenzyl ether (boiling point: 297° C.), phenetole (boiling point: 170° C.), butylphenyl ether, tetrahydrofuran (boiling point: 66° C.), ethylpropyl ether (boiling point: 63° C.), diisopropyl ether (boiling point: 69° C.), dihexyl ether (boiling point: 226° C.), dipropyl ether (boiling point: 91° C.), and cresylmethyl ether.

The component (S2) is preferably a cyclic or chain-like, ether-based organic solvent because the effect of reducing the thickness loss of the resist patterns and the like becomes satisfactory, and it is particularly desirable that the component (S2) be at least one member selected from the group consisting of 1,8-cineole, dibutyl ether and diisopentyl ether.

Component (S3)

Further, as the component (S), an organic solvent other than the component (S1) and the component (S2) (hereafter, this organic solvent is referred to as "component (S3)") may also be used.

By using the component (S3), the solubility of the resist materials and lithography properties can be adjusted.

Specific examples of the component (S3) include lactones such as γ-butyrolactone; ketones such as acetone, methyl ethyl ketone, cyclohexanone, methyl-n-pentyl ketone, methyl isopentyl ketone, and 2-heptanone; polyhydric alcohols other than the component (S1); compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA, boiling point: 146° C.) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as ethylbenzene, diethylbenzene, pentylbenzene, isopropylbenzene, toluene, xylene, cymene and mesitylene; and dimethylsulfoxide (DMSO).

As the component (S), one type may be used alone, or two or more types may be used in combination.

In the resist composition for immersion exposure according to the present invention, it is technically significant that, even when the component (S1) is selected from the aforementioned examples, the component (F) can be sufficiently dissolved, and the effect of enhancing the hydrophobicity of the resist film can be satisfactorily achieved.

The total amount of the component (S) used is not particularly limited, and is appropriately adjusted to a concentration which enables coating of the resist composition for immersion exposure according to the present invention to a substrate, depending on the thickness of the coating film. In general, the component (S) is preferably used in an amount such that the solid content of the resist composition becomes within the range from 1 to 20% by weight, and more preferably from 2 to 15% by weight.

Dissolving of the resist materials in the component (S) can be conducted by simply mixing and stirring each of the above components together using conventional methods, and where required, the composition may also be mixed and dispersed using a dispersion device such as a dissolver, a homogenizer, or a triple roll mill. Furthermore, following mixing, the composition may also be filtered using a mesh, or a membrane filter or the like.

<Optional Components>

[Component (C)]

When the resist composition for immersion exposure according to the present invention is a negative resist composition, it is preferable that the component (A) includes the component (A2-1), and the resist composition further include a cross-linking agent (C) (hereafter, referred to as "component (C)").

There are no particular limitations on the component (C), which may be selected appropriately from the various cross-linkers used within conventional chemically amplified negative resist compositions.

Specific examples include aliphatic cyclic hydrocarbons containing a hydroxyl group and/or a hydroxyalkyl group, or oxygen-containing derivatives thereof, such as 2,3-dihydroxy-5-hydroxymethylnorbornane, 2-hydroxy-5,6-bis(hydroxymethyl)norbornane, cyclohexanedimethanol, 3,4,8 (or 9)-trihydroxytricyclodecane, 2-methyl-2-adamantanol, 1,4-dioxane-2,3-diol, and 1,3,5-trihydroxycyclohexane.

Furthermore, other examples include compounds produced by reacting an amino group-containing compound such as melamine, acetoguanamine, benzoguanamine, urea, ethylene urea, propylene urea or glycoluril with either formaldehyde or a combination of formaldehyde and a lower alcohol, thereby substituting the hydrogen atoms of the amino group with hydroxymethyl groups or lower alkoxymethyl groups; and compounds having an epoxy group.

Of these, compounds that use melamine are referred to as melamine-based cross-linkers, compounds that use urea are referred to as urea-based cross-linkers, compounds that use an alkylene urea such as ethylene urea or propylene urea are referred to as alkylene urea-based cross-linkers, compounds that use glycoluril are referred to as glycoluril-based cross-linkers, and compounds that use a compound having an epoxy group are referred to as epoxy-based cross-linkers.

As the component (C), at least one type of cross-linker selected from the group consisting of melamine-based cross-linkers, urea-based cross-linkers, alkylene urea-based cross-linkers, glycoluril-based cross-linkers and epoxy-based cross-linkers is preferred, and a glycoluril-based cross-linker is particularly desirable.

Examples of the melamine-based cross-linkers include compounds obtained by reacting melamine with formaldehyde, thereby substituting the hydrogen atoms of the amino group with hydroxymethyl groups, and compounds obtained by reacting melamine with formaldehyde and a lower alcohol, thereby substituting the hydrogen atoms of the amino group with lower alkoxymethyl groups. Specific examples include hexamethoxymethylmelamine, hexaethoxymethylmelamine, hexapropoxymethylmelamine and hexabutoxybutylmelamine, and of these, hexamethoxymethylmelamine is preferred.

Examples of the urea-based cross-linkers include compounds obtained by reacting urea with formaldehyde, thereby substituting the hydrogen atoms of the amino group with hydroxymethyl groups, and compounds obtained by reacting urea with formaldehyde and a lower alcohol, thereby substituting the hydrogen atoms of the amino group with lower alkoxymethyl groups. Specific examples include bismethoxymethylurea, bisethoxymethylurea, bispropoxymethylurea and bisbutoxymethylurea, and of these, bismethoxymethylurea is preferred.

Examples of the alkylene urea-based cross-linkers include compounds represented by general formula (C-1) shown below.

[Chemical Formula 86]

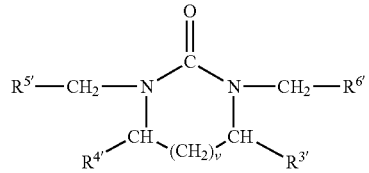

(C-1)

In general formula (C-1), $R^{5'}$ and $R^{6'}$ each independently represent a hydroxyl group or a lower alkoxy group; $R^{3'}$ and $R^{4'}$ each independently represents a hydrogen atom, a hydroxyl group or a lower alkoxy group, and v represents 0 or an integer of 1 to 2.

The lower alkoxy group for $R^{5'}$ and $R^{6'}$ may be either a linear or branched group, and is preferably an alkoxy group of 1 to 4 carbon atoms. $R^{5'}$ and $R^{6'}$ may be the same or different, and are preferably the same.

The lower alkoxy group for $R^{3'}$ and $R^{4'}$ may be either a linear or branched group, and is preferably an alkoxy group of 1 to 4 carbon atoms. $R^{3'}$ and $R^{4'}$ may be the same or different, and are preferably the same.

v is either 0 or an integer from 0 to 2, and is preferably 0 or 1.

As the alkylene urea-based cross-linker, compounds in which v is 0 (ethylene urea-based cross-linkers) and/or compounds in which v is 1 (propylene urea-based cross-linkers) are preferred.

Compounds represented by general formula (C-1) can be obtained by a condensation reaction between an alkylene urea and formalin, and by further reacting the resulting product with a lower alcohol.

Specific examples of the alkylene urea-based cross-linkers include ethylene urea-based cross-linkers such as mono- and/or di-hydroxymethylated ethylene urea, mono- and/or di-methoxymethylated ethylene urea, mono- and/or di-ethoxymethylated ethylene urea, mono- and/or di-propoxymethylated ethylene urea, and mono- and/or di-butoxymethylated ethylene urea; propylene urea-based cross-linkers such as mono- and/or di-hydroxymethylated propylene urea, mono- and/or di-methoxymethylated propylene urea, mono- and/or di-ethoxymethylated propylene urea, mono- and/or di-propoxymethylated propylene urea, and mono- and/or di-butoxymethylated propylene urea; as well as 1,3-di(methoxymethyl)-4,5-dihydroxy-2-imidazolidinone, and 1,3-di(methoxymethyl)-4,5-dimethoxy-2-imidazolidinone.

Examples of the glycoluril-based cross-linkers include glycoluril derivatives in which the N-position is substituted with one or both of a hydroxyalkyl group and an alkoxyalkyl group of 1 to 4 carbon atoms. These glycoluril derivatives can be obtained by a condensation reaction between glycoluril and formalin, and by further reacting the resulting product with a lower alcohol.

Specific examples of the glycoluril-based cross-linkers include mono-, di-, tri- and/or tetra-hydroxymethylated glycoluril, mono-, di-, tri- and/or tetra-methoxymethylated glycoluril, mono-, di-, tri- and/or tetra-ethoxymethylated glycoluril, mono-, di-, tri- and/or tetra-propoxymethylated glycoluril, and mono-, di-, tri- and/or tetra-butoxymethylated glycoluril.

There are no particular restrictions on the epoxy-based cross-linkers, and any cross-linker having an epoxy group may be used. Of such cross-linkers, those having two or more epoxy groups are preferred. Including two or more epoxy groups improves the cross-linking reaction.

The number of epoxy groups is preferably at least two, more preferably from 2 to 4, and is most preferably 2.

Preferred examples of the epoxy-based cross-linkers are shown below.

[Chemical Formula 87]

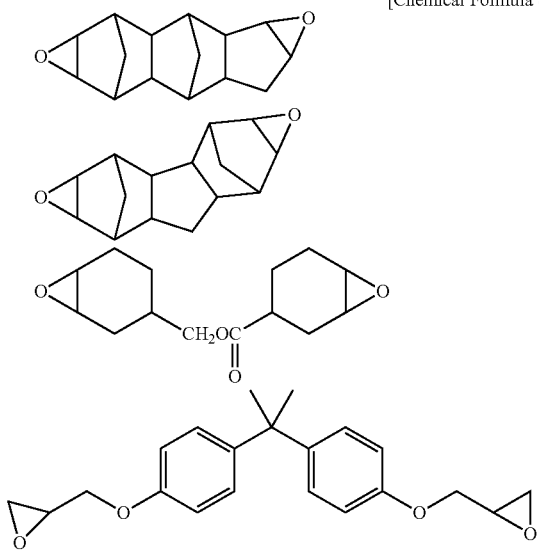

As the component (C), one type of cross-linker may be used alone, or two or more types may be used in combination.

The amount of the component (C) relative to 100 parts by weight of the component (A) is preferably within a range from 1 to 50 parts by weight, more preferably from 3 to 30 parts by weight, still more preferably from 3 to 15 parts by weight, and most preferably from 5 to 10 parts by weight. By ensuring that the quantity of the component (C) is at least as large as the lower limit of the above-mentioned range, the formation of cross-linking is able to proceed favorably, and a favorable resist pattern with minimal swelling is obtained. On the other hand, by ensuring that the quantity is not more than the upper limit of the above-mentioned range, the storage stability of the resist coating liquid improves, and deterioration over time in the sensitivity can be suppressed.

[Component (D)]

It is preferable that the resist composition for immersion exposure according to the present invention further includes a nitrogen-containing organic compound (D) (hereafter referred to as the component (D)) as an optional component.

As the component (D), there is no particular limitation as long as it functions as an acid diffusion control agent, i.e., a quencher which traps the acid generated from the component (B) upon exposure. A multitude of these components (D) have already been proposed, and any of these known compounds may be used, although an aliphatic amine, and particularly a secondary aliphatic amine or tertiary aliphatic amine is preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine.

Among these, an alkylalcoholamine or a trialkylamine of 5 to 10 carbon atoms is particularly desirable. Among alkylalcoholamines, triethanolamine and triisopropanolamine are preferable. Among trialkylamines of 5 to 10 carbon atoms, tri-n-pentylamine is particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

As the component (D), one type of compound may be used alone, or two or more types may be used in combination.

The component (D) is typically used in an amount within a range from 0.01 to 5.0 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

[Component (E)]

Furthermore, in the resist composition for immersion exposure according to the present invention, for preventing any deterioration in sensitivity, and improving the resist pattern shape and the post exposure stability of the latent image formed by the pattern-wise exposure of the resist layer, at least one compound (E) (hereafter referred to as "component (E)") selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

The component (E) is typically used in an amount within a range from 0.01 to 5.0 parts by weight, relative to 100 parts by weight of the component (A).

If desired, other miscible additives can also be added to the resist composition for immersion exposure according to the present invention. Examples of such miscible additives include additive resins for improving the performance of the resist film, surfactants for improving the applicability, dissolution inhibitors, plasticizers, stabilizers, colorants, halation prevention agents, and dyes.

As described above, by using the resist composition for immersion exposure according to the first aspect of the present invention, resist materials exhibit excellent solubility. As a result, the fluorine-containing resin and the like can be satisfactorily dissolved in an organic solvent, and for example, the effect of enhancing the hydrophobicity of the resist film surface can be improved.

The reason why such effects can be achieved has not been elucidated yet, but is presumed as follows. By virtue of the fluorine-containing resin component (the component (F)) including a structural unit (f1) containing a fluorine atom, and also a structural unit (f2) containing a hydrophilic group-containing aliphatic hydrocarbon group and a structural unit (f3) represented by general formula (f3-1) being blended within the resist composition for immersion exposure according to the present invention, the resist composition exhibits a high affinity for various organic solvents, and the solubility thereof in the organic solvent is improved. Therefore, the component (F) can be added to resist compositions containing various types of organic solvents.

Moreover, the resist composition for immersion exposure according to the first aspect of the present invention also exhibits excellent wettability when applied to a substrate.

Furthermore, by the resist composition for immersion exposure according to the present invention, film formability becomes satisfactory when forming a resist film on a substrate, and also both coating irregularities and generation of striations can be suppressed.

The resist composition for immersion exposure according to the present invention has the properties required for a resist composition used in immersion lithography, namely, favorable lithography properties and favorable properties (particularly hydrophobicity/hydrophilicity) for use within an immersion exposure process, and can therefore be used favorably for immersion exposure.

By including the component (F), a resist film formed using the resist composition for immersion exposure according to the present invention has a characteristic feature of exhibiting hydrophobicity during immersion exposure, but then exhibiting increased hydrophilicity due to various treatments (such as post exposure baking (PEB) treatment and alkali developing).

That is, a resist film formed using the resist composition for immersion exposure according to the present invention includes the fluorine atom-containing component (F), and therefore has a higher level of hydrophobicity prior to exposure than a resist film that does not include the component (F). Such a resist film formed using the resist composition for immersion exposure according to the present invention exhibits an extremely favorable water tracking ability, which is required when the immersion exposure is performed using a scanning-type immersion exposure apparatus such as that disclosed in Non-Patent Document 1.

When this resist film is subjected to a PEB treatment following immersion exposure, acid is generated from the component (B) in the exposed portions of the resist film, and the action of that acid causes a change in the solubility of the component (A), and eventually that of the resist film, in alkali developing solutions.

Further, when alkali developing is conducted, the exposed portions are removed in the case of the positive composition, and the unexposed portions are removed in the case of the negative composition, in either case leading to the formation of a resist pattern.

The hydrophobicity of a resist film can be evaluated by measuring the contact angle thereof against water, for example, the static contact angle (the contact angle between the surface of a water droplet on the resist film in a horizontal state and the resist film surface), the dynamic contact angle (the contact angle at which a water droplet starts to slide when the resist film is inclined (sliding angle), the contact angle at the front-end point of the water droplet in the sliding direction (advancing angle) and the contact angle at the rear-end point of the water droplet in the sliding direction (receding angle)). For example, the higher the hydrophobicity of a resist film, the higher the static angle, advancing angle, and receding angle and the smaller the sliding angle.

As shown in FIG. 1, when a flat surface 2 with a liquid droplet 1 placed thereon is gradually inclined, the advancing angle describes the angle $\theta 1$ between the surface of the liquid droplet at the bottom edge 1*a* of the liquid droplet 1 and the flat surface 2 when the liquid droplet 1 starts to move (slide) down the flat surface 2. Further, at this point (the point when the liquid droplet 1 starts to move (slide) down the flat surface 2), the angle $\theta 2$ between the surface of the liquid droplet at the top edge 1b of the liquid droplet 1 and the flat surface 2 is the receding angle, and the inclination angle θ3 of the flat surface 2 is the sliding angle.

In the present description, the advancing angle, receding angle and sliding angle are measured in the following manner.

First, a resist composition solution is spin-coated onto a silicon substrate, and then heated at a temperature of 110° C. for 60 seconds to form a resist film. Subsequently, the contact angles can be measured using commercially available measurement apparatuses such as DROP MASTER-700 (product name; manufactured by Kyowa Interface Science Co. Ltd.), AUTO SLIDING ANGLE: SA-30 DM (product name; manufactured by Kyowa Interface Science Co. Ltd.), and AUTO DISPENSER: AD-31 (product name; manufactured by Kyowa Interface Science Co. Ltd.).

For a resist film obtained using the resist composition for immersion exposure according to the present invention, the static contact angle measured prior to immersion exposure and developing is preferably 65 degrees or more, more preferably from 65 to 100 degrees, and most preferably from 75 to 100 degrees. When the static contact angle is at least as large as the lower limit of the above-mentioned range, the suppression effect on substance elution during the immersion exposure is enhanced. The reason for this has not been elucidated yet, but it is presumed that one of the main reasons is related to the hydrophobicity of the resist film. More specifically, it is presumed that since an aqueous substance such as water is used as the immersion medium, higher hydrophobicity has an influence on the swift removal of the immersion medium from the surface of the resist film after the immersion exposure. On the other hand, when the static contact angle is no higher than the upper limit of the above-mentioned range, the lithography properties become satisfactory.

For similar reasons, for a resist film obtained using the resist composition for immersion exposure according to the present invention, the receding angle measured prior to immersion exposure and developing is preferably 50 degrees or more, more preferably from 50 to 150 degrees, still more preferably 50 to 130 degrees, and most preferably from 53 to 100 degrees.

Furthermore, for a resist film obtained using the resist composition for immersion exposure according to the present invention, the sliding angle measured prior to immersion exposure and developing is preferably no more than 30 degrees, more preferably from 5 to 28 degrees, still more preferably from 5 to 25 degrees, and most preferably from 5 to 23 degrees. When the sliding angle is no more than the upper limit of the above-mentioned range, the effect of suppressing the elution of a substance during immersion exposure is enhanced. On the other hand, when the sliding angle is at least as large as the lower limit of the above-mentioned range, the lithography properties become satisfactory.

The level of the various angles described above (the dynamic contact angles (advancing angle, receding angle, and sliding angle) and the static contact angle) can be adjusted by the formulation for the resist composition for immersion exposure, for example by varying the type or amount of the component (F) and varying the type of the component (A). For example, by increasing the amount of the component (F), the hydrophobicity of the obtained resist composition can be enhanced, and the advancing angle, receding angle and static contact angle becomes large, whereas the sliding angle becomes small.

Further, by using the resist composition for immersion exposure according to the present invention, elution of a substance from the resist film during immersion exposure can be suppressed.

That is, as described later in detail, immersion exposure is a method in which exposure (immersion exposure) is conducted in a state where the region between the lens and the resist layer formed on a wafer (which is conventionally filled with air or an inert gas such as nitrogen) is filled with a solvent (an immersion medium) that has a larger refractive index than the refractive index of air. In immersion exposure, when the resist film comes into contact with the immersion medium, elution of substances within the resist film (component (B), component (D), and the like) into the immersion medium occurs. This elution of a substance causes phenomenon such as degeneration of the resist film and change in the refractive index of the immersion medium, thereby adversely affecting the lithography properties. The amount of the eluted substance is affected by the properties of the resist film surface (e.g., hydrophilicity, hydrophobicity, and the like). For example, by enhancing the hydrophobicity of the resist film surface, it is presumed that this substance elution can be reduced.

Since a resist film formed using the resist composition for immersion exposure according to the present invention includes the fluorine atom-containing component (F), the resist film exhibits a higher level of hydrophobicity prior to conducting exposure and developing than a resist film that does not include the component (F). Therefore, it is presumed that the resist composition for immersion exposure according to the present invention can suppress substance elution during immersion exposure.

Since substance elution can be suppressed, by using the resist composition for immersion exposure according to the present invention, phenomena such as degeneration of the resist film and change in the refractive index of the immersion medium, which occur during immersion exposure, can be suppressed. Further, as variation in the refractive index of the immersion medium can be suppressed, a resist pattern having an excellent shape can be formed. Furthermore, the level of contamination of the lens within the exposure apparatus can be lowered. Therefore, there is no need for protection against these disadvantages, and hence, the present invention can contribute to simplifying the process and the exposure apparatus.

In addition, a resist film formed using the resist composition for immersion exposure according to the present invention swells very little when exposed to water. Therefore, a very fine resist pattern can be formed with a high level of precision.

Also, the resist composition for immersion exposure according to the present invention exhibits excellent lithography properties with respect to sensitivity, resolution, resist pattern shape, exposure margin, mask reproducibility (mask linearity), etching resistance and the like, and is capable of forming a resist pattern without any practical problems when used as a resist for immersion exposure. For example, by using the resist composition for immersion exposure according to the present invention, a very fine resist pattern with a size of, for example, 120 nm or smaller can be formed.

As described above, the resist composition for immersion exposure according to the present invention exhibits various properties required for a resist material for use in immersion exposure. Therefore, the resist composition of the present invention can be preferably used for immersion exposure.

Furthermore, the component (F) is useful as an additive for a resist composition for immersion exposure.

<<Method of Forming a Resist Pattern>>

The method of forming a resist pattern according to the present invention includes: forming a resist film on a substrate using the resist composition for immersion exposure according to the first aspect of the present invention, subjecting the resist film to immersion exposure, and subjecting the resist film to alkali developing to form a resist pattern.

A preferable example of the method of forming a resist pattern according to the present invention is described below.

Firstly, a resist composition for immersion exposure according to the present invention is applied onto a substrate using a spinner or the like, and a prebake (post applied bake (PAB)) is conducted to form a resist film.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass Suitable materials for the wiring pattern include copper, aluminum, nickel, and gold.

Further, as the substrate, any one of the above-mentioned substrates provided with an inorganic and/or organic film on the surface thereof may also be used.

As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed. The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film.

After formation of a resist film, an organic antireflection film may be provided on the resist film, thereby forming a triple layer laminate consisting of the substrate, the resist film and the antireflection film. The anti-reflection film provided on top of the resist film is preferably soluble in an alkali developing solution.

The steps up until this point can be conducted by using conventional techniques. The operating conditions and the like are preferably selected appropriately in accordance with the formulation and the characteristics of the resist composition for immersion exposure being used.

Subsequently, the obtained resist film is subjected to selective immersion exposure (liquid immersion lithography) through a desired mask pattern. At this time, the region between the resist film and the lens at the lowermost point of the exposure apparatus is pre-filled with a solvent (immersion medium) that has a larger refractive index than the refractive index of air, and the exposure (immersion exposure) is conducted in this state.

There are no particular limitations on the wavelength used for the exposure, and an ArF excimer laser, KrF excimer laser or $F_2$ excimer laser or the like can be used. The resist composition according to the present invention is effective for KrF or ArF excimer lasers, and is particularly effective for ArF excimer lasers.

The immersion medium preferably exhibits a refractive index larger than the refractive index of air but smaller than the refractive index of the resist film formed from the resist composition for immersion exposure. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

A resist composition for immersion exposure according to the present invention is particularly resistant to any adverse effects caused by water, and because the resulting lithography properties such as sensitivity and shape of the resist pattern are excellent, water is preferably used as the immersion medium which exhibits a refractive index that is larger than the refractive index of air. Furthermore, water is also preferred in terms of cost, safety, environmental friendliness, and versatility.

Subsequently, following completion of the immersion exposure step, post exposure baking (PEB) is conducted. A PEB treatment is typically conducted at a temperature of 80 to 150° C. for 40 to 120 seconds, preferably 60 to 90 seconds.

Subsequently, developing is conducted using an alkali developing solution composed of an aqueous alkali solution such as a 0.1 to 10% by weight aqueous solution of tetramethylammonium hydroxide (TMAH).

Thereafter, a water rinse is preferably conducted with pure water. This water rinse can be conducted by dripping or spraying water onto the surface of the substrate while rotating the substrate, and washes away the developing solution and those portions of the resist composition for immersion exposure that have been dissolved by the developing solution.

By subsequently drying the resist, a resist pattern is obtained in which the resist film (the coating of the resist composition for immersion exposure) has been patterned into a shape faithful to the mask pattern.

The method of forming a resist pattern according to the present invention is also applicable to a double exposure method or a double patterning method.

As a double patterning method, for example, there can be mentioned a method including applying a positive resist composition on a substrate to form a first resist film on the substrate; subjecting the first resist film to selective exposure and alkali developing to form a first resist pattern; applying the positive resist composition of the present invention on the substrate on which the first resist pattern is formed to form a second resist film; and subjecting the second resist film to selective exposure and alkali developing to form a resist pattern. The resist composition of the present invention is applicable to both of the first resist composition and the second resist composition. When the resist composition of the present invention is used as a second resist composition, it is preferable to use the component (S1) or the component (S2) as the component (S), and the component (S1) is particularly desirable.

In the present invention, for example, when a line and space pattern is formed as a first resist pattern, in the following step of subjecting the second resist film to selective exposure, a line and space pattern intersecting the first line and space pattern can be formed, i.e., a cross-line patterning can be performed, to thereby form a hole pattern or a lattice pattern.

<<Fluorine-Containing Resin>>

The fluorine-containing resin of the present invention includes a structural unit (f1) containing a fluorine atom, a structural unit (f2) containing a hydrophilic group-containing aliphatic hydrocarbon group, and a structural unit (f3) represented by general formula (f3-1) shown below.

The fluorine-containing resin is the same as the component (F) described above in the explanation of the resist composition for immersion exposure according to the first aspect.

[Chemical Formula 88]

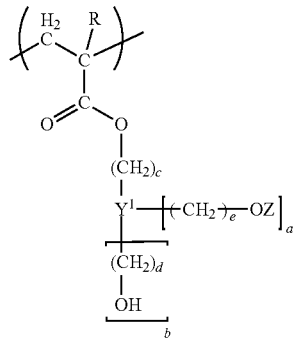

(f3-1)

In general formula (f3-1), R represents a hydrogen atom, a lower alkyl group of 1 to 5 carbon atoms or a halogenated lower alkyl group of 1 to 5 carbon atoms; $Y^1$ represents an aliphatic cyclic group; Z represents a tertiary alkyl group-containing group or an alkoxyalkyl group; a represents an integer of 1 to 3, and b represents an integer of 0 to 2, with the provision that a+b=1 to 3; and each of c, d and e independently represents an integer of 0 to 3.

In general formula (f3-1), R, $Y^1$, Z and a to e are respectively the same as defined for R, $Y^1$, Z, and a to e described above in the explanation of the structural unit (f3) for the aforementioned component (F).

In the fluorine-containing resin of the present invention, it is preferable that the structural unit (f1) is a structural unit represented by general formula (f1-1-1) shown below.

[Chemical Formula 89]

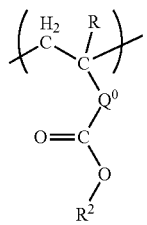

(f1-1-1)

In formula (f1-1-1), R represents a hydrogen atom, a lower alkyl group of 1 to 5 carbon atoms or a halogenated lower alkyl group of 1 to 5 carbon atoms; $Q^0$ represents a single bond or a divalent linking group; and $R^2$ represents an organic group having a fluorine atom.

In general formula (f1-1-1), R, $Q^0$ and $R^2$ are respectively the same as defined for R, $Q^0$ and $R^2$ described above in the explanation of the structural unit (f1) for the aforementioned component (F).

Further, in the fluorine-containing resin of the present invention, it is preferable that the structural unit (f2) is a structural unit derived from an acrylate ester containing a hydrophilic group-containing aliphatic hydrocarbon group.

The aforementioned structural unit is the same as defined for the structural unit (f2) for the component (F).

The fluorine-containing resin of the present invention can be produced, for example, by a conventional radical polymerization or the like of the monomers corresponding with each of the structural units that constitute the fluorine-containing resin, using a radical polymerization initiator such as azobisisobutyronitrile (AIBN) or dimethyl 2,2'-azobis(isobutyrate) (V-601).

The fluorine-containing resin described above is a novel compound that was essentially unknown in the art.

Further, the fluorine-containing resin can be used favorably as an additive for a resist composition, and a resist composition containing the added fluorine-containing resin is useful as a resist composition for immersion exposure.

There are no particular limitations on the resist composition containing the added fluorine-containing compound, and a composition which can be used for immersion exposure is preferable, and a chemically amplified resist composition obtained by dissolving a base component that exhibits changed solubility in an alkali developing solution under the action of acid and an acid generator component that generates acid upon irradiation in an organic solvent is ideal.

The fluorine-containing resin of the present invention is particularly ideal for use as an additive within the resist composition for immersion exposure.

EXAMPLES

As follows is a description of examples of the present invention, although the scope of the present invention is by no way limited by these examples.

<Synthesis of Fluorine-Containing Resin (F)>

Copolymers (F-1-1) to (F-1-7) used as the component (F) in the examples were synthesized by using the respective monomers (1) to (6) represented by chemical formulas shown below, as described in the following synthesis example described in Example 1.

Monomer (1), monomer (5) and monomer (6) were respectively synthesized in accordance with the following Synthesis Examples 1 to 3.

[Chemical Formula 90]

Monomer (1)

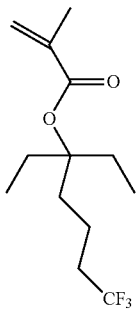

Monomer (2)

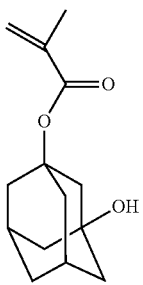

Monomer (3)

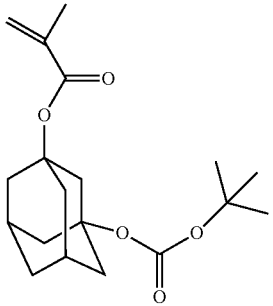

Monomer (4)

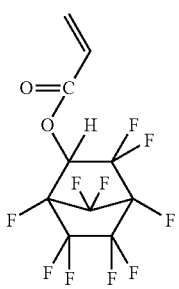

Monomer (5)

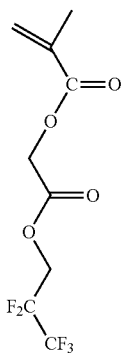

-continued

Monomer (6)

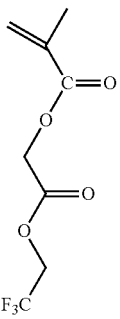

Synthesis Example 1

Synthesis of Monomer (1)

(i) Synthesis of 7,7,7-trifluoro-3-ethyl-3-heptanol 1.3 g of magnesium, 10.0 g of 1-bromo-4,4,4-trifluorobutane and 20 g of tetrahydrofuran were added to a four-necked flask equipped with a nitrogen feeding pipe, a reflux condenser, a dropping funnel and a thermometer, and a Grignard reagent was prepared by a conventional method. Then, a mixture containing 5.0 g of 3-pentanone and 4 g of tetrahydrofuran was dropwise added to the obtained Grignard reagent at a temperature of 25 to 35° C. over 30 minutes, followed by stirring at the same temperature for 1 hour. The reaction mixture was treated by a conventional method, and the resulting organic phase was washed with water, followed by drying with anhydrous magnesium sulfate. Thereafter, the resultant was concentrated under reduced pressure, thereby obtaining 7.9 g of 7,7,7-trifluoro-3-ethyl-3-heptanol in the form of a pale yellow oily matter.

(ii) Synthesis of 7,7,7-trifluoro-3-ethyl-3-heptyl methacrylate 7.9 g of 7,7,7-trifluoro-3-ethyl-3-heptanol obtained above, 0.2 g of 4-dimethylaminopyridine, 7.1 g of triethylamine and 10 g of acetonitrile were added to a four-necked flask equipped with a stirrer, a thermometer and a dropping funnel, and were dissolved by stirring.

Subsequently, 6.7 g of methacrylic acid chloride was dropwise added to the resulting solution at about 75° C. over 30 minutes, followed by stirring at the same temperature for 2 hours. Then, the reaction mixture was cooled to room temperature, and washing was conducted once with a mixture containing 8.8 g of potassium carbonate and 100 ml of water, and once with a 10 weight % saline solution. Thereafter, the resultant was dried with anhydrous magnesium sulfate, and then concentrated under reduced pressure. The obtained concentrate was purified by silica gel column chromatography, thereby obtaining 5.7 g of a monomer (1) (7,7,7-trifluoro-3-ethyl-3-heptyl methacrylate).

The monomer (1) was analyzed by $^1$H-NMR. The results are shown below.

$^1$H-NMR (CDCl$_3$) δ: 0.82-0.87 (tr, 6H, —CH$_3$), 1.46-1.58 (m, 2H, —CH$_2$—), 1.78-1.97 (m, 9H, =C—CH$_3$, —C—CH$_2$—), 1.98-2.16 (m, 2H, CF$_3$CH$_2$—), 5.49 (s, 1H, C=CH$_2$), 6.01 (s, 1H, C=CH$_2$)

From the results above, it was confirmed that the obtained compound was the monomer (1) represented by the chemical formula above.

Synthesis Example 2

Synthesis of Monomer (5)

61 g (600 mmol) of triethylamine and 64 g (418 mmol) of methyl bromoacetate were added to 300 ml of a THF solution containing 30 g (348 mmol) of methacrylic acid in a nitrogen atmosphere at 0° C., and the temperature was elevated to room temperature, followed by stirring for 3 hours. After conducting thin-layer chromatography (TLC) to confirm that the raw materials had been consumed, the reaction solution was subjected to distillation under reduced pressure to remove the solvent. Then, water was added to the resultant, and extraction was conducted with ethyl acetate three times. The resulting organic phase was washed with water twice, and then subjected to distillation under reduced pressure to remove the solvent, thereby obtaining 47 g of a compound (5)-1 in the form of a colorless liquid (yield: 85%).

Subsequently, 700 ml of a THF solution containing 30 g (190 mmol) of the compound (5-1) was prepared, and 700 ml of a 2.38% by weight aqueous solution of TMAH was added thereto, followed by stirring at room temperature for 3 hours. After conducting thin-layer chromatography (TLC) to confirm that the raw materials had been consumed, THF was distilled off under reduced pressure. Then, the resulting aqueous reaction solution was cooled to 0° C., and 50 ml of a 10N hydrochloric acid was added thereto to render the aqueous reaction solution acidic, followed by extraction with ethyl acetate three times. The resulting organic phase was washed with water twice, and the solvent was distilled off under reduced pressure, thereby obtaining 26 g of a compound (5)-2 in the form of a colorless liquid (yield: 95%).

Subsequently, 17 g (118 mmol) of the compound (5-2) was added to 100 ml of a THF solution containing 27 g (177 mmol) of 2,2,3,3,3-pentafluoro-1-propanol, 37 g (195 mmol) of ethyldiisopropylaminocarbodiimide (EDCI) hydrochloride and 0.6 g (5 mmol) of dimethylaminopyridine (DMAP) in a nitrogen atmosphere at 0° C., and the temperature was elevated to room temperature, followed by stirring for 3 hours. After conducting thin-layer chromatography (TLC) to confirm that the raw materials had been consumed, the reaction solution was cooled to 0° C., and water was added thereto to stop the reaction. Then, extraction was conducted with ethyl acetate three times, and the obtained organic phase was washed with water twice. Thereafter, the solvent was distilled off under reduced pressure to obtain a crude product, and the obtained crude product was purified by silica gel filtration (using ethyl acetate), thereby obtaining 19 g of a compound (5) in the form of a colorless liquid (yield: 58%).

[Chemical Formula 91]

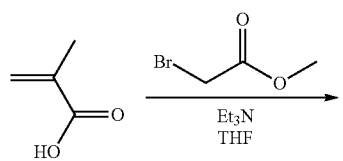

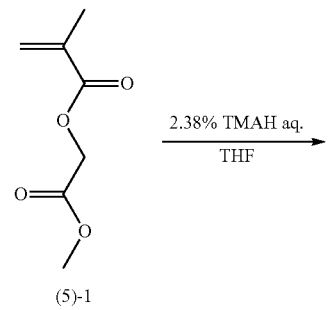

(5)-1

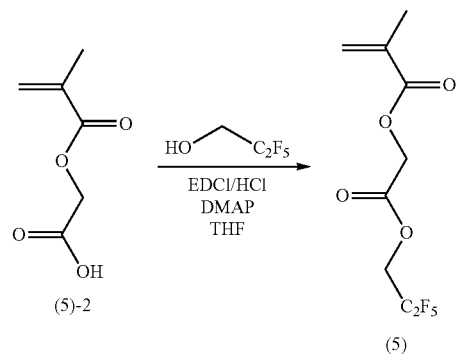

The obtained compounds (5)-1, (5)-2 and (5) were analyzed by $^1$H-NMR. The results are shown below.

Spectrum Data of Compound (5)-1

$^1$H-NMR (CDCl$_3$) 6.23 (s, 1H, Hb), 5.67 (d, 1H, Hb), 4.13 (s, 2H, Hc), 3.78 (s, 3H, Hd), 2.00 (s, 3H, Ha)

Spectrum Data of Compound (5)-2

$^1$H-NMR (CDCl$_3$) 6.23 (s, 1H, Hb), 5.67 (d, 1H, Hb), 4.69 (s, 2H, Hc), 2.00 (s, 3H, Ha)

Spectrum Data of Compound (5)

$^1$H-NMR (CDCl$_3$) 6.14 (s, 1H, Hb), 5.80 (d, 1H, Hb), 4.90 (s, 4H, Hc, Hd), 1.92 (s, 3H, Ha)

From the results shown above, it was confirmed that the compound (5) had a structure shown below, i.e., it was confirmed that the obtained compound was the monomer (5).

[Chemical Formula 92]

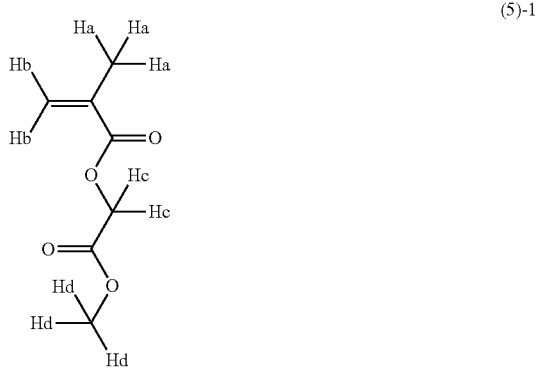

(5)-1

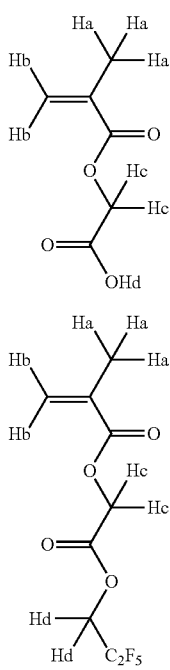

Synthesis Example 3

Synthesis of Monomer (6)

26 g (180.39 mmol) of a compound (5)-2 was added to 200 ml of a THF solution containing 23.48 g (234.5 mmol) of 2,2,2-trifluoroethanol, 51.9 g (270.6 mmol) of ethyldiisopropylaminocarbodiimide (EDCI) hydrochloride and 0.11 g (0.9 mmol) of dimethylaminopyridine (DMAP) in a nitrogen atmosphere at 0° C., and the temperature was elevated to room temperature, followed by stirring for 3 hours. After conducting thin-layer chromatography (TLC) to confirm that the raw materials had been consumed, the reaction solution was cooled to 0° C., and water was added thereto to stop the reaction. Then, extraction was conducted with ethyl acetate three times, and the obtained organic phase was washed with water twice. Thereafter, the solvent was distilled off under reduced pressure to obtain a crude product, and the obtained crude product was purified by silica gel filtration (using ethyl acetate), thereby obtaining 25 g of a compound (6) in the form of a colorless liquid.

The obtained compound (6) was analyzed by $^1$H-NMR. The results are shown below.

$^1$H-NMR (CDCl$_3$) 6.24 (s, 1H, Hb), 5.70 (s, 1H, Hb), 4.80 (s, 2H, Hc), 4.60-4.51 (m, 2H, Hd), 1.99 (s, 3H, Ha)

From the results above, it was confirmed that the compound (6) was the monomer (6) represented by the chemical formula above.

Example 1

Synthesis of Component (F)

This process is described in more detail using the synthesis of the copolymer (F-1-1) as an example.

30 g of tetrahydrofuran, 5.05 g (18.99 mmol) of the monomer (1), 1.66 g (7.02 mmol) of the monomer (2) and 2.36 g (7.02 mmol) of the monomer (3) were added to a four-necked flask equipped with a nitrogen feeding pipe, a reflux condenser, a dropping funnel and a thermometer, and the flask was purged with nitrogen, followed by elevating the temperature to 67° C. While maintaining that temperature, a solution obtained by dissolving 0.37 g of 2,2'-azobis(2,4-dimethylvaleronitrile) in 3 g of tetrahydrofuran was dropwise added thereto over 10 minutes. Thereafter, stirring was conducted for 6 hours while maintaining that temperature, and then cooled to room temperature. The obtained polymerization reaction solution was dropwise added to excess amount of a methanol/water mixed solvent, and the precipitated resin was separated by filtration, followed by washing and drying, thereby obtaining a copolymer (F-1-1) as an objective compound in the form of a white powder.

Copolymers (F-1-2) to (F-1-7) were synthesized in substantially the same manner as in the above method for synthesizing the copolymer (F-1-1), except that monomers for deriving the structural units of the respective copolymers were used in a predetermined molar ratio.

Structures of the copolymers (F-1-1) to (F-1-7) obtained in the synthesis example are shown below.

[Chemical Formula 93]

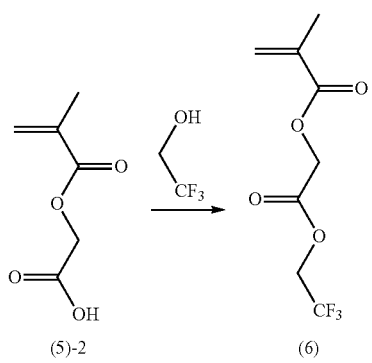

[Chemical Formula 94]

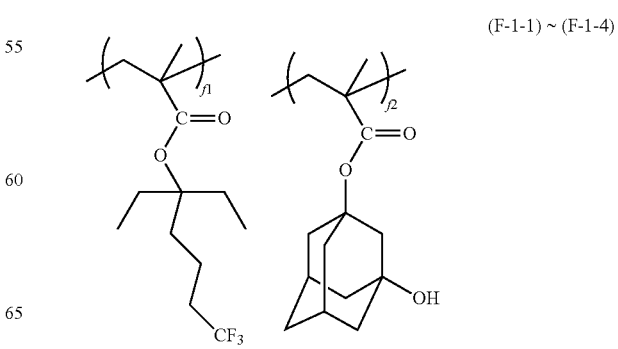

-continued

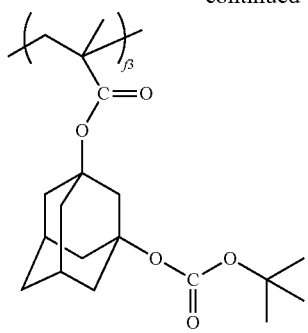

[Chemical Formula 95]

(F-1-5)
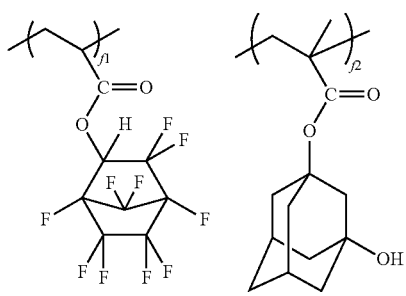

[Chemical Formula 96]

(F-1-6)
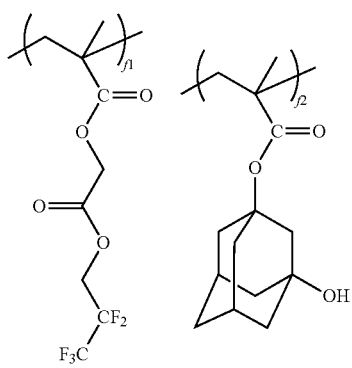

-continued

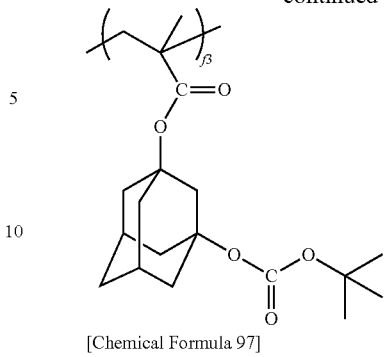

[Chemical Formula 97]

(F-1-7)
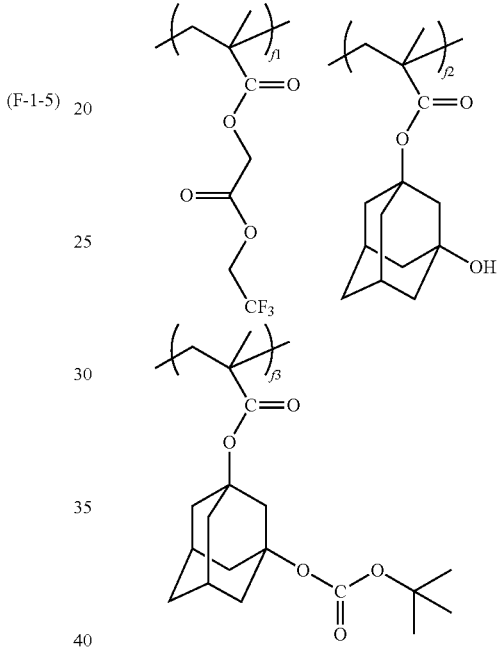

The weight average molecular weight (Mw) and dispersity (Mw/Mn) of the copolymers obtained in the above-mentioned Synthesis Example were determined by the polystyrene equivalent value as measured by gel permeation chromatography (GPC).

Further, the compositional ratio indicating the percentage (mol %) of structural units derived from the respective monomers within the copolymers was determined by carbon 13 nuclear magnetic resonance spectroscopy (600 MHz $^{13}$C-NMR). In the formula shown above, each of the subscript numerals at the lower right of the structural units indicate the amount (mol %) of the respective structural units.

The compositional ratio indicating the percentage (mol %) of structural units derived from the respective monomers within the copolymers, and weight average molecular weight (Mw) and dispersity (Mw/Mn) of the copolymers are shown in Table 1.

TABLE 1

| Copolymer | Amount of structural unit derived from corresponding monomer (mol %) | | | Mw | Mw/Mn |
|---|---|---|---|---|---|
| | f1 | f2 | f3 | | |
| (F-1-1) | 60 | 20 | 20 | 8000 | 1.7 |
| (F-1-2) | 70 | 15 | 15 | 8000 | 1.7 |

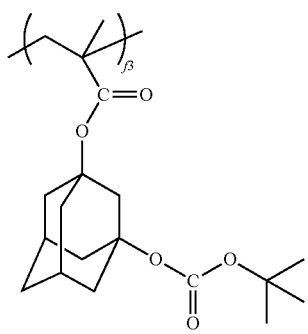

TABLE 1-continued

| Copolymer | Amount of structural unit derived from corresponding monomer (mol %) | | | Mw | Mw/Mn |
| --- | --- | --- | --- | --- | --- |
| | f1 | f2 | f3 | | |
| (F-1-3) | 50 | 25 | 25 | 8000 | 1.7 |
| (F-1-4) | 80 | 10 | 10 | 8000 | 1.7 |
| (F-1-5) | 60 | 20 | 20 | 8000 | 1.7 |
| (F-1-6) | 70 | 15 | 15 | 8000 | 1.7 |
| (F-1-7) | 70 | 15 | 15 | 8000 | 1.7 |

<Synthesis of Resin Component (A1)>

Copolymers used as the component (A) used in examples and comparative Examples, i.e., the copolymers (A1-1-11) and (A1-1-12) were synthesized by using the respective monomers (2), (3), (7), (8) and (9) represented by chemical formulas shown below, as described in the following Synthesis Examples 4 and 5.

[Chemical Formula 98]

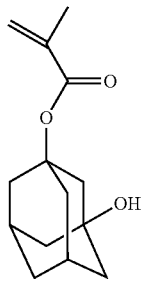

Monomer (2)

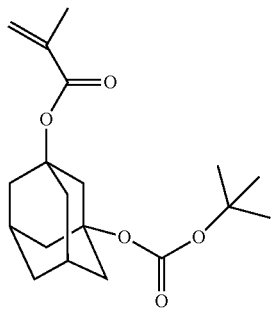

Monomer (3)

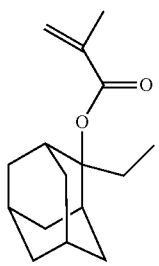

Monomer (7)

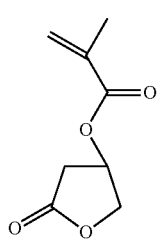

Monomer (8)

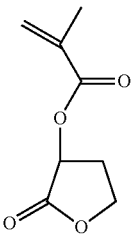

Monomer (9)

Synthesis Example 4

Synthesis Example of Copolymer (A1-1-11)

9.92 g of a monomer (7), 1.70 g of a monomer (8), 4.72 g of a monomer (2) and 10.1 g of a monomer (3) were dissolved in 106 g of methyl ethyl ketone. Then, 3.02 mmol of a polymerization initiator (product name: V-601, manufactured by Wako Pure Chemical Industries, Ltd.) was added and dissolved in the resulting solution. The resulting solution was dropwise added to 30 g of methyl ethyl ketone heated to 75° C. over 6 hours in a nitrogen atmosphere. The resulting reaction solution was heated while stirring for 1 hour, and then cooled to room temperature. Thereafter, the reaction solution was dropwise added to an excess amount of a methanol/water mixed solvent to thereby precipitate a reaction product, and this operation was repeated to perform the operation three times in total. The thus obtained reaction product was then dried under reduced pressure at room temperature, thereby obtaining the copolymer (A1-1-11) in the form of a white powder.

The structure of the copolymer (A1-1-11) obtained in the synthesis example is shown below.

The weight average molecular weight (Mw) and dispersity (Mw/Mn) of the copolymers obtained in the above-mentioned Synthesis Example were determined by the polystyrene equivalent value as measured by gel permeation chromatography (GPC).

Further, the compositional ratio indicating the percentage (mol %) of structural units derived from the respective monomers within the copolymers was determined by carbon NMR. In the formula shown below, each of the subscript numerals at the lower right of the structural units indicate the amount (mol %) of the respective structural units.

[Chemical Formula 99]

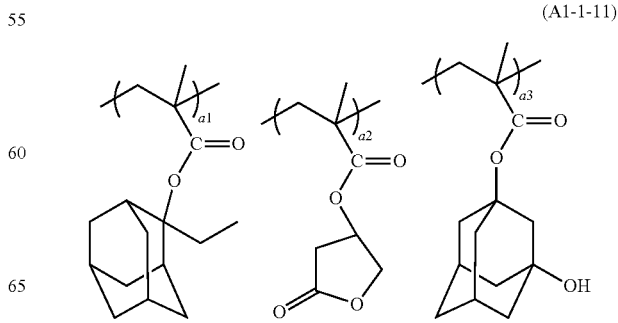

(A1-1-11)

-continued

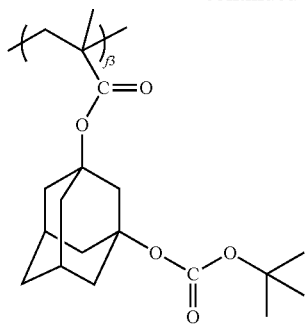

[a1/a2/a3/f3 = 50/10/20/20, Mw = 7000, Mw/Mn = 1.7]

Synthesis Example 5

Synthesis Example of Copolymer (A1-1-12)

Copolymer (A1-1-12) was synthesized in substantially the same manner as in the above method for synthesizing the copolymer (A1-1-11), except that monomers for deriving the structural units of the respective copolymers were used in a predetermined molar ratio.

The structure of the obtained copolymer (A1-1-12) is shown below.

[Chemical Formula 100]

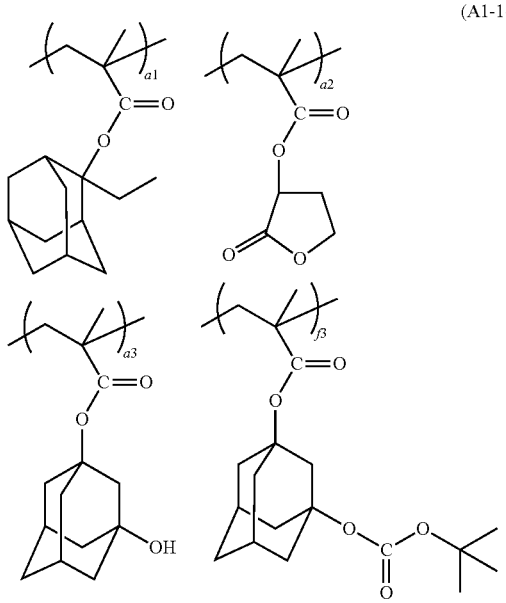

(A1-1-12)

[a1/a2/a3/f3 = 45/25/15/15, Mw = 7000, Mw/Mn = 1.7]

<Synthesis of Acid-Generator Component (B)>

The acid generator (b1-1-7) used as the component (B) in the examples and comparative examples was synthesized in accordance with Synthesis Example 6 below.

Synthesis Example 6

Synthesis Example of Acid Generator (B1-1-7)

(i) Synthesis of Intermediate Compound (1)

[Chemical Formula 101]

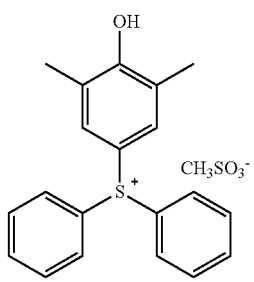

(1)

To 60.75 g of methanesulfonic acid controlled to 20° C. or lower was added 8.53 g of phosphorus oxide, 8.81 g of 2,6-dimethylphenol and 12.2 g of diphenylsulfoxide in small amounts. The resultant was matured for 30 minutes while maintaining the temperature at 15 to 20° C., followed by elevating the temperature to 40° C. and maturing for 2 hours. Then, the reaction mixture was dropwise added to 109.35 g of pure water cooled to 15° C. or lower. Thereafter, 54.68 g of dichloromethane was added and stirred, and the dichloromethane phase was collected. 386.86 g of hexane at a temperature of 20 to 25° C. was added to a separate vessel, and the dichloromethane phase was dropwise added thereto. Then, the resultant was matured at 20 to 25° C. for 30 minutes, followed by filtration, thereby obtaining an objective compound (yield: 70.9%).

The obtained compound was analyzed by $^1$H-NMR.

$^1$H-NMR (DMSO-d6, 600 MHz): δ (ppm)=7.61-7.72 (m, 10H, phenyl), 7.14 (S, 2H, H$^c$), 3.12 (S, 3H, H$^b$), 2.22 (s, 6H, H$^a$)

From the results shown above, it was confirmed that the obtained compound had a structure shown below.

[Chemical Formula 102]

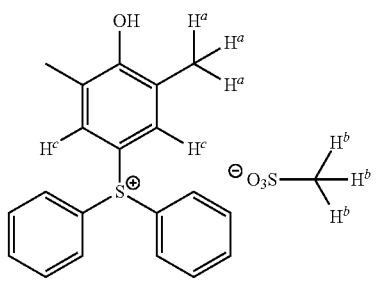

(ii) Synthesis of Intermediate Compounds (b1-1-71) to (b1-1-73)

[Chemical Formula 103]

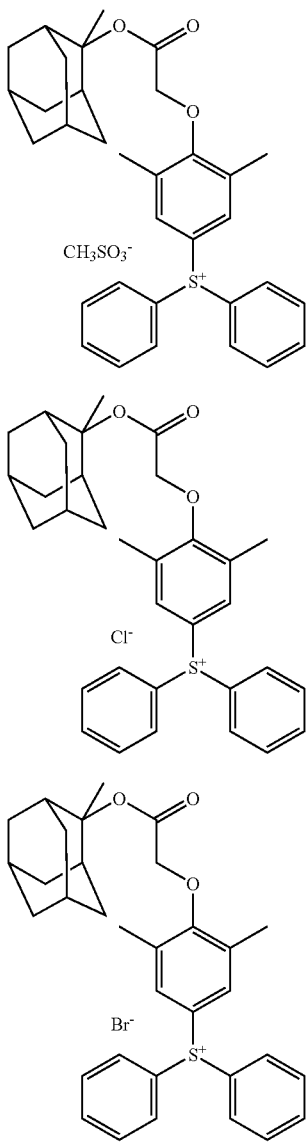

4 g of the intermediate compound (1) was dissolved in 79.8 g of dichloromethane. After confirming that the compound (1) had dissolved in dichloromethane, 6.87 g of potassium carbonate was added thereto, and 3.42 g of 2-methyl-2-adamantyl bromoacetate was further added. A reaction was effected under reflux for 24 hours, followed by filtration, washing with water, and crystallization with hexane. The resulting powder was dried under reduced pressure, thereby obtaining 3.98 g of an objective compound (yield: 66%).

The obtained compound was analyzed by $^1$H-NMR. The results are shown below.

$^1$H-NMR (CDCl$_3$, 600 MHz): δ (ppm)=7.83-7.86 (m, 4H, phenyl), 7.69-7.78 (m, 6H, phenyl), 7.51 (s, 2H, Hd), 4.46 (s, 2H, Hc), 2.39 (s, 6H, Ha), 2.33 (s, 2H, Adamantane), 2.17 (s, 2H, Adamantane), 1.71-1.976 (m, 11H, Adamantane), 1.68 (s, 3H, Hb), 1.57-1.61 (m, 2H, Adamantane)

From the results shown above, it was confirmed that the obtained compound contained a compound (b1-1-71) having a structure shown below. Further, as a result of an ion chromatography analysis, it was confirmed that the obtained compound also contained a compound (b1-1-72) and a compound (b1-1-73), both of which had the same NMR data for the cation moiety as that of the obtained compound. The amounts of the compound (b1-1-71), the compound (b1-1-72) and the compound (b1-1-73) were 21.4 mol %, 11.4 mol % and 67.2 mol %, respectively.

[Chemical Formula 104]

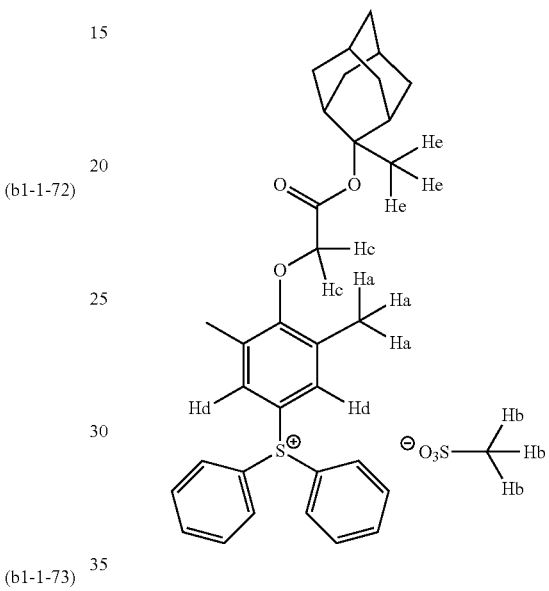

(iii) Synthesis of Acid Generator (b1-1-7)

[Chemical Formula 105]

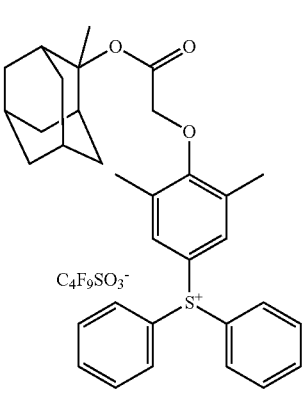

25.5 g of a mixture containing 21.4 mol % of the compound (b1-1-71), 11.4 mol % of the compound (b1-1-72) and 67.2 mol % of the compound (b1-1-73) was dissolved in 200 g of pure water, and 127.4 g of dichloromethane and 16.0 g of potassium nonafluoro-n-butanesulfonate were added, followed by stirring at room temperature for 14 hours. Then, the dichloromethane phase was separated, and washed with a diluted hydrochloric acid, ammonia and water in this order. Thereafter, the dichloromethane phase was concentrated and dried, thereby obtaining 32.9 g of an acid generator (b1-1-7) as an objective compound in the form a white solid.

The obtained compound was analyzed by $^1$H-NMR and $^{19}$F-NMR.

$^1$H-NMR (DMSO-d6, 400 MHz): δ (ppm)=7.75-7.86 (m, 10H, ArH), 7.61 (s, 2H, ArH), 4.62 (s, 2H, CH$_2$), 2.31 (s, 6H, CH$_3$), 1.49-1.97 (m, 17H, Adamantane)

$^{19}$F-NMR (DMSO-d6, 376 MHz): δ (ppm)=−77.8, −112.2, −118.7, −123.0

From the results shown above, it was confirmed that the compound had a structure shown below.

<Evaluation of Solubility of Component (F) in Organic Solvent>

Examples 2 to 7, Comparative Examples 1 to 3

Evaluation of the solubility of a component (F) in an organic solvent was conducted in accordance with the evaluation method described below, using the aforementioned copolymers (F-1-1), (F-1-2) and (F-1-4) to (F-1-7) as the component (F), homopolymers (A) to (C) represented by chemical formulas shown below, and the organic solvents shown below.

[Chemical Formula 106]

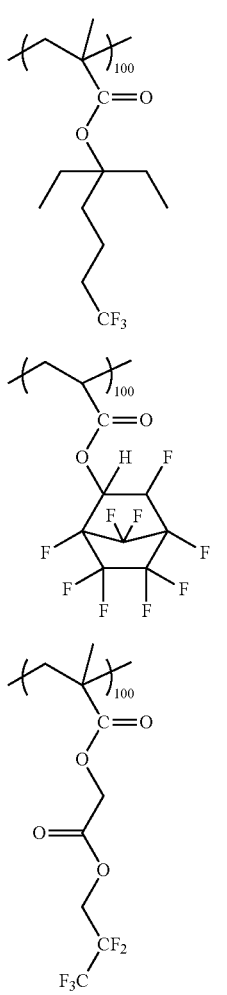

Organic Solvent:
(S)-1: propyleneglycol monomethyletheracetate (PG-MEA).
(S)-2: isobutanol (IBA).
(S)-3: 4-methyl-2-pentanol (MIBC).
(S)-4: 1-butoxy-2-propanol (BP).
(S)-6: a mixed solvent of IBA/BP=90/10 (weight ratio).
(S)-8: a mixed solvent of IBA/cyclohexanemethanol=90/10 (weight ratio).

[Evaluation Method]

0.1 g of each copolymer powder was added to 0.3 g of each of the aforementioned organic solvents, and the resultant was mixed so as to achieve a copolymer solution with a solid content of 25% by weight, and an evaluation of whether the copolymer powder was dissolved or not at room temperature (23° C.) was performed.

When the copolymer powder did not dissolve under the above conditions, 0.6 g of the organic solvent was further added and mixed so as to achieve a copolymer solution with a solid content of 10% by weight, and an evaluation of whether the copolymer powder was dissolved or not under the aforementioned condition was performed.

The obtained evaluation results are shown in Table 2.

In the table, the symbol "A" indicates that the copolymer powder was dissolved, whereas the symbol "B" indicates that the copolymer powder was not dissolved.

TABLE 2

| Copolymer | | Organic solvent | Solid concentration of polymer (wt %) | |
|---|---|---|---|---|
| | | | 10 | 25 |
| Ex. 2 | (F-1-1) | (S)-1 | A | A |
| | | (S)-2 | A | B |
| | | (S)-3 | A | B |
| | | (S)-4 | A | A |
| | | (S)-6 | A | A |
| | | (S)-8 | A | A |
| Ex. 3 | (F-1-2) | (S)-1 | A | A |
| | | (S)-2 | A | B |
| | | (S)-3 | A | B |
| | | (S)-4 | A | A |
| | | (S)-6 | A | A |
| | | (S)-8 | A | A |
| Ex. 4 | (F-1-4) | (S)-1 | A | A |
| | | (S)-2 | A | B |
| | | (S)-3 | A | B |
| | | (S)-4 | A | A |
| Ex. 5 | (F-1-5) | (S)-1 | A | A |
| | | (S)-2 | A | B |
| | | (S)-3 | A | B |
| | | (S)-4 | A | A |
| Ex. 6 | (F-1-6) | (S)-1 | A | A |
| | | (S)-2 | A | B |
| | | (S)-3 | A | B |
| | | (S)-4 | A | A |
| Ex. 7 | (F-1-7) | (S)-1 | A | A |
| | | (S)-2 | A | B |
| | | (S)-3 | A | B |
| | | (S)-4 | A | A |
| Comp. Ex. 1 | Polymer (A) | (S)-1 | A | A |
| | | (S)-2 | B | B |
| | | (S)-3 | B | B |
| | | (S)-4 | A | B |
| Comp. Ex. 2 | Polymer (B) | (S)-1 | A | A |
| | | (S)-2 | B | B |
| | | (S)-3 | B | B |
| | | (S)-4 | A | B |
| Comp. Ex. 3 | Polymer (C) | (S)-1 | A | A |
| | | (S)-2 | B | B |
| | | (S)-3 | B | B |
| | | (S)-4 | A | B |

As seen from the results shown in Table 2, it was confirmed that each of the copolymers of Examples 2 to 7 could be dissolved in any of the organic solvents with a solid concentration of 10% by weight.

Further, it was confirmed that the copolymers of Examples 2 to 7 could be dissolved in the organic solvents (S)-4, (S)-6 and (S)-8 with a solid concentration of 25% by weight, which was the same as in the case of PGMEA.

On the other hand, polymers (A) to (C) of Comparative Examples 1 to 3 could not be dissolved in the organic solvents (S)-2, (S)-3 and (S)-4 with a solid concentration of 25% by weight. Further, the polymers (A) to (C) could not be dissolved in (S)-2 and (S)-3 even with a solid concentration of 10% by weight. Therefore, it was confirmed that the polymers (A) to (C) exhibited poor solubility in an organic solvent, as compared to the copolymers of Examples 2 to 7.

From these results, it was confirmed that the component (F) according to the present invention exhibits an excellent solubility in an organic solvent.

<Production of Component (F) Solution>

Examples 8 to 11

The components shown in Table 3 were mixed together and dissolved to obtain component (F) solutions.

TABLE 3

|  | Component (F) | Component (S) |
| --- | --- | --- |
| Ex. 8 | (F)-3 [100] | (S)-1 [900] |
| Ex. 9 | (F)-1 [100] | (S)-1 [900] |
| Ex. 10 | (F)-2 [100] | (S)-1 [900] |
| Ex. 11 | (F)-4 [100] | (S)-1 [900] |

In Table 3, the reference characters indicate the following. Further, the values in brackets [ ] indicate the amount (in terms of parts by weight) of the component added.

(F)-1: the aforementioned copolymer (F-1-1)

(F)-2: the aforementioned copolymer (F-1-2)

(F)-3: the aforementioned copolymer (F-1-3)

(F)-4: the aforementioned copolymer (F-1-4)

(S)-1: propyleneglycol monomethyletheracetate (PGMEA).

<Measurement of Contact Angle of a Film Composed of Component (F)>

Using a spinner, each component (F) solution of Examples 8 to 11 was applied to an 8-inch silicon wafer that had been treated with hexamethyldisilazane (HMDS), and the solution was then prebaked (PAB) and dried on a hotplate at 110° C. for 60 seconds, thus forming a resist film with a film thickness of 100 nm.

A water droplet was dripped onto the surface of each resist film (the resist film prior to exposure), and a DROP MASTER-700 apparatus (a product name, manufactured by Kyowa Interface Science Co. Ltd.) was used to measure the contact angle (static contact angle, sliding angle, advancing angle and receding angle) (contact angle measurement: water 2 μl). The measured value was defined as the "contact angle prior to development (°)". The results are shown in Table 4.

TABLE 4

| | Contact angle prior to development (°) | | | |
| --- | --- | --- | --- | --- |
| | Static contact angle (°) | Sliding angle (°) | Advancing angle (°) | Receding angle (°) |
| Ex. 8 | 87.7 | 17.3 | 94.3 | 78.2 |
| Ex. 9 | 91.7 | 18.0 | 95.6 | 77.8 |
| Ex. 10 | 92.4 | 19.0 | 97.7 | 77.6 |
| Ex. 11 | 93.3 | 20.0 | 98.2 | 78.9 |

As seen from the results shown in Table 4, it was confirmed that the film composed of the component (F) of Examples 8 to 11 exhibited, for example, a static contact angle of higher than 85° and a sliding angle of no more than 20° prior to development.

From these results, it can be confirmed that a film exhibiting high hydrophobicity can be formed using the component (F) according to the present invention.

As a result, it is expected that not only can the water tracking ability during immersion exposure using a scanning-type immersion exposure apparatus be improved, but also elution of a substance can be suppressed.

<Production of Resist Composition-1>

Examples 12 to 42, Comparative Examples 4 to 11

The components shown in Tables 5 and 6 were mixed together and dissolved to obtain resist compositions.

TABLE 5

| | Component (A) | Component (B) | Component (F) | Component (D) | Component (S) |
| --- | --- | --- | --- | --- | --- |
| Comp. Ex. 4 | (A)-1 [100] | (B)-1 [15.0] | — | (D)-1 [0.35] | (S)-2 [2400] |
| Ex. 12 | (A)-1 [100] | (B)-1 [15.0] | (F)-2 [1.0] | (D)-1 [0.35] | (S)-2 [2400] |
| Ex. 13 | (A)-1 [100] | (B)-1 [15.0] | (F)-2 [5.0] | (D)-1 [0.35] | (S)-2 [2400] |
| Ex. 14 | (A)-1 [100] | (B)-1 [15.0] | (F)-2 [10.0] | (D)-1 [0.35] | (S)-2 [2400] |
| Comp. Ex. 5 | (A)-1 [100] | (B)-1 [15.0] | — | (D)-1 [0.35] | (S)-1 [2400] |
| Ex. 15 | (A)-1 [100] | (B)-1 [15.0] | (F)-2 [1.0] | (D)-1 [0.35] | (S)-1 [2400] |
| Ex. 16 | (A)-1 [100] | (B)-1 [15.0] | (F)-2 [5.0] | (D)-1 [0.35] | (S)-1 [2400] |
| Ex. 17 | (A)-1 [100] | (B)-1 [15.0] | (F)-2 [10.0] | (D)-1 [0.35] | (S)-1 [2400] |
| Comp. Ex. 6 | (A)-1 [100] | (B)-1 [15.0] | — | (D)-1 [0.35] | (S)-4 [2400] |
| Ex. 18 | (A)-1 [100] | (B)-1 [15.0] | (F)-2 [5.0] | (D)-1 [0.35] | (S)-4 [2400] |
| Ex. 19 | (A)-1 [100] | (B)-1 [15.0] | (F)-2 [10.0] | (D)-1 [0.35] | (S)-4 [2400] |
| Comp. Ex. 7 | (A)-1 [100] | (B)-1 [15.0] | — | (D)-1 [0.35] | (S)-2 [2400] |
| Ex. 20 | (A)-1 [100] | (B)-1 [15.0] | (F)-4 [1.0] | (D)-1 [0.35] | (S)-2 [2400] |
| Ex. 21 | (A)-1 [100] | (B)-1 [15.0] | (F)-4 [5.0] | (D)-1 [0.35] | (S)-2 [2400] |
| Ex. 22 | (A)-1 [100] | (B)-1 [15.0] | (F)-4 [10.0] | (D)-1 [0.35] | (S)-2 [2400] |
| Comp. Ex. 8 | (A)-1 [100] | (B)-1 [15.0] | — | (D)-1 [0.35] | (S)-4 [2400] |
| Ex. 23 | (A)-1 [100] | (B)-1 [15.0] | (F)-2 [10.0] | (D)-1 [0.35] | (S)-4 [2400] |
| Ex. 24 | (A)-1 [100] | (B)-1 [15.0] | (F)-4 [1.0] | (D)-1 [0.35] | (S)-4 [2400] |
| Ex. 25 | (A)-1 [100] | (B)-1 [15.0] | (F)-4 [5.0] | (D)-1 [0.35] | (S)-4 [2400] |

TABLE 5-continued

|   | Component (A) | Component (B) | Component (F) | Component (D) | Component (S) |
|---|---|---|---|---|---|
| Ex. 26 | (A)-1 [100] | (B)-1 [15.0] | (F)-4 [10.0] | (D)-1 [0.35] | (S)-4 [2400] |
| Comp. Ex. 9 | (A)-1 [100] | (B)-1 [20.0] | — | (D)-2 [1.20] | (S)-4 [2400] |
| Ex. 27 | (A)-1 [100] | (B)-1 [20.0] | (F)-4 [5.0] | (D)-2 [1.20] | (S)-4 [2400] |
| Ex. 28 | (A)-1 [100] | (B)-1 [20.0] | (F)-4 [10.0] | (D)-2 [1.20] | (S)-4 [2400] |

TABLE 6

|   | Component (A) | Component (B) | Component (F) | Component (D) | Component (C) | Component (S) |
|---|---|---|---|---|---|---|
| Comp. Ex. 10 | (A)-1 [100] | (B)-1 [15.0] | — | (D)-2 [0.50] | — | (S)-2 [2400] |
| Ex. 29 | (A)-1 [100] | (B)-1 [15.0] | (F)-4 [10.0] | (D)-2 [0.50] | — | (S)-2 [2400] |
| Ex. 30 | (A)-1 [100] | (B)-1 [15.0] | (F)-4 [10.0] | (D)-2 [0.50] | — | (S)-5 [2400] |
| Ex. 31 | (A)-1 [100] | (B)-1 [15.0] | (F)-4 [10.0] | (D)-2 [0.50] | — | (S)-6 [2400] |
| Ex. 32 | (A)-1 [100] | (B)-1 [15.0] | (F)-4 [10.0] | (D)-2 [0.50] | — | (S)-4 [2400] |
| Ex. 33 | (A)-1 [100] | (B)-1 [15.0] | (F)-4 [10.0] | (D)-2 [0.50] | — | (S)-7 [2400] |
| Ex. 34 | (A)-1 [100] | (B)-1 [15.0] | (F)-4 [10.0] | (D)-2 [0.50] | — | (S)-8 [2400] |
| Comp. Ex. 11 | (A)-2 [100] | (B)-1 [15.0] | — | (D)-2 [0.50] | (C)-1 [8.50] | (S)-2 [2400] |
| Ex. 35 | (A)-2 [100] | (B)-1 [15.0] | (F)-4 [10.0] | (D)-2 [0.50] | (C)-1 [8.50] | (S)-2 [2400] |
| Ex. 36 | (A)-2 [100] | (B)-1 [15.0] | (F)-4 [10.0] | (D)-2 [0.50] | (C)-1 [8.50] | (S)-5 [2400] |
| Ex. 37 | (A)-2 [100] | (B)-1 [15.0] | (F)-4 [10.0] | (D)-2 [0.50] | (C)-1 [8.50] | (S)-6 [2400] |
| Ex. 38 | (A)-2 [100] | (B)-1 [15.0] | (F)-4 [10.0] | (D)-2 [0.50] | (C)-1 [8.50] | (S)-4 [2400] |
| Ex. 39 | (A)-2 [100] | (B)-1 [15.0] | (F)-4 [10.0] | (D)-2 [0.50] | (C)-1 [8.50] | (S)-7 [2400] |
| Ex. 40 | (A)-2 [100] | (B)-1 [15.0] | (F)-4 [10.0] | (D)-2 [0.50] | (C)-1 [8.50] | (S)-8 [2400] |
| Ex. 41 | (A)-2 [100] | (B)-1 [15.0] | (F)-4 [10.0] | (D)-2 [0.50] | (C)-1 [8.50] | (S)-9 [2400] |
| Ex. 42 | (A)-2 [100] | (B)-1 [15.0] | (F)-4 [10.0] | (D)-2 [0.50] | (C)-1 [8.50] | (S)-10 [2400] |

In Tables 5 and 6, the reference characters indicate the following. Further, the values in brackets [ ] indicate the amount (in terms of parts by weight) of the component added.

(A)-1: the aforementioned copolymer (A1-1-11).

(A)-2: a polymeric compound represented by chemical formula (A2-1-11) shown below (manufactured by Promerus LLC). In the polymeric compound (A)-2, the ratio between the structural units (a1:a2, molar ratio), the weight average molecular weight (Mw) and the dispersity (Mw/Mn) are as shown below.

[Chemical Formula 107]

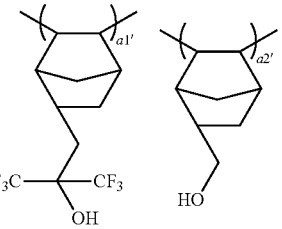

(A2-1-11)

[a1':a2'=60:40 (molar ratio), Mw: 4,000, Mw/Mn: 1.5]

(B)-1: the aforementioned acid generator (b1-1-7)
(F)-1: the aforementioned copolymer (F-1-1)
(F)-2: the aforementioned copolymer (F-1-2)
(F)-3: the aforementioned copolymer (F-1-3)
(F)-4: the aforementioned copolymer (F-1-4)
(D)-1: triethanolamine.
(D)-2: tri-n-pentylamine.
(C)-1: a compound represented by chemical formula shown below (tetraethoxymethylated glycoluril; product name: NIKALAC MX-270, manufactured by Sanwa Chemical Co., Ltd.)

[Chemical Formula 108]

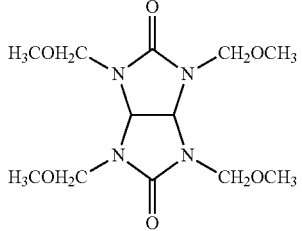

(S)-1: propyleneglycol monomethyletheracetate (PGMEA).
(S)-2: isobutanol (IBA).
(S)-4: 1-butoxy-2-propanol (BP).
(S)-5: a mixed solvent of IBA/BP=95/5 (weight ratio).
(S)-6: a mixed solvent of IBA/BP=90/10 (weight ratio).
(S)-7: a mixed solvent of IBA/cyclohexanemethanol=95/5 (weight ratio).
(S)-8: a mixed solvent of IBA/cyclohexanemethanol=90/10 (weight ratio).
(S)-9: a mixed solvent of IBA/propyleneglycol=95/5 (weight ratio).
(S)-10: a mixed solvent of IBA/propyleneglycol=90/10 (weight ratio).

<Measurement of Contact Angle of Resist Film>

Using a spinner, each resist composition of the above examples was applied to an 8-inch silicon wafer that had been treated with hexamethyldisilazane (HMDS), and the solution was then prebaked (PAB) and dried on a hotplate at 110° C. for 60 seconds, thus forming a resist film with a film thickness of 100 nm.

A water droplet was dripped onto the surface of each resist film (the resist film prior to exposure), and a DROP MASTER-700 apparatus (a product name, manufactured by Kyowa Interface Science Co. Ltd.) was used to measure the contact angle (static contact angle, sliding angle, advancing angle and receding angle) (contact angle measurement: water 2 μl). The measured value was defined as the "contact angle prior to development (°)". The results are shown in Tables 7 and 8.

TABLE 7

| | Contact angle prior to development (°) | | | |
|---|---|---|---|---|
| | Static contact angle (°) | Sliding angle (°) | Advancing angle (°) | Receding angle (°) |
| Comp. Ex. 4 | 70.5 | 22.0 | 81.3 | 60.0 |
| Ex. 12 | 71.9 | 18.0 | 81.0 | 62.8 |
| Ex. 13 | 72.5 | 19.0 | 83.4 | 64.2 |
| Ex. 14 | 73.5 | 19.0 | 84.2 | 64.7 |
| Comp. Ex. 5 | 71.3 | 20.0 | 82.0 | 62.3 |
| Ex. 15 | 76.1 | 19.5 | 84.8 | 66.8 |
| Ex. 16 | 87.2 | 18.5 | 92.8 | 74.1 |
| Ex. 17 | 90.3 | 19.0 | 95.7 | 75.1 |
| Comp. Ex. 7 | 70.5 | 22.0 | 81.3 | 60.0 |
| Ex. 20 | 72.5 | 21.0 | 81.6 | 62.1 |
| Ex. 21 | 73.1 | 21.0 | 83.8 | 62.8 |
| Ex. 22 | 75.9 | 21.0 | 85.3 | 66.7 |
| Comp. Ex. 8 | 71.1 | 21.0 | 81.5 | 61.4 |
| Ex. 23 | 83.2 | 19.0 | 90.4 | 71.4 |
| Ex. 24 | 74.6 | 20.0 | 84.1 | 65.0 |
| Ex. 25 | 82.6 | 20.0 | 89.2 | 69.6 |
| Ex. 26 | 89.1 | 19.5 | 94.6 | 74.6 |

TABLE 8

| | Contact angle prior to development (°) | | | |
|---|---|---|---|---|
| | Static contact angle (°) | Sliding angle (°) | Advancing angle (°) | Receding angle (°) |
| Comp. Ex.. 10 | 70.3 | 21.0 | 81.1 | 60.2 |
| Ex. 29 | 74.6 | 20.0 | 83.3 | 64.6 |
| Ex. 30 | 86.8 | 20.5 | 92.3 | 72.9 |
| Ex. 31 | 87.3 | 19.5 | 93.4 | 73.1 |
| Ex. 32 | 88.5 | 20.0 | 94.6 | 75.1 |
| Ex. 33 | 92.9 | 18.0 | 98.8 | 81.0 |
| Ex. 34 | 93.6 | 16.5 | 98.8 | 82.5 |
| Comp. Ex. 11 | 63.3 | 28.6 | 78.7 | 50.6 |
| Ex. 35 | 68.9 | 27.5 | 82.1 | 53.5 |
| Ex. 36 | 84.1 | 21.0 | 92.4 | 70.7 |
| Ex. 37 | 87.0 | 20.0 | 94.5 | 71.2 |
| Ex. 38 | 86.6 | 20.5 | 94.6 | 73.5 |
| Ex. 39 | 93.8 | 15.5 | 95.5 | 82.9 |
| Ex. 40 | 94.6 | 16.0 | 94.9 | 83.4 |
| Ex. 41 | 79.7 | 25.0 | 92.0 | 64.9 |
| Ex. 42 | 90.2 | 20.0 | 95.4 | 76.4 |

As is evident from the above results shown in Tables 7 and 8, the resist films formed using the resist compositions of Examples 12 to 42 which included the fluorine-containing resins according to the present invention exhibited, for example, a high static contact angle and a low sliding angle prior to development, as compared to the resist films formed using the resist compositions of Comparative Examples 4 to 11 which did not include the fluorine-containing resin.

Therefore, it was found that by virtue of including a fluorine-containing resin of the present invention, the hydrophobicity of the resist film is enhanced. As a result, it is expected that not only can the water tracking ability during immersion exposure using a scanning-type immersion exposure apparatus be improved, but also elution of a substance can be suppressed.

<Evaluation of Eluted Substance>

Using a spinner, each resist composition obtained in the examples and comparative examples shown in Table 9 was applied to an 8-inch silicon wafer, and the solution was then prebaked (PAB) and dried on a hotplate at 110° C. for 60 seconds, thus, forming a resist film with a film thickness of 100 nm.

Then, using VRC310S (product name; manufactured by S.E.S CO., LTD.), one droplet of pure water (150 μl) was moved from the center of the wafer in a circular manner at room temperature at a constant linear velocity (total area of the resist film that came in contact with the droplet: 221.56 cm$^2$).

Thereafter, the droplet was collected, and analyzed by an analyzing apparatus Agilent-HP1100 LC-MSD (product name; manufactured by Agilent Technologies), and the eluted amounts of components (B) and (D) ($\times 10^{-12}$ mol/cm$^2$·s) prior to exposure were determined. The results are shown in Table 9.

TABLE 9

| | Eluted amount ($\times 10^{-12}$ mol/cm$^2$ · s) | | |
|---|---|---|---|
| | Total amount of component (B) and component (D) | Component (B) | Component (D) |
| Comp. Ex. 5 | 3.44 | 2.93 | 0.51 |
| Ex. 16 | 0.60 | 0.60 | 0.00 |
| Ex. 17 | 0.38 | 0.38 | 0.00 |
| Comp. Ex. 4 | 4.25 | 3.95 | 0.30 |
| Ex. 13 | 2.97 | 2.50 | 0.47 |
| Ex. 14 | 2.59 | 2.20 | 0.39 |
| Comp. Ex. 6 | 2.95 | 2.35 | 0.60 |
| Ex. 18 | 1.72 | 1.43 | 0.29 |
| Ex. 19 | 1.08 | 0.97 | 0.11 |
| Ex. 31 | 0.77 | 0.62 | 0.15 |
| Ex. 32 | 0.55 | 0.44 | 0.11 |
| Ex. 34 | 0.34 | 0.29 | 0.05 |
| Ex. 37 | 0.83 | 0.73 | 0.10 |
| Ex. 38 | 0.76 | 0.64 | 0.12 |
| Ex. 40 | 0.46 | 0.39 | 0.07 |
| Ex. 42 | 0.81 | 0.68 | 0.13 |

As is evident from the above results shown in Table 9, in the resist films formed using the resist compositions of the Examples which included the fluorine-containing resins according to the present invention, the amount of elution of the component (B) and the component (D) was small, as compared to the resist films formed using the resist compositions of Comparative Examples which did not include the fluorine-containing resin.

Therefore, it was found that by virtue of including a fluorine-containing compound of the present invention, elution of substances (component (B), component (D) and the like) into the immersion medium can be significantly suppressed.

<Evaluation of Lithography Properties>

Using the resist compositions of Examples 27, 28 and Comparative Example 9, resist patterns were formed as follows.

[Formation of Resist Pattern]

An organic anti-reflection film composition (product name: ARC29, manufactured by Brewer Science Ltd.) was applied to an 8-inch silicon wafer using a spinner, and the composition was then baked at 205° C. for 60 seconds, thereby forming an organic anti-reflection film having a film thickness of 82 nm.

Then, the resist composition was applied to the anti-reflection film using a spinner, and was then prebaked (PAB) on a hotplate at 90° C. for 60 seconds and dried, thereby forming a resist film having a film thickness of 120 nm.

Subsequently, the resist film was selectively irradiated with an ArF excimer laser (193 nm) through a mask pattern, using an ArF exposure apparatus NSR-S302 (manufactured by Nikon Corporation; NA (numerical aperture)=0.60, 2/3 annular illumination).

Thereafter, a post exposure bake (PEB) treatment was conducted at 90° C. for 60 seconds, followed by development for 30 seconds at 23° C. in a 2.38% by weight aqueous tetramethylammonium hydroxide (TMAH) solution (product name: NMD-3; manufactured by Tokyo Ohka Kogyo Co., Ltd.). Then, the resist film was washed for 30 seconds with pure water, followed by drying by shaking.

As a result, in each of the examples, a line and space pattern having a line width of 120 nm and a pitch of 240 nm was formed on the resist film.

The optimum exposure dose Eop (mJ/cm$^2$; the sensitivity) for formation of the aforementioned line and space pattern was 23.0 (mJ/cm$^2$) for all of Examples 27 and 28 and Comparative Example 9.

Further, with respect to the resist compositions of Examples 27 and 28 and Comparative Example 9, the resolution, the resist pattern shape, the exposure margin and the mask reproducibility (mask linearity) were evaluated. As a result, it was confirmed that the same level was achieved in these examples.

Therefore, it was found that by virtue of containing the fluorine-containing fluorine copolymer according to the present invention, water repellency is improved while maintaining satisfactorily development properties in the patterning process.

<Production of Resist Composition-2>

Example 43

The components shown in Table 10 were mixed together and dissolved to obtain positive resist compositions.

TABLE 10

| | Component (A) | Component (B) | Component (D) | Component (E) | Component (F) | Component (S) |
|---|---|---|---|---|---|---|
| First positive resist composition | (A)-3 [100] | (B)-2 [8.0] | (D)-2 [1.20] | — | — | (S)-11 [3200] |
| Ex. 43 | (A)-4 [100] | (B)-1 [15.0] | (D)-2 [1.60] | (E)-1 [3.0] | (F)-1 [10.0] | (S)-4 [2400] |

In Table 10, the reference characters indicate the following. Further, the values in brackets [ ] indicate the amount (in terms of parts by weight) of the component added.

(A)-3: a copolymer represented by chemical formula (A1'-11-1) shown below with Mw=7,000 and Mw/Mn.

In the formula, the subscript numerals shown to the bottom right of the parentheses ( ) indicate the percentage (mol %) of the respective structural units within the copolymer.

[Chemical Formula 109]

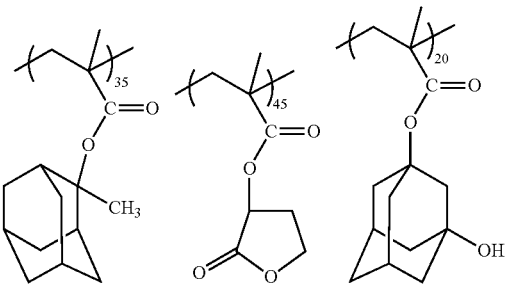

(A1'-11-1)

(A)-4: the aforementioned copolymer (A1-1-12).
(B)-1: the aforementioned acid generator (b1-1-7)
(B)-2: (4-methylphenyl)diphenylsulfonium nonafluoro-n-butanesulfonate
(D)-2: tri-n-pentylamine.
(E)-1: salicylic acid
(F)-1: the aforementioned copolymer (F-1-4)
(S)-4: 1-butoxy-2-propanol (boiling point: 170° C.).
(S)-11: a mixed solvent of PGMEA (boiling point: 146° C.)/PGME=6/4 (weight ratio).

<Crossline Patterning by Double Patterning Process-(1)>

As shown in FIG. 2, after forming a first L/S pattern 10 substantially in parallel to the X-axis using the first positive resist composition, a second resist film was formed by applying the positive resist composition of Example 43 to the substrate where the first L/S pattern 10 was formed, and the second resist film was then subjected to exposure and alkali developing so as to form an L/S pattern 20 substantially in parallel to the Y-axis which is orthogonal to the first L/S pattern 10, thereby ultimately forming a hole pattern. More specifically, the crossline patterning process was conducted as follows.

[Formation of First L/S Pattern]

First, an organic antireflection film composition (product name: ARC29, manufactured by Brewer Science Ltd.) was applied to a 12-inch silicon wafer using a spinner, and the composition was then baked and dried on a hotplate at 205° C. for 60 seconds, thereby forming an organic antireflection film having a thickness of 95 nm.

Then, the first positive resist composition as a positive resist composition for forming a first resist film was applied to the organic antireflection film using a spinner, and was then prebaked (PAB) and dried on a hotplate at 120° C. for 60 seconds, thereby forming a resist film (the first resist film) having a film thickness of 90 nm.

Subsequently, a coating solution for forming a protection film (product name: TILC-035; manufactured by Tokyo Ohka Kogyo Co., Ltd.) was applied to the resist film using a spinner, and then heated at 90° C. for 60 seconds, thereby forming a top coat with a film thickness of 35 nm.

Then, the first resist film was selectively irradiated with an ArF excimer laser (193 nm) through a mask pattern, using an ArF exposure apparatus NSR-609B (manufactured by Nikon Corporation, NA (numerical aperture)=1.07, Dipole-X).

Thereafter, a post exposure bake (PEB) treatment was conducted at 110° C. for 60 seconds, followed by development for 20 seconds at 23° C. in a 2.38% by weight aqueous solution of tetramethylammonium hydroxide (TMAH).

As a result, a line and space pattern (a first L/S pattern) having a line width of 55 nm and a pitch of 110 nm was formed on the resist film. The sensitivity (Eop) was 15.4 mJ/cm$^2$.

[Crossline Patterning Process]

Next, the positive resist composition of Example 43 was applied to the first L/S pattern formed as described above, and was then prebaked (PAB) and dried on a hotplate at 120° C. for 60 seconds, thereby forming a resist film having a film thickness of 90 nm.

Subsequently, the resist film was selectively irradiated with an ArF excimer laser (193 nm) through a mask pattern, using an ArF immersion exposure apparatus NSR-S609B (manufactured by Nikon Corporation, NA (numerical aperture)=1.07, Dipole-X). Direction of the L/S pattern of the mask was orthogonal to that of the first L/S pattern, and latent image of the L/S pattern formed on the second resist film was an L/S pattern having a line width of 55 nm and a pitch of 110 nm. The sensitivity (Eop) was 26.4 mJ/cm$^2$.

Thereafter, a post exposure bake (PEB) treatment was conducted at 90° C. for 60 seconds, followed by development for 20 seconds at 23° C. in a 2.38% by weight aqueous solution of tetramethylammonium hydroxide (TMAH).

As a result, a contact hole pattern was formed on the second resist film. As shown in FIG. 3, the obtained contact hole pattern exhibited satisfactory uniformity in terms of the shape of the holes.

Further, as shown in FIG. 4, with respect to the contact hole pattern, the dimension CD(x) in the X-axis direction was 67.9 nm, the dimension CD(y) in the Y-axis direction was 65.7 nm and the pitch was 110 nm. In the photograph shown in FIG. 3, the horizontal direction corresponds to the direction in which an L/S pattern was formed using the first positive resist composition, whereas the vertical direction corresponds to the direction in which a latent image of an L/S pattern was formed using the second positive resist composition.

As a result of the above-mentioned crossline patterning process, it was confirmed that by using the positive resist composition of Example 43 according to the present invention, even without conducting a freezing treatment after the formation of the first resist pattern, a resist pattern having an excellent shape with fine dimensions can be formed without adversely affecting the first resist pattern.

<Crossline Patterning by Double Patterning Process-(2)>

Crossline patterning was performed by the double patterning method in the same manner as in the aforementioned [Crossline patterning process], except that the film thickness of the second resist film using substantially the same positive resist composition as in Example 43 was changed to 70 nm and 50 nm. For changing the film thickness to 70 nm and 50 nm, in the positive resist composition of Example 43, only the amount of the component (S) ((S)-4) was changed. Specifically, the amount of the component (S) was changed to 2,750 parts by weight for forming a resist pattern having a film thickness of 70 nm, and 3,500 parts by weight for forming a resist pattern having a film thickness of 50 nm.

As a result, for both resist film thicknesses, a hole pattern exhibiting an excellent uniformity of the hole shape was formed.

Further, the cross-section of the ultimate hole pattern formed was observed by a scanning electron microscope (SEM) (product name: S-9220, manufactured by Hitachi, Ltd.; acceleration voltage: 800V), to thereby measure the cross-sectional film thickness of the line portion for each of the first L/S pattern and the L/S pattern formed on the second resist film (second resist pattern). The results are shown in Table 11.

TABLE 11

| Film thickness of second resist (nm) | Sensitivity in the formation of first L/S pattern (mJ/cm$^2$) | Sensitivity in the formation of second L/S pattern (mJ/cm$^2$) | CD(x) (nm) | CD(y) (nm) | Pitch (nm) | Cross-sectional film thickness of first L/S pattern (nm) | Cross-sectional film thickness of second L/S pattern (nm) |
|---|---|---|---|---|---|---|---|
| 70 | 16.4 | 22.6 | 67.6 | 61.7 | 110 | 97 | 74 |
| 50 | 19.4 | 21.4 | 56.8 | 59.2 | 110 | 77 | 62 |

As is evident from the results shown in Table 11, it was confirmed that by the crossline patterning, a resist pattern in which the height of the line portion of the first L/S pattern is different from that of the second L/S pattern, i.e., a pattern in which the heights of the hole peripheral portions are different could be formed.

Furthermore, since the cross-sectional film thickness of the first L/S pattern is larger than that of the second L/S pattern, the first L/S pattern is hardly influenced by the patterning process using the positive resist composition of Example 43 according to the present invention.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A fluorine-containing resin comprising:
 a structural unit (f1), which is at least one member selected from the group consisting of:
 (i) a structural unit having a group represented by formula (f1-1-0),

(f1-1-0)

wherein R$^2$ represents an organic group having a fluorine atom, with the proviso that the carbon atom within the —C(=O)— moiety is not directly bonded to a main chain of the structural unit (i),
(ii) a structural unit that includes an acid dissociable, dissolution inhibiting group-containing group having a fluorine atom, and
(iii) a structural unit containing a non-acid dissociable cyclic alkyl group in which at least one hydrogen atom is replaced with a fluorine atom, a structural unit (f2) containing a hydrophilic group-containing aliphatic hydrocarbon group, and
a structural unit (f3) represented by formula (f3-1),

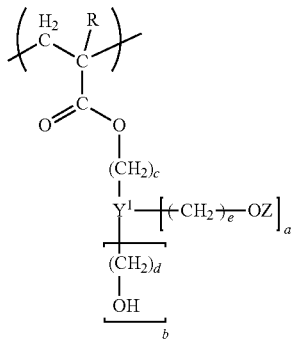

(f3-1)

wherein:
R represents a hydrogen atom, a lower alkyl group of 1 to 5 carbon atoms or a halogenated lower alkyl group of 1 to 5 carbon atoms;
$Y^1$ represents an aliphatic cyclic group;
Z represents a tertiary alkyl group-containing, chain-like alkyl group in which a branched tertiary alkyl group is bonded to a linear or branched alkylene group, a chain-like tertiary alkyloxycarbonyl group, a chain-like tertiary alkyloxycarbonylalkyl group or an alkoxyalkyl group;
a represents an integer of 1 to 3, and b represents an integer of 0 to 2, with the proviso that a+b=1 to 3; and
each of c, d and e independently represents an integer of 0 to 3.

2. The fluorine-containing resin according to claim 1, wherein the structural unit (f1) is the structural unit having the group represented by formula (f1-1-0), which is represented by formula (f1-1-1) shown below:

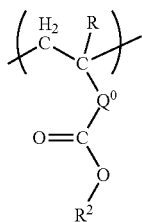

(f1-1-1)

wherein R represents a hydrogen atom, a lower alkyl group of 1 to 5 carbon atoms or a halogenated lower alkyl group of 1 to 5 carbon atoms; $Q^0$ represents a divalent linking group; and $R^2$ represents an organic group having a fluorine atom.

3. The fluorine-containing resin according to claim 1, wherein the structural unit (f2) is a structural unit derived from an acrylate ester containing a hydrophilic group-containing aliphatic hydrocarbon group.

4. The fluorine-containing resin according to claim 1, wherein Z represents the tertiary alkyl group-containing, chain-like alkyl group in which the branched tertiary alkyl group is bonded to the linear or branched alkylene group, and the linear or branched alkylene group within the tertiary alkyl group-containing, chain-like alkyl group has 1 to 5 carbon atoms.

5. The fluorine-containing resin according to claim 1, wherein Z is a group represented by formula (II) shown below:

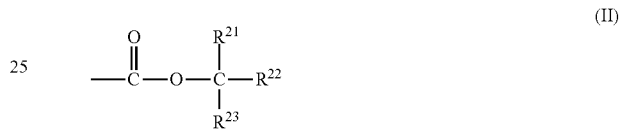

(II)

wherein each of $R^{21}$, $R^{22}$ and $R^{23}$ independently represents a linear or branched alkyl group.

6. The fluorine-containing resin according to claim 1, wherein Z is a group represented by formula (III) shown below:

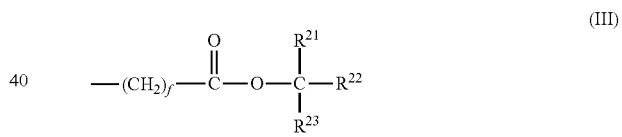

(III)

wherein each of $R^{21}$, $R^{22}$ and $R^{23}$ independently represents a linear or branched alkyl group;
and f represents an integer of 1 to 3.

* * * * *